United States Patent [19]
Lo

[11] Patent Number: 5,408,424
[45] Date of Patent: Apr. 18, 1995

[54] OPTIMAL FILTERING BY RECURRENT NEURAL NETWORKS

[76] Inventor: James T. Lo, 10210 Sunway Ter., Ellicott City, Md. 21042

[21] Appl. No.: 68,176

[22] Filed: May 28, 1993

[51] Int. Cl.$^6$ .................... G06F 15/31; G06F 15/46
[52] U.S. Cl. .................... 364/724.01; 395/23
[58] Field of Search ............ 364/724.01, 825, 807, 364/607, 724.19; 395/21, 23, 25

[56] References Cited

U.S. PATENT DOCUMENTS

| | | | |
|---|---|---|---|
| 4,947,482 | 8/1990 | Brown | 364/807 |
| 4,979,124 | 12/1990 | Sachse et al. | 395/22 X |
| 5,003,490 | 3/1991 | Castelaz et al. | 364/513 |
| 5,056,037 | 10/1991 | Eberhardt | 364/807 X |
| 5,099,434 | 3/1992 | Stoll et al. | 395/25 |
| 5,129,039 | 7/1992 | Hiraiwa | 395/24 |
| 5,150,323 | 9/1992 | Castelaz | 364/807 |
| 5,182,794 | 1/1993 | Gasperi et al. | 395/23 |

OTHER PUBLICATIONS

R. S. Bucy and K. D. Senne, "Digital Synthesis of Non-linear Filters", *Automatica*, vol. 7, pp. 287–298 (1971).

R. S. Bucy and K. D. Senne, "Non-linear Filtering Algorithms for Vector Processing Machines", *Comp. & Maths. with Apps.*, vol. 6, pp. 317–338 (1980).

J. T.-H. Lo, "Optimal Estimation for the Satellite Attitude Using Star Tracker Measurements", *Automatica*, vol. 22, pp. 477–482 (1986).

J. T.-H. Lo and S.-K. Ng, "Optimal Fourirer-Hermite Expansion for Estimation", *Stochastic Processes and their Applications*, vol. 21, pp. 291–304 (1986).

S. I. Sudharsanan and M. K. Sundareshan, "Maximum A posteriori State Estimation: A Neural Processing Algorithm", in *Procs. of the 28th Conf. on Decision and Control*, Tampa, Fla., pp. 1805–1806 (1989).

Q. Sun et al., "A Neural Network Computation Algorithm for Discrete-Time Linear System State Estimation", in *Procs. of IJCNN*, Jun. 1992, Baltimore, Md., p. I-443 (1992).

J. L. Elman, "Finding Structure in Time", *Cognitive Science*, vol. 14, pp. 179–211 (1990).

D. L. Elliott, "A Better Activation Function for Artificial Neural Networks", ISR Technical Report TR-93-8, Institute for Systems Research, University of Maryland, College Park, Md. 20742 (1993).

(List continued on next page.)

*Primary Examiner*—Tan V. Mai

[57] ABSTRACT

A method and an apparatus are disclosed for processing a measurement process to estimate a signal process. The method synthesizes realizations of a signal process and a measurement process into a primary filter for estimating the signal process and, if required, an ancillary filter for providing the primary filter's estimation error statistics. Both the primary and the ancillary filters are made out of artificial recurrent neural networks (RNNs). Their implementation results in the filtering apparatus. The synthesis is performed through training RNNs. The weights/parameters and initial dynamic state of an RNN are determined by minimizing a training criterion by the variation of the same. The training criterion, which is constructed on the basis of a selected estimation error criterion, incorporates the aforementioned realizations. An alternative way to determine the initial dynamic state of an RNN is to simply set it equal to a canonical initial dynamic state. After adequate training, both the primary and the ancillary filters are recursive filters optimal for the given respective RNN architectures with the lagged feedbacks carrying the optimal conditional statistics. If appropriate RNN paradigms and estimation error criteria are selected, the primary and the ancillary filters of such paradigms are proven to approximate the respective optimal filters in performance (with respect to the selected estimation error criteria) to any desired degree of accuracy, provided that the RNNs that constitute the primary and ancillary filters are of sufficient sizes.

66 Claims, 19 Drawing Sheets

OTHER PUBLICATIONS

M. I. Jordan, "Attractor Dynamics and Parallelism in a Connectionist Sequential Machine", in *Procs. of the 8th Annual Conf. of the Cognitive Science Society*, pp. 531–546, Erlbaum (1986).

J. T.-H. Lo, "Finite-dimensional Sensor Orbits and Optimal Nonlinear Filtering", *IEEE Transactions on Information Theory*, vol. IT-18, pp. 583–588 (1972).

K. Hornik et al., "Multilayer Feedforward Networks are Universal Approximators", *Neural Networks*, vol. 2, pp. 359–366 (1989).

P. Poddar and K. P. Unnikrishnan, "Non-linear Prediction of Speech Signals Using Memory Neuron Networks", in *Neural Networks for Signal Processing*, ed. J. H. Juang et al., pp. 395–404 (1991).

A. J. Robinson and F. Fallside, "A Dynamic Connectionist Model for Phoneme Recognition", in *Neural Networks from Models to Applications*, ed. L. Personnaz and G. Dreyfus, pp. 541–550, IDEST, Paris (1989).

O. Nerrand et al, "Neural Network Training Schemes for Non-linear Adaptive Filtering and Modelling", in *Procs. of IJCNN*, Jun. 1991, Seattle, Wash., pp. I-61-I--66 (1991).

J. P. DeCruyenaere and H. M. Hafez, "A Comparison between Kalman Filters and Recurrent Neural Networks", in *Procs. of IJCNN*, Jun. 1992, Baltimore, Md., pp. IV-247-IV-251 (1992).

J. T.-H. Lo, "Optical Filtering by Recurrent Neural Networks", in *Procs. of the 30th Annual Allerton Conf. on Comm., Contr., and Comput.*, Monticello, Ill., Oct. 1992, ed. P. Van Dooren and M. Spong, pp. 903–912 (1992).

J. T.-H. Lo, "Synthetic Approach to Optimal Filtering", *Procs. of the 1992 Intl. Simul. Tech. Conf. and 1992 Workshop on Neural Networks*, Clear Lake, Tex., Nov. 1992, pp. 475–481 (1992).

O. Nerrand et al., "Neural Networks and Nonlinear Adaptive Filtering: Unifying Concepts and New Algorithms", *Neural Computation*, vol. 5, pp. 165–199 (1993).

L. Yin et al., "A New Class of Nonlinear Filters—Neural Filters", *IEEE Transaction on Signal Processing*, vol. 41, pp. 1201–1222 (1993).

| primary filter | → primary filter with augmented exogenous input nodes |
| ancillary filter | → ancillary filter with augmented exogenous input nodes |
| training data | → augmented training data |
| ancillary training data | → augmented ancillary training data |
| y(t) | → (y(t), s(t)) |

OPTIMAL FILTERING BY RECURRENT NEURAL NETWORKS

STATEMENT OF GOVERNMENT INTEREST

This invention was made in part with United States Government support under contract F30602-91-C-0033 awarded by the U.S. Air Force. The Government has certain rights in some claims.

BACKGROUND OF THE INVENTION

This invention is concerned with the problem of discrete-time optimal filtering, namely the problem of processing a discrete-time measurement process for the purpose of estimating a discrete-time signal process.

In the standard formulation of the problem in the modern theory of optimal filtering, the signal process and measurement process are described by the mathematical/statistical model:

$$x(t+1)=f(x(t),t)+G(x(t),t)\xi(t), x(1)=x_1, \quad (1)$$

$$y(t)=h(x(t),t)+\epsilon(t) \quad (2)$$

where $x(t)$ is an n-dimensional stochastic process; $y(t)$ is an m-dimensional stochastic process; $x_1$ is a Gaussian random vector, $\xi(t)$ and $\epsilon(t)$ are respectively $n_1$-dimensional and $m_1$-dimensional Gaussian noise processes with zero means; $x_1$, $\xi(t)$ and $\epsilon(t)$ have given joint probability distributions; and $f(x,t)$, $G(x,t)$ and $h(x,t)$ are known functions with such appropriate dimensions and properties that (1) and (2) describe faithfully the evolutions of the signal and measurement. The problem of discrete-time optimal filtering is to design and make a discrete-time dynamic system that inputs $y(t)$ and outputs an estimate $\hat{x}(t)$ of $x(t)$ at each time $t=1,2,\ldots,T$, which estimate minimizes a given estimation error criterion. Here T is a positive integer or infinity. The dynamic system is called an optimal filter with respect to the given estimation error criterion. The dynamic state of the optimal filter at a time $t_1$ must carry the optimal conditional statistics given all the measurements $y(t)$ that have been received up to and including the time $t_1$ at the time so that at the next time $t_1+1$, the optimal filter will receive and process $y(t_1+1)$ using the optimal conditional statistics from $t_1$, and then produce the optimal estimate $\hat{x}(t_1+1)$. The most widely used estimation error criterion is the mean square error criterion, $E[\|\hat{x}(t)-x(t)\|^2]$, where E and $\|.\|$ denote the expectation and the Euclidean norm respectively. The estimate $\hat{x}(t)$ that minimizes this criterion is called the minimum variance estimate or the least-square estimate.

The most commonly used method of treating such a problem is the use of a Kalman filter (KF) or an extended Kalman filter (EKF). A detailed description of the KF and EKF (and some other approximate nonlinear filters) can be found in e.g., A. H. Jazwinski, *Stochastic Processes and Filtering Theory*, pp. 194-358, Academic Press (1970), and B. D. O. Anderson and J. B. Moore, *Optimal Filtering*, pp. 36-287, Prentice-Hall (1979). The KF and EKF have been applied to a wide range of areas including aircraft/ship inertial and aided-inertial navigation, spacecraft orbit determination, satellite attitude estimation, phase array radar tracking, nuclear power plant failure detection, power station control, oceanographic surveying, biomedical engineering, and process control. Many important papers on the application of the KF and EKF can be found in H. W. Sorenson, editor, *Kalman Filtering: Theory and Application*, IEEE Press (1985).

In the rare cases where f and h are linear functions of $x(t)$ and G does not depend on $x(t)$, the model, (1) and (2), is called the linear-Gaussian model. If the KF is used for a linear-Gaussian model, the resulting estimate $\hat{x}(t)$ is the minimum variance (or the least-squares) estimate. In most cases, however, the foregoing linearity conditions on f, h and G are not satisfied and the EKF is used. At each time point, the EKF, which is a suboptimal approximate filter, first linearizes f and G at the estimated value of $x(t)$ and linearizes h at the predicted value of $x(t+1)$. Then the EKF uses the KF equations to update the estimated value of $x(t+1)$ and the predicted value of $x(t+2)$ for the new measurement $y(t+1)$. By iterating the linearization and estimation a certain number of times or until convergence at each time point, we have the so-called iterated EKF (IEKF). Since both the EKF and IEKF involve linearization, they are not optimal filters. In fact, when either the random driving term $G(x(t))\xi(t)$ in (1) or the random measurement noise $\epsilon(t)$ in (2) has such large variances and covariances that the aforementioned estimated value and predicted value of the signal are not very close to the true signal, and/or when the functions f, G and h are not very smooth, the linearization may be a poor approximation and the EKF as well as IEKF may yield poor estimates or even fail totally.

This shortcoming of the EKF and IEKF has motivated an enormous amount of work on nonlinear filtering in the past thirty years or so. But the results have been disappointing. With very few, if any, exceptions, the nonlinear filtering results have been confined to research papers and textbooks. The EKF and, to a much less extent, the IEKF remain as the standard filters for estimating stochastic signals.

The 30-year failure is believed to be related to the methodology that has been used since R. E. Kalman derived the KF equations. The methodology is analysis. Starting with a mathematical/statistical model, the methodology searches for a solution consisting of analytic formulas and/or equations that describe the structures and determine the parameters of the filter. In the process of searching, deductive reasoning is used and many assumptions are made to make some special cases analytically tractable. In fact, the KF was derived under the assumptions that f and h are linear in $x(t)$, G does not depend on $x(t)$, and $\xi(t)$ and $\epsilon(t)$ are Gaussian sequences. The model, (1) and (2), contains such assumptions as the Markov property, Gaussian distribution, and additive measurement noise. When enough additional assumptions are made to derive explicit filter equations, these assumptions are usually so restrictive and/or unrealistic that they prevent the filter equations from much real-world application.

When not enough additional assumptions are made, the analysis involved is so deep and complicated that it leads mostly to mathematical formulas and equations that are not ready for designing or implementing a real filter. This state of the art is reflected in V. Krishnan, *Nonlinear Filtering and Smoothing: An Introduction to Martingales, Stochastic Integrals and Estimation*, John Wiley & Sons (1984) and R. S. Liptser and A. N. Shiryayev, *Statistics of Random Processes I: General Theory and II: Applications*, Springer-Verlag (1977). In the few cases where the assumptions are not so bad and the explicit filtering algorithms are available, these filtering algorithms involve such an enormous amount of computation that their real-time implementation is prohibitively expensive if not impossible. Some examples of such cases can be found in R. S. Bucy and K. D. Senne, "Digital Synthesis of Non-linear Filters," *Automatica*, Vol. 7, pp. 287-298, 1971, J. T. -H. Lo, "Optimal Estimation for the Satellite Attitude using Star Tracker Measurements," *Automatica*, Vol. 22, pp. 477-482, 1986, and J. T. -H. Lo and S. K. Ng, "Optimal Fourier-Hermite Expansion for Estimation," *Stochastic Processes and Their Applications*, Vol. 21, No. 2, pp. 21-35, 1987.

Because of the inherent inaccuracies and frequent failures of the EKF and IEKF and the restrictive and unrealistic assumptions and prohibitive computational requirements of other existing filters, new filters are needed that consistently yield a high degree of estimation accuracy vis-à-vis the information contained in the measurements about the signal and that can be applied in a large variety of real-world situations.

Recent years have seen a rapid growth in the development of artificial neural networks (ANNs), which are also known as connectionist models, parallel distributed processors, neuroprocessors, and neurocomputers. Being crude mathematical models of theorized mind and brain activity, ANNs exploit the massively parallel processing and distributed information representation properties that are believed to exist in a brain. A good introduction to ANNs can be found in R. Hecht-Nielsen, *Neurocomputing*, Addison-Wesley (1990) and J. Hertz, A. Krogh and R. G. Palmer, *Introduction to the Theory of Neural Computation*, Addison-Wesley (1991).

There is a large number of ANN paradigms such as Hopfield networks, high-order networks, counterpropagation networks, bidirectional associative memories, piecewise linear machines, neocognitrons, self-organizing feature maps, adaptive resonance theory networks, Boltzmann machines, multilayer perceptrons (MLPs), MLPs with various feedback structures, other recurrent neural network paradigms, etc. These and other ANN paradigms have been applied to systems control (e.g., D. A. White and D. A. Sofge, editors, *Handbook of Intelligent Control*, Van Nostrand Reinhold (1992)), signal processing (e.g., B. Kosko, editor, *Neural Networks for Signal Processing*, Prentice Hall (1992)), Speech Processing (e.g., D. P. Morgan and C. L. Scofield, *Neural Networks and Speech Processing*, Kluwer Academic Publishers (1991)), and others (e.g., E. Sanchez-Sinencio and C. Lau, editors, *Artificial Neural Networks*, IEEE Press (1992)).

There are many research articles concerning applications of ANNs, most of which can be found in the foregoing books, journals (e.g., IEEE *Transactions on Neural Networks*, *Neural Networks*, and *Neural Computation*), and Conference proceedings (e.g., *Proceedings of the International Joint Conference on Neural Networks*). Application of one of the aforementioned neural network paradigms to optimal filtering was reported in S. I. Sudharsanan and M. K. Sundareshan, "Maximum A Posteriori State Estimation: A Neural Processing Algorithm," *Proceedings of the 28th Conference on Decision and Control*, pp. 1805-1806 (1989). The signal and measurement processes considered therein are described by the linear-Gaussian model and the neural network used is a Hopfield network with the neural activation function slightly modified. The connection weights and neuron biases for the network are determined by using the Kalman filter (KF) equations so that when the Hopfield network stabilizes at each time point, the stable state is the minimum variance estimate. The usefulness of the method is very limited, because it can only be applied to the linear-Gaussian model for which the KF equations are available and the weights and biases of the Hopfield network need to be updated in the operation of the Hopfield network by other means using the Kalman filter equations.

There are also many patent documents concerning the applications of ANNs. Only a couple that seem the most relevant to the present invention among them are mentioned as follows. In U.S. Pat. No. 5,003,490 to P. F. Castelaz and D. E. Mills, (1991), a multilayer perceptron with a sigmoid activation function and a tapped delay line for the input is used to classify input waveforms. In U.S. Pat. No. 5,150,323 (1992) to P. F. Castelaz, a multilayer perceptron with a sigmoid activation function and a couple of tapped delay lines for preprocessed inputs is used for in-band separation of a composite signal into its constituent signals.

SUMMARY OF INVENTION

In accordance with the teachings of the present invention, a method and an apparatus are provided for filtering a measurement process to estimate a signal process.

As opposed to the analytic methodology used in the conventional filtering theory, the new method is synthetic in nature. The method synthesizes realizations of the signal process and measurement process into a primary filter to estimate the signal process and, if required, an ancillary filter to provide the estimation error statistics for the primary filter. Both the primary and the ancillary filters are made out of artificial recurrent neural networks (RNNs) in accordance with the present invention. Implementation of the primary filter and, if required, the ancillary filter results in a filtering apparatus.

The synthesis is performed through training RNNs using a set of unconventional training data consisting of the realizations of the signal and measurement processes. More specifically, the weights and/or parameters and initial dynamic state of an RNN are determined by minimizing a training criterion by the variation of the weights and/or parameters and initial dynamic state. An alternative way to determine the initial dynamic state of an RNN is to simply set it equal to a canonical initial dynamic state. The training criterion incorporates all the training data and is a function of the weights and/or parameters and initial dynamic state of the RNN under training.

For synthesizing a primary filter, the training criterion is defined on the basis of an estimation error criterion suitable for the filtering needs and environment. For synthesizing an ancillary filter, the training criterion is defined in consideration of the estimation error statistics required of the primary filter.

After adequate training, both the primary and the ancillary filters are recursive filters optimal for the given respective RNN architectures with the lagged feedbacks carrying the optimal conditional statistics. Such filters are called neural filters. If appropriate RNN paradigms and estimation error criteria are selected, the primary and the ancillary filters of such paradigms are proven to approximate the respective optimal filters in performance (with respect to the selected estimation error criteria) to any desired degree of accuracy, provided that the RNNs that constitute the primary and ancillary filters are of sufficiently large sizes.

If a mathematical model of the signal and measurement processes such as (1) and (2) is available, the realizations of the signal and measurement processes are generated by computer simulation. Otherwise, these training data can be collected by conducting actual experiments with the signal and measurement processes. Since we do not use a mathematical model to derive formulas and equations, such properties as the Markov property, Gaussian distribution and additive noise are not required of the signal and measurement processes for the present invention to apply. In fact, the present invention applies to virtually any signal process (to be defined in the sequel) and measurement process with only one restriction: the values of the measurement process must lie in a compact (i.e. bounded and closed) region. This restriction is certainly not too restrictive in the real world.

Extensive numerical work was carried out to compare the neural filters and the KF, EKF and IEKF for signal and measurement processes that can be described by the mathematical model (1) and (2). The numerical results show that the neural filters almost equal the KF in performance for a linear model in both transient and steady states of filtering and always outperform the EKF and IEKF for a nonlinear model, when there is sufficient number of neurons (or processing elements) in the neural filter.

If the signal and measurement processes are time-variant, a modified method and apparatus is provided in accordance with the teachings of the present invention. The idea is to include a time function describing the time-variant property as extra inputs to a neural filter with augmented exogenous input nodes so as to reduce the numbers of neurons and connections required of the neural filter to achieve the same level of filtering accuracy as does a neural filter without augmented exogenous input nodes.

DESCRIPTION OF THE DRAWINGS

FIG. 18 is a table showing the replacements of terminologies required to convert the block diagrams in FIG. 2 and FIGS. 11–17 into corresponding block diagrams concerning a primary filter with augmented exogenous input nodes and/or an ancillary filter with augmented exogenous input nodes.

DESCRIPTION OF THE INVENTION

Figure 1:
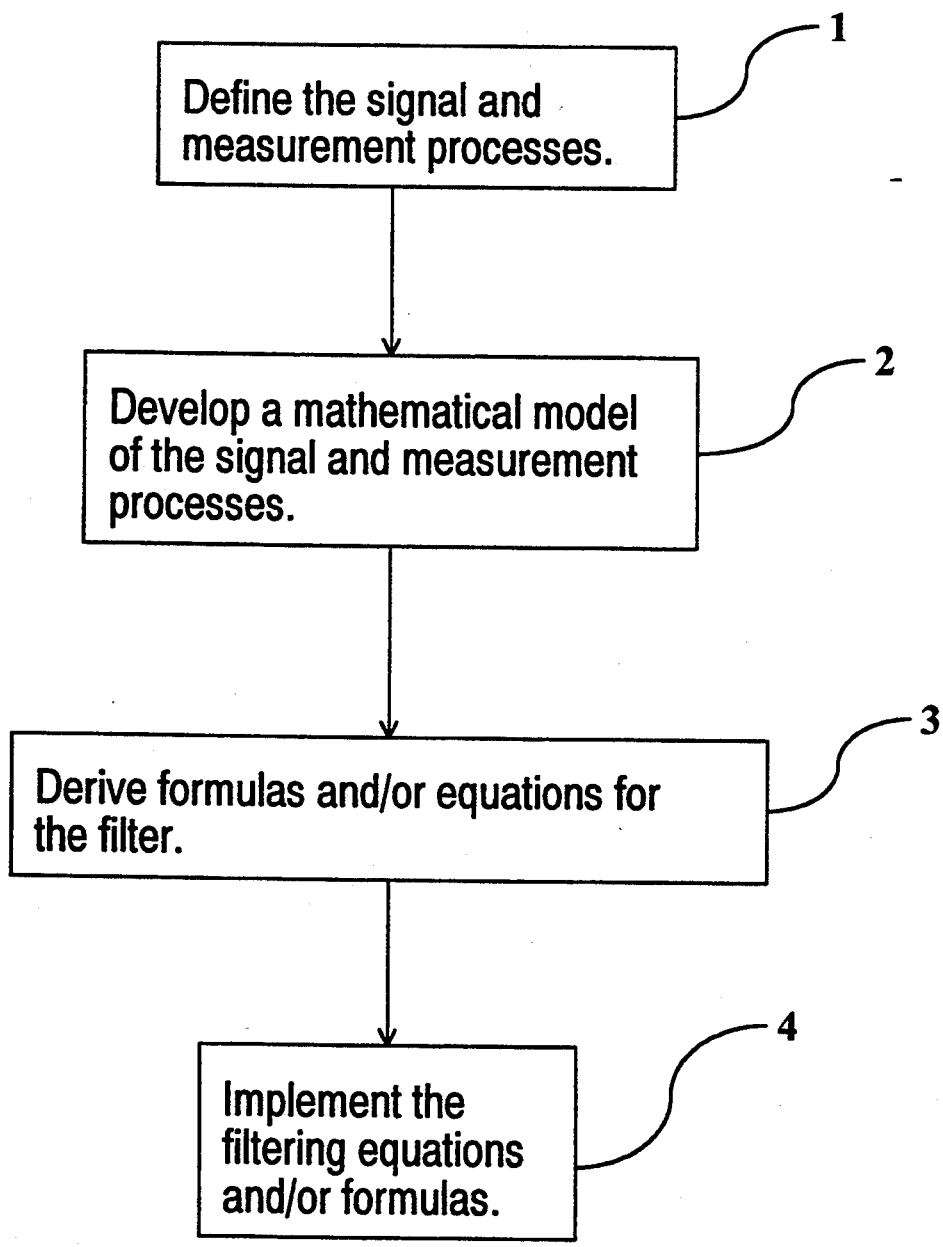
FIG. 1 is a block diagram showing the major steps taken in using the conventional method of designing and making a filter.

Referring to FIG. 1, a block diagram of the conventional method of designing and making a filter is shown. The conventional method consists essentially of four steps. First 1, the filtering requirements are examined and the signal and measurement processes are defined. Second 2, a mathematical model of the signal and measurement processes is developed. In this process of modeling, the assumptions such as the Markov property, Gaussian distribution, and additive noise are made to make the model mathematically tractable. The most widely used type of model is (1) and (2). Third 3, analytic methods and techniques are used to derive formulas and/or equations to characterize the estimate of the signal process and its error statistics. If the formulas and/or equations are not in an implementable form, they are simplified by approximation. The most widely used approximate filter resulting from this analytic approach is the extended Kalman filter.

In the last step 4, the simplified filter formulas and/or equations are implemented by programming a computing device or making a special circuit for the filter. As discussed earlier, this analytic method has many shortcomings. Briefly, it needs a mathematical/statistical model, which is sometimes difficult or even impossible to get; it makes many assumptions, which are sometimes not valid; it derives formulas/equations, which, more often than not, have to be simplified by rough approximations in order to be implemented; and lastly, the analytic method produces filters, which are inaccurate relative to the optimal and require excessive computing time for high-dimensional nonlinear problems.

In accordance with the present invention, a new method and a new apparatus are provided for processing a discrete-time measurement process for the purpose of estimating a discrete-time signal process. Some terminologies used herein are now defined: A vector is an element of a finite dimensional Euclidean space. A scalar is a one dimensional vector. A vector-valued variable is either a single-dimensional or a multiple-dimensional variable. A process is an ordered sequence of vector-valued variables with the same dimension. The sequence index is called time and denoted by t and takes on nonnegative integer values $1, 2, \ldots, T$, where T is a finite positive integer or infinity. There may or may not be a mathematical/statistical model for the process, which governs the evolution of the process. There may or may not be any knowledge about the relationship among the components of each vector-valued variable of the process or among the vector-valued variables at different times. The collection of all the processes whose values at each time are what we want to estimate is called a signal process. The vector value of a signal process at time t is called the signal or signal vector at time t. A mathematical/statistical model for a signal process is (1). The collection of all the additional processes whose values at each time need to be estimated to provide required estimation error statistics is called an ancillary signal process. The collection of all the processes whose values at each time are the measurements available to and selected by us for the estimation of a signal process is called a measurement process. The vector value of a measurement process at time t is called the measurements or measurement vector at time t. The measurements at a time are usually sensor outputs at the time. A mathematical/statistical model for a measurement process is (2). The measurement process may or may not contain random noises, but must contain information about the signal process. A signal vector and a measurement vector can be either single-dimensional or multiple-dimensional. A filter is a dynamic system, with a dynamic state, that inputs the measurement vectors one at a time in the order that they appear in the measurement process and then outputs, at each corresponding time, an estimate (or estimate vector) of the vector-valued variable of a signal process or an ancillary signal process at the same time. The filter is assumed to be a casual dynamic system and hence the estimate produced by the filter at each time $t_1$ is necessarily a function of all the measurement vectors that have been received by the filter up to and including time $t_1$. The word "filter" is used to refer to either a mathematical description or its implementation of the dynamic system, depending on the context. Filters for estimating the signal process and the ancillary signal process are called a primary filter and an ancillary filter respectively. A realization of a signal process and the corresponding realization of a measurement process are, respectively, a sequence of the consecutive vector values of the signal process and a sequence of the corresponding consecutive vector values of the measurement process, that are recorded jointly at the same time in an actual experiment or a computer simulation. A neuron (or node) is a signal (or information) processing element that is capable, at any instant of time, of receiving input signals (i.e. real numbers) and producing an output signal (i.e. a real number), which is called the activation level of the neuron. There are many types of neuron. Neurons of some types are each specified in part by a certain number of constants, which affect the signal processing that the neuron with these constants performs. These constants are called the parameters of the neuron. A connection (or interconnect) is means for effecting a weighted signal transfer from one neuron to another neuron. More specifically, a connection is means for multiplying the activation level of a neuron by a number, which is called the weight of the connection, and sending the multiple to another neuron as one of the neuron's input signals. A feedback connection (or interconnect) is means for effecting a weighted information transfer from one neuron to another neuron after a unit-time delay. More specifically, a feedback connection (or interconnect) is means for holding the activation level of a neuron for one unit of time, multiplying it by a number, which is called the weight of the feedback connection, and then sending the multiple to another neuron as one of this neuron's input values. A neural network is a plurality of neurons and a plurality of connections, which include some neurons receiving input signals from outside the neural networks, which neurons are called exogenous input nodes and some neurons sending out output signals to outside the neural network, which neurons are called outward output nodes. Those neurons that are neither exogenous input nodes nor outward output nodes are called hidden neurons of the neural network. There may be one or more different types of neuron in a neural network. For instance, an exogenous input node may only serve to distribute its single input signal through connections to some other neurons and an outward output node may only serve to evaluate the sum of its input signals, which arrive through connections from other neurons. A neural network is called a recurrent neural network (RNN), if the neural network includes one or more feedback connections. An RNN is a discrete-time dynamic system with all the activation levels at a time of the RNN, that are fedback through feedback connections, as its dynamic state at the time. The collection of all the RNNs with the same type or types of neuron, same type or types of feedback connection, and same type or types of feedforward connection (e.g. whether there are layers of neurons with no feedforward connection within each layer) is called an RNN paradigm. The collection of all the RNNs of the same RNN paradigm that have the same number of the neurons of each type, the same number of feedback connections of each type, the same number of feedforward connections of each type (e.g. the same number of layers and the same number of neurons in each layer), the same number of input nodes, the same number of output nodes, etc. is called an RNN architecture. In other words, two RNNs are of the same architecture if and only if they are identical except with different weights on the connections and/or different parameters in the neurons. Whenever these weights, and parameters, if there are any, are determined for an RNN architecture, the RNN is completely specified. To simplify our terminology, the totality of these weights, and parameters, if there are any, of an RNN are called the weights of the RNN, unless a distinction between the weights on the connections and the parameters in the neurons is necessary and made clear in the context. A primary or an ancillary filter that is made out of an RNN in accordance with the teaching of the present invention is called a neural filter. When it is necessary to distinguish an RNN, an RNN paradigm, or an RNN architecture, that is associated with an ancillary filter, from that associated with a primary filter, we use the modifier, "ancillary," to specify the former. Hence, an ancillary RNN, an ancillary RNN paradigm, an ancillary RNN architecture, and ancillary training data refer to an RNN, an RNN paradigm, an RNN architecture, and training data, respectively, of an ancillary filter. Many other terminologies will be defined as needs arise in the sequel.

Figure 2:
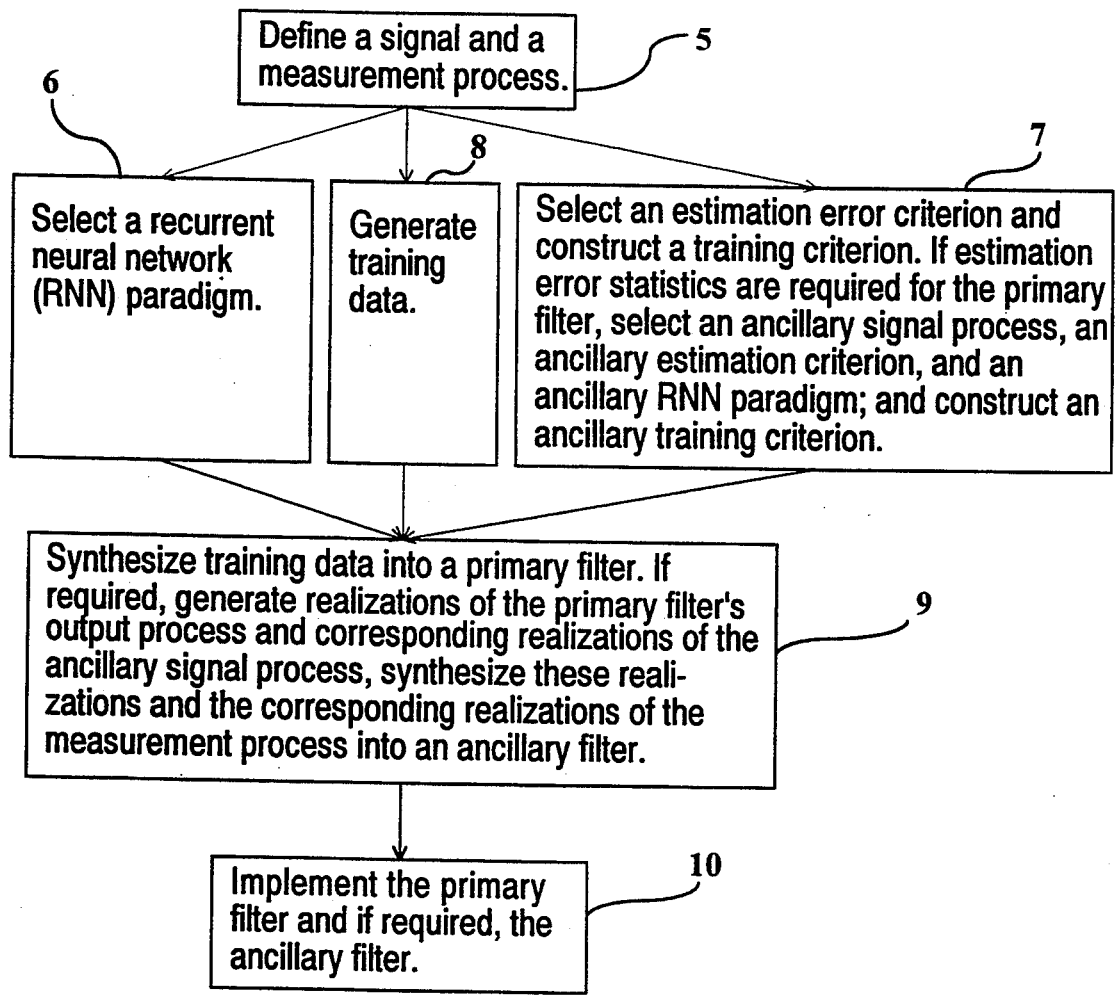
FIG. 2 is a block diagram showing the major steps taken in using the synthetic method of designing and making a filter in accordance with the teachings of the present invention.

As opposed to the analytic method used in the conventional therapy of filtering, the method of designing and making a filter according to the present invention is synthetic in nature. The method comprises six steps as shown in FIG. 2.

In the first step 5, the signal and measurement processes are defined. Usually, the measurement vector at a time point consists of the measurements available at the time point. The signal vector should consist of the quantities that are to be estimated. The measurement vectors and signal vectors at times $t=1, 2, \ldots, T$ form the measurement process and the signal process, respectively.

In the second step 6 and the third step 7, a recurrent neural network paradigm and an estimation error criterion are selected respectively. There are a large number of recurrent neural network paradigms and many estimation error criteria to choose from, which will be described in the sequel. If estimation error statistics are required, an ancillary signal process is defined in consideration of the estimation error criterion. For estimating the ancillary signal process and thereby generating the estimation error statistics, an ancillary estimation error criterion is also selected in the third step 7.

In the fourth step 8, training data, which consists of realizations of the signal and measurement processes, are generated. If a mathematical model of the signal and measurement processes are available, the training data are easily generated by computer simulation. Otherwise, actual experiments with the signal and measurement processes are performed to collect the training data. The second, third and fourth steps 6, 7, 8 can be done in any order or in parallel.

In the fifth step 9, the training data are synthesized into a primary filter by training each of a collection of recurrent neural networks (RNNs) of the selected RNN paradigm using the training data and then selecting one RNN in consideration of the RNN size versus the estimation accuracy to maximize cost-effectiveness for the application. A collection of recurrent neural networks is defined to be a group of at least one recurrent neural network. If some estimation error statistics are required, realizations of the primary filter's output process and corresponding realizations of the ancillary signal process are generated. These realizations together with their corresponding realizations of the measurement process are then synthesized into an ancillary filter by training at least one RNN of the selected ancillary RNN paradigm using the realizations and then selecting one RNN in consideration of the RNN size versus the estimation accuracy to maximize cost-effectiveness for the application. Training means minimizing a training criterion by the variation of the weights (i.e. weights and/or parameters) or by the variation of the weights and the initial dynamic state of an RNN. A large number of unconstrained optimization methods are available. These optimization methods, some of which take advantage of the rich structures of the RNN, will be discussed later on. If the filtering performance of a trained up RNN is unsatisfactory, the size of the RNN should be increased and the training repeated. This process of training and testing RNNs of various sizes continues until the filtering performance of an RNN is satisfactory or can not be significantly improved, whichever occurs first. Then an RNN is selected in consideration of the RNN size versus filtering accuracy to optimize cost-effectiveness.

In the sixth and last step 10, one or two RNNs obtained in the fifth step 9 are implemented by programming a computer, programming an analog or digital device, copying the weights and initial dynamic state of the RNN into a neural network chip, downloading the weights and initial dynamic state of the RNN into a neural network chip, making a special circuit or device for the RNN, or construct an optical or electro-optical apparatus.

It will be appreciated that any of the above six steps may be repeated if necessary. It will also be appreciated that two or more of the six steps may be performed jointly and/or at the same time. For instance, if a general-purpose computer (or respectively a neural network chip) is used in the fifth step 9 of synthesizing training data into a primary filter, the resulting primary filter has already been programmed (or respectively downloaded) into the general-purpose computer (or respectively the neural network chip) and thus the fifth and the sixth steps have been carried out jointly at the same time.

Figure 3:
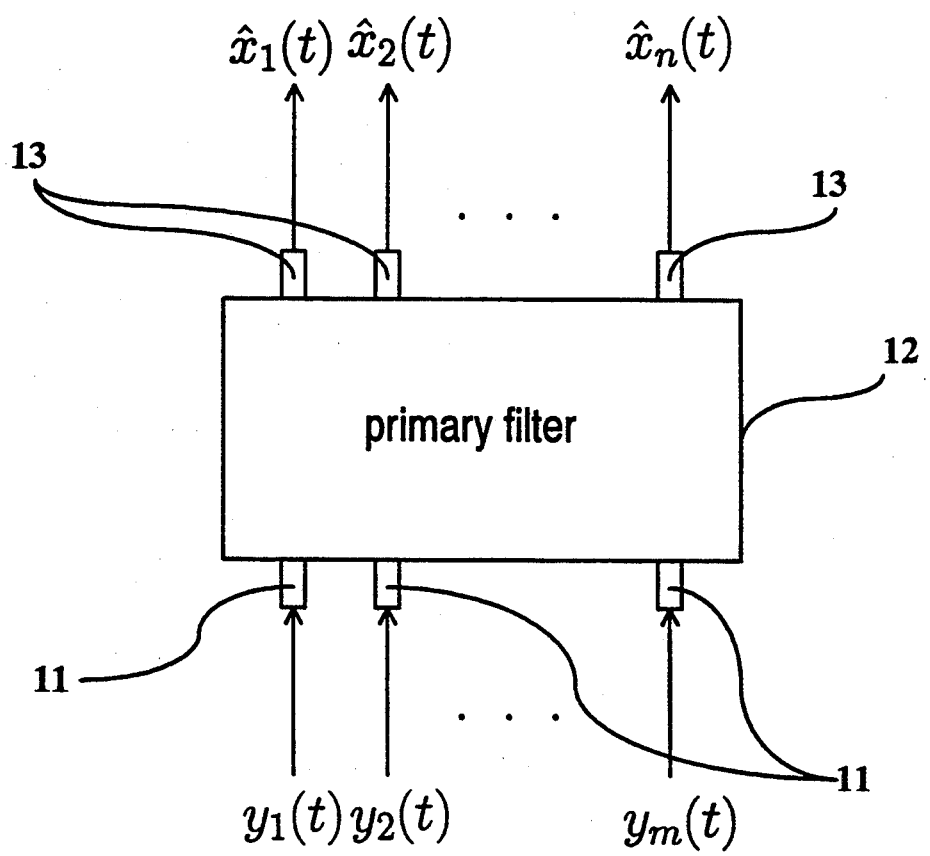
FIG. 3 shows a primary filter receiving the measurement vector ($y_1(t)$, $y_2(t)$, ..., $y_m(t)$) at the input terminals of the filter and sending out the estimate ($\hat{x}_1(t)$, $\hat{x}_2(t)$, ..., $\hat{x}_n(t)$) of the signal vector ($x_1(t)$, $x_2(t)$, ..., $x_n(t)$) at the output terminals of the filter at time t.

After implementation, the primary filter can be viewed as a box 12 with input and output terminals as shown in FIG. 3. It receives the measurement vector $(y_1(t), y_2(t), \ldots, y_m(t))$ at the input terminals 11 and sends out the estimate $(\hat{x}_1(t), \hat{x}_2(t), \ldots, \hat{x}_n(t))$ of the signal vector $(x_1(t), x_2(t), \ldots, x_n(t))$ at the output terminals 13 at the discrete-time $t=1, 2, \ldots$. Similarly, the ancillary filter, after implementation, can also be viewed as a box with input and output terminals. The primary filter, and if required, the ancillary filter are each called a neural filter. It is understood that an input terminal and an output terminal of a neural filter are respectively means for inputing to and outputing from the neural filter. Each input terminal is connected to an exogenous input node and each output terminal is connected to an outward output node of the neural filter. The input terminals 11 and output terminals 13 in FIG. 3 are graphical representations for the illustrative purpose.

Recurrent Neural Networks Used to Construct Filters

A neural filter in accordance with the present invention includes an implementation of one or two recurrent neural networks (RNNs) after proper training. Some RNN paradigms are described in the following.

Figure 4:
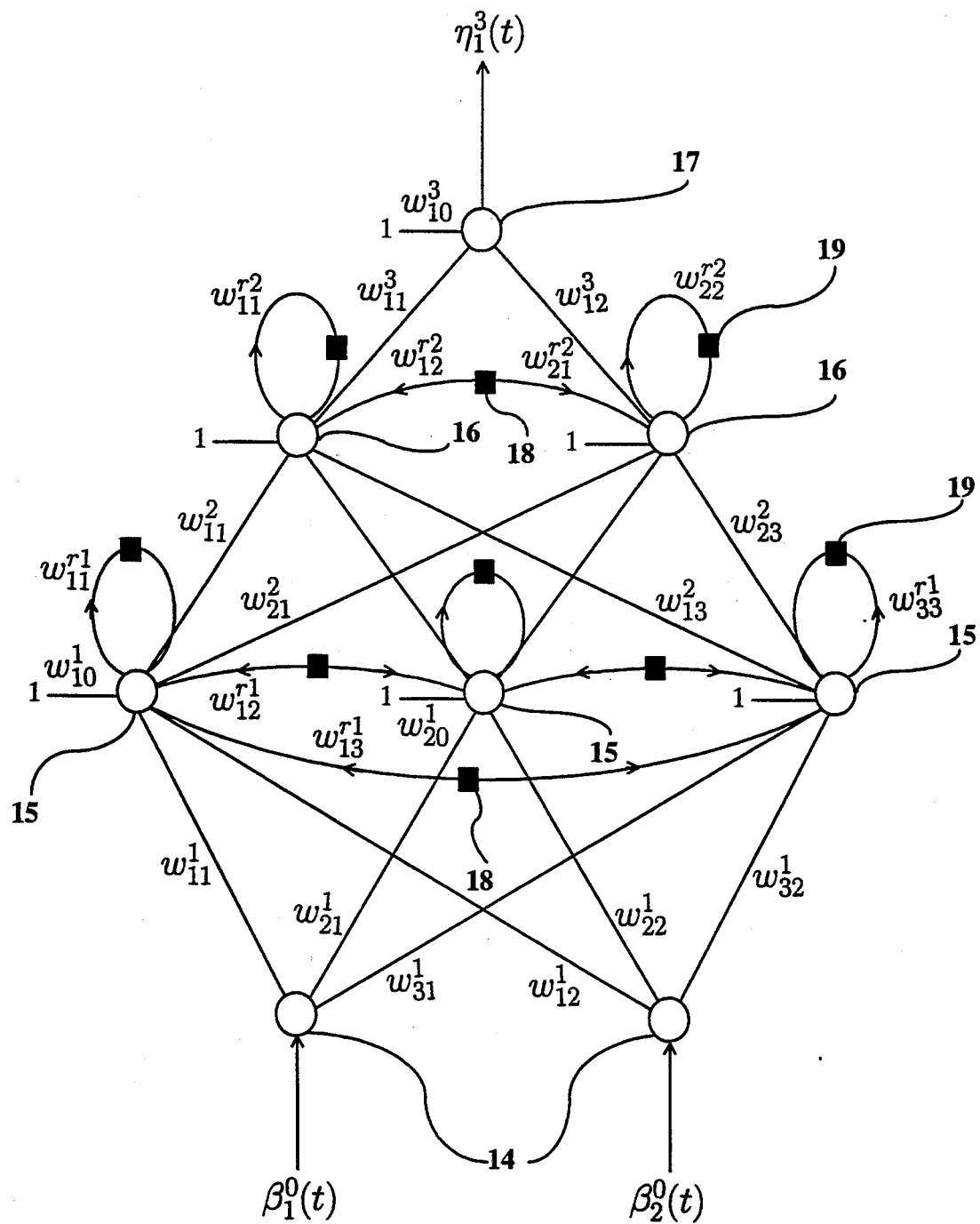
FIG. 4 is a schematic diagram of a typical multilayer perceptron with interconnected neurons (MLPWIN).

1. Multilayer perceptrons with interconnected neurons (MLPWIN): An MLPWIN is formed from a multilayer perceptron (MLP) by interconnecting some or all of the neurons in each layer of the MLP. There is a unit time delay device on each such interconnect. Such RNNs first appeared in J. L. Elman, "Finding Structures in Time," Cognitive Science, Vol. 14, pp. 179–211 (1990). A typical MLPWIN is depicted in FIG. 4. It has 2 input nodes 14, 1 output node 17, and 2 layers 15, 16 of neurons. The first layer has 3 neurons 15 and the second layer has 2 neurons 16. The input and output nodes are regarded as the nodes in layer 0 and layer 3 respectively and the neurons in layers 1 and 2 are regarded as nodes in their respective layers. The nodes 14 in layer 0 simply distribute the inputs to the MLPWIN to the nodes in layer 1 and the node 17 in layer 3 evaluates the weighted sum of the activation levels of the neurons 16 in layer 2. The nodes 14 in layer 0 receives inputs from outside the MLPWIN and the node 17 in layer 3 sends out outputs to outside the MLPWIN. Hence these nodes are also called the exogenous input nodes 14 and outward output node 17, respectively, in consistency with the terminology used for other RNN paradigms. Since the nodes in layers 1 and 2 do not interact directly with outside the MLPWIN, they are called hidden nodes or neurons and their layers are called hidden layers.

Figure 5:
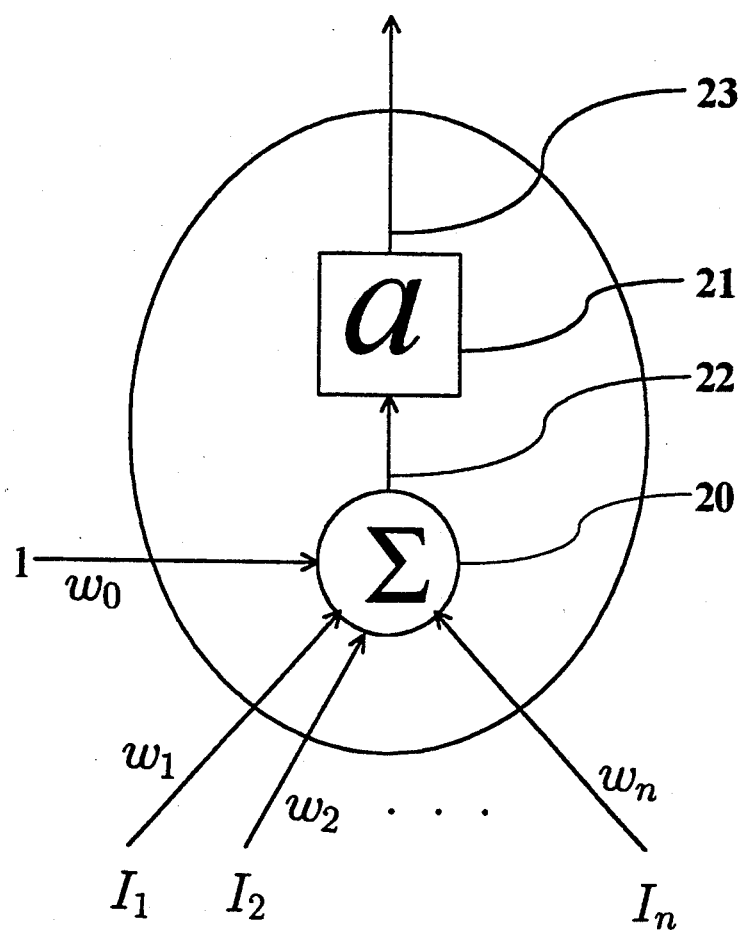
FIG. 5 is a schematic diagram of a neuron, which is used in an MLPWIN such as the one in FIG. 4 and in an MLPWOF such as the one in FIG. 6.

A typical neuron in layers 1 and 2 is depicted in FIG. 5. It consists of a summer 20 and an activation function 21 denoted by $\Sigma$ and a respectively. The activation function is a sigmoid function such as the hyperbolic tangent function tanh x and the logistic function $1/(1+e^{-x})$. The inputs to the typical neuron are denoted by $I_1, I_2, \ldots, I_n$, the weights on the connections leading into the neuron are denoted by $w_1, w_2, \ldots, w_n$, and the bias for the neuron is $w_0$. The weighted sum in the neuron at the connection 22 is then equal to $w_0 + \Sigma_{i=1}^n w_i I_i$ and the activation level of the neuron at its output terminal 23 is $a(w_0 + \Sigma_{i=1}^n w_i I_i)$. An exogenous input node here can be viewed as a neuron that has only a single input and whose activation function is the identity function, $a(x) = x$. An outward output node here can be viewed as a neuron whose activation function is also the identity function. Therefore, the words, "neuron" and "node", are interchangeable.

The nodes in each layer are numbered from left to right here. The "numbering of a node" refers to this numbering in the node's layer. The symbol $w_{ij}^l$ denotes the weight on the connection from node j in layer $l-1$ to node i in layer l. For notational simplicity, the bias for node i in layer l is denoted by $w_{i0}^l$, which is viewed as the "the weight on the connection leading into node i in layer l from node 0 in layer $l-1$, the activation level of node 0 being set always equal to 1." The symbol $w_{ij}^{rl}$ denotes the weight on the interconnect from neuron j to neuron i in the same layer l. The two interconnects associated with $w_{ij}^{rl}$ and $w_{ji}^{rl}$ between neuron i and neuron j in layer l are indicated in FIG. 4 by the opposite arrow heads on the same line connecting the neurons. The solid square 18 between the opposite arrow heads denotes a unit time delay device that the activation levels of neuron i and j go through before they are fedback to neurons j and i respectively. The weight for self feedback of neuron i in layer l is denoted by $w_{ii}^{rl}$. The self-feedback is also delayed by one time unit by a unit time delay device 19 in the FIG. 4.

Let us now see how the MLPWIN depicted in FIG. 4 processes information at time t. Denoting input i to the MLPWIN at time t by $\beta_i^0(t)$, the activation level $\beta_i^l(t)$ of neuron i in layer l and the weighted sum $\eta_i^l(t)$ in the same neuron at time t satisfy, for $l=1,2$, $$\beta_i^l(t) = a(\eta_i^l(t)) \tag{3}$$

$$\eta_i^l(t) = w_{i0}^l + \sum_{j=1}^{n_{l-1}} w_{ij}^l \beta_j^{l-1}(t) + \sum_{j=1}^{n_l} w_{ij}^{rl} \beta_j^l(t-1), \tag{4}$$

where $n_l$ denotes the number of nodes in layer l, a (x) is the activation function, and $\beta_i^l(0)$, for $i=1, 2, \ldots, n_l$ and $l=1,2$, form the initial dynamic state of the MLPWIN. The output $\eta_1^3(t)$ of the MLPWIN depicted in FIG. 4 is then determined by $$\eta_1^3(t) = w_{10}^3 + \sum_{j=1}^{2} w_{1j}^3 \beta_j^2(t). \tag{5}$$

Depending on the application, there can be, in an MLPWIN, any number of exogenous input nodes, outward output nodes, layers, and neurons in each hidden layer. Although only the hyperbolic tangent function tanh x and the logistic function $1/(1+e^{-x})$ have been used as the activation functions in the MLPWINs in the literature, other functions such as any wavelet, spline, polynomial, rational, trigonometric and exponential function can also be used as the activation function in accordance with the present invention to make filters. Another activation function worth mentioning here is $x/(1+|x|)$, which was recently proposed in D. L. Elliott, "A Better Activation Function for Artificial Neural Networks," ISR Technical Report TR 93-8, Institute for Systems Research, University of Maryland, College Park, Md. (1993). It is noted that all the MLPWINs with one and the same activation function for hidden neurons form one MLPWIN paradigm. It will be appreciated that there may be more than one type of activation function in an MLPWIN paradigm and the activation function of an input node does not have to be an identity function.

2. Multilayer perceptrons with output feedbacks (MLPWOFs): An MLPWOF is formed from a multilayer perceptron (MLP) by connecting some or all of its last layer nodes (i.e. the output nodes of the MLP) to some of its zeroth layer nodes (i.e. the input nodes of the MLP). There is a unit time delay device on each such connection. Those last layer nodes that are used as the output nodes of the MLPWOF are called outward output nodes. The outward outputs are the processing results of the MLPWOF. They usually enter the training criterion directly and are forced to approach some target (or desired) outputs of the MLPWOF in training. Therefore, the outward outputs are also called teacher-forced outputs. The phrase "teacher-forcing" used here is not to be confused with a different usage of it in the literature, which means replacing an actual output of an RNN with the corresponding target output for feedback.

Those last layer nodes that are connected to some zeroth layer nodes (i.e. the input nodes of the MLP) are called feedback output nodes. If a feedback output node is also an outward (or teacher-forced) output node, it is called a teacher-forced feedback output node. Otherwise, it is called a free feedback output node. Similarly, a zeroth layer node is called a teacher-forced feedback input node or a free feedback input node, depending on whether the zeroth layer node is connected to a teacher-forced or a free feedback output node. Those zeroth layer nodes that are not connected to last layer nodes and receive inputs from outside the MLPWOF are called exogenous input nodes.

MLPWOFs first appeared in M. I. Jordan, "Attractor Dynamics and Parallelism in a Connectionist Sequential Machine," In *Proceedings of the Eighth Annual Conference of the Cognitive Science Society*, pp. 531-546, Erlbaum (1986). However, in all of the MLPWOFs' applications to system identification/control and signal processing, that can be found in the literature, the output feedback nodes of an MLPWOF include all of the outward output nodes, which are teacher-forced.

In accordance with the teaching of the present invention, a teacher-forced feedback (i.e. feedback from a teacher-forced node) is always inferior to a free (i.e. non-teacher-forced) feedback for filtering a measurement process to estimate a signal process. This is so, because from the optimization point of view, teacher forcing in the neural network training amounts to constraints and from the statistical point of view, free feedbacks are allowed to record the most informative statistics at each time point for the best estimation of the signal at the next time point. This point is borne out by extensive simulation results.

Figure 6:
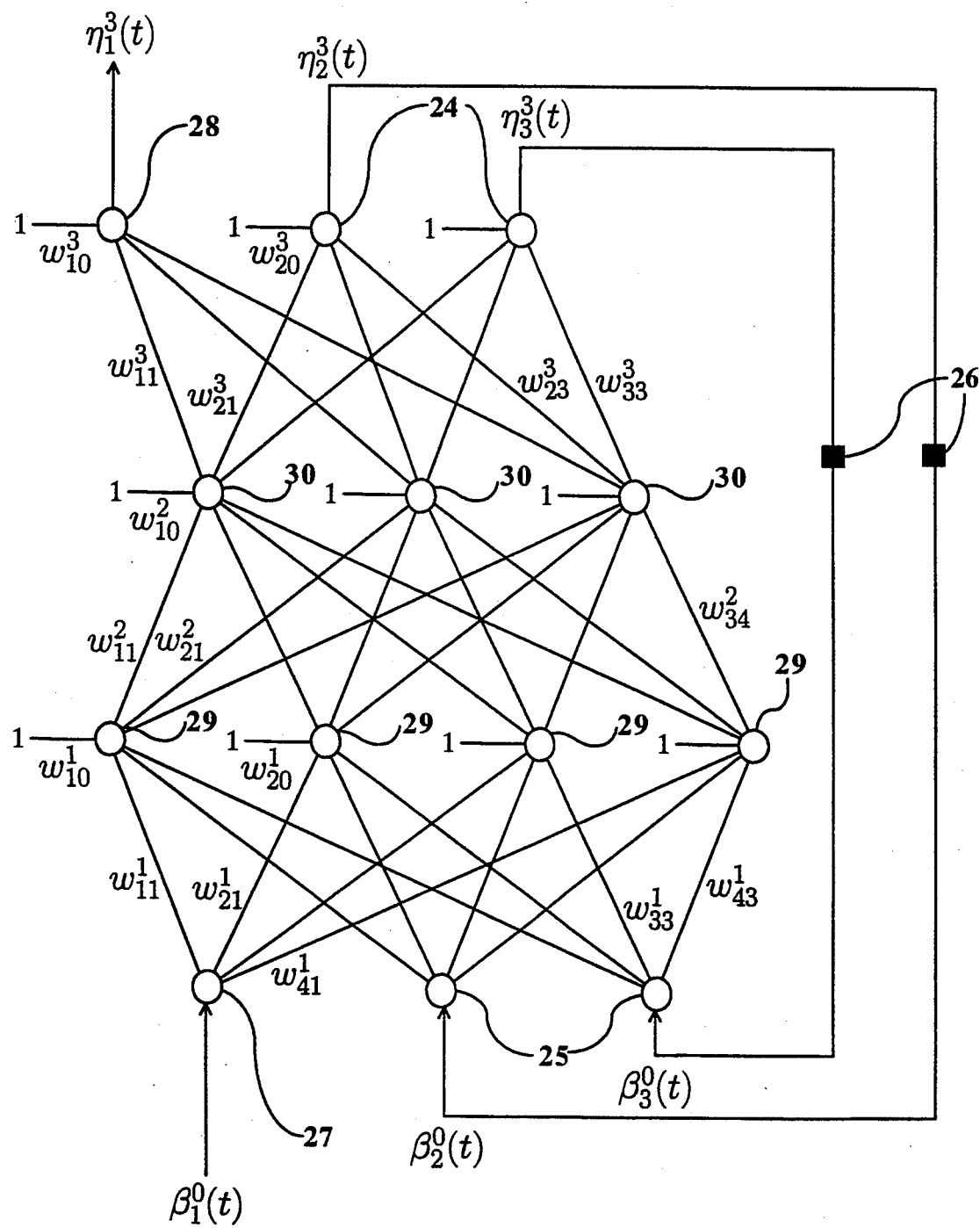
FIG. 6 is a schematic diagram of a typical multilayer perceptron with output feedbacks (MLPWOFs).

Therefore, the preferred MLPWOFs for filtering, in accordance with the teaching of this invention, have only free feedbacks. A typical MLPWOF with only free feedbacks is depicted in FIG. 6. The MLPWOF has 2 free feedback output nodes 24 each connected to a free feedback input node 25 through a unit time delay device 26, which is indicated by a solid square as before. The free feedback output nodes 24 shown in FIG. 6 are summers. However, free feedback output nodes may also be nodes (or neurons) of another type or types. There is one exogenous input nodes 27 in the MLPWOF, which receives input data from outside the network, and one outward output node 28, which sends output data to outside the network.

The MLPWOF in FIG. 6 has 4 neurons 29 in the first layer of neurons and 3 neurons 30 in the second layer. The internal function of a neuron in layers 1 and 2 is shown in FIG. 5 and explained previously. In short, the weighted sum 22 in the neuron is $w_0 + \Sigma_{i=1}^n w_i I_i$ and the activation level 23 of the neuron is $a(w_0 + \Sigma_{i=1}^n w_i I_i)$, where the activation function $a(x)$ is a sigmoid function such as the hyperbolic tangent function tanh x and the logistic function $1/(1+e^{-x})$.

The network from the input nodes including both the free feedback input nodes 25 and the exogenous input node 27, to the output nodes, including both the free feedback output nodes 24 and the outward output node 28, is indeed a multilayer perceptron (MLP). The 3 input nodes 25, 27 and 3 output nodes 24, 28 are regarded as nodes in layer 0 and layer 3 respectively and the neurons in layers 1 and 2 are regarded as nodes in their respective layers. Since the nodes in layers 1 and 2 do not interact directly with outside the MLPWOF, they are called hidden nodes or neurons and their layers are called hidden layers. The 3 nodes in layer 0 simply distribute the feedback inputs to the nodes in layer 1. Each of the 3 nodes in layer 3 evaluates the weighted sum of the activation levels of the neurons in layer 2. All nodes in each layer are numbered from left to right. An exogenous input node here can be viewed as a neuron that has only a single input and whose activation function is the identity function, $a(x) = x$. An outward output node here can be viewed as a neuron whose activation function is also the identity function. Therefore, the words, "neuron" and "node", are interchangeable.

The nodes in each layer are numbered from left to right here. The "numbering of a node" refers to this numbering in the node's layer. The symbol $w_{ij}^l$ denotes the weight on the connection from node j in layer $l-1$ to node i in layer l. Only a few of the $w_{ij}^l$ are shown in FIG. 6 to avoid cluttering the figure. The bias for node i in layer l is denoted by $w_{i0}^l$, which is viewed as "the weight on the connection leading into i in layer l from node 0 in layer $l-1$, whose activation level is set always equal to 1."

Let us now see how the MLPWOF depicted in FIG. 6 processes information at time t. Denoting input i at time t by $\beta_i^0(t)$, the activation level $\beta_i^l(t)$ of neuron i in layer l and the weighted sum $\eta_i^l(t)$ in the same neuron at time t satisfy, for $l = 1, 2$, $$\beta_i^l(t) = a(\eta_i^l(t)), \tag{6}$$

$$\eta_i^l(t) = w_{i0}^l + \sum_{j=1}^{n_{l-1}} w_{ij}^l \beta_j^{l-1}(t), \tag{7}$$

where $n_{l-1}$ denotes the number of nodes in layer $l-1$ and $a(x)$ is the activation function. The output $\eta_i^3(t)$ at output terminal i is then determined by $$\eta_i^3(t) = w_{i0}^3 + \sum_{j=1}^{3} w_{ij}^3 \beta_j^2(t). \tag{8}$$

The feedback outputs, $\eta_2^3(t)$ and $\eta_3^3(t)$, are fedback to the feedback input terminals 25 after a unit time delay. Therefore the feedback inputs, $\beta_2^0(t)$ and $\beta_3^0(t)$, are equal to $\eta_2^3(t-1)$ and $\eta_3^3(t-1)$ respectively. The activation levels, $\eta_2^3(0)$ and $\eta_3^3(0)$, of the feedback output nodes 24 at time $t=0$ form the initial dynamic state of the MLPWOF.

Depending on the application, there can be, in an MLPWOF, any numbers of exogenous input nodes, outward output nodes, free feedbacks, teacher-forced feedbacks, layers, and neurons in each hidden layer. Although only the hyperbolic tangent function tanh x and the logistic function $1/(1+e^{-x})$ have been used as the activation function in the MLPWOF (with teacher-forced output feedbacks) in the literature, other functions such as any wavelet, spline, polynomial, rational, trigonometric and exponential function can also be used as the activation function, in accordance with the present invention, to make the filters. It is noted that all the MLPWOFs with one and the same activation function for hidden neurons form one MLPWOF paradigm. It will be appreciated that there may be more than one type of activation function in an MLPWOF paradigm and the activation function of an input node does not have to be an identity function.

3. Recurrent Radial basis function networks (RRBFNs): Radial basis function networks (RBFNs) first appeared in J. T.-H. Lo, "Finite Dimensional Sensor Orbits and Optimal Nonlinear Filtering", Ph.D. Dissertation, University of Southern California (1969). They were proposed to approximate probability density functions. Only Gaussian activation functions were used then, but numerous other activation functions have been used in a large number of research papers ever since. Nevertheless, all the RBFNs in the literature are feedforward neural networks with a single layer of hidden neurons (or processing units).

Figure 7:
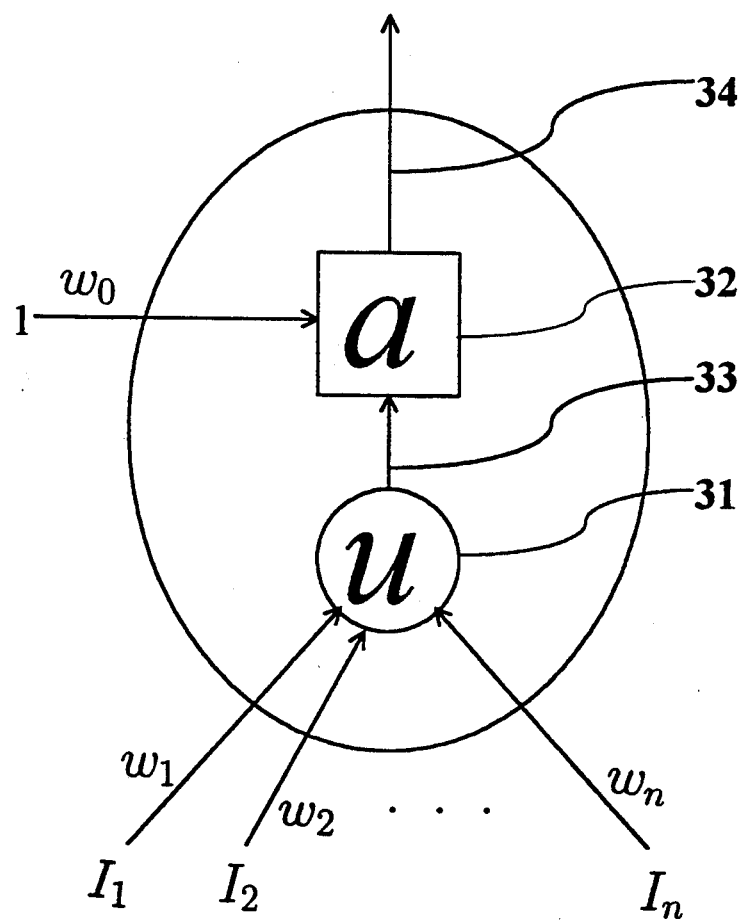
FIG. 7 is a schematic diagram of a general neuron, which consists of a basis function u and an activation function a. For instance, recurrent radial basis function networks (RRBFNs) use such a neuron with the basis function defined to be the Euclidean distance between the weight vector ($w_1$, $w_2$, ..., $w_n$) and the input vector ($I_1$, $I_2$, ..., $I_n$) and with the activation function defined to be the Gaussian, thin-plate-spline, multiquadric, or inverse multiquadric function with $w_0$ as a parameter of the function.

A typical neuron of an RBFN is depicted in FIG. 7. It is a composition of a basis function 31 and an activation function 32, which are denoted by u and a respectively. If the inputs to the neuron are $I_1, I_2, \ldots, I_n$ and the weights on the connections leading into the neuron are denoted by $w_1, w_2, \ldots, w_n$ as shown in FIG. 7, the basis function 31 is usually the Euclidean distance between the vector $(I_1, I_2, \ldots, I_n)$ and $(w_1, w_2, \ldots, w_n)$, i.e.

$$u(I_1,I_2,\ldots,I_n,w_1,w_2,\ldots,w_n) = \sqrt{\sum_{i=1}^{n} (I_i - w_i)^2} , \quad (9)$$

which appears at 33. The activation function 32 can be any one of many functions such as the Gaussian function, $$a(x,w_0)=\exp(-x^2/w_0^2), \quad (10)$$

the thin-plate-spline function, $$a(x,w_0)=x^2\log x, \quad (11)$$

the multiquadric function, $$a(x,w_0)=(x^2+w_0^2)^{\frac{1}{2}}, \quad (12)$$

and the inverse multiquadric function, $$a(x,w_0)=(x^2+w_0^2)^{-\frac{1}{2}}, \quad (13)$$

where $w_0$ is a parameter to be determined together with the weights $w_1, w_2, \ldots, w_n$ in training. The activation level of the neuron is its output at 34.

If we replace the multilayer perceptron neurons depicted in FIG. 5 with the RBFN neurons depicted in FIG. 7 in the hidden layers of the MLPWINs (e.g. FIG. 4) and the MLPWOFs (e.g. FIG. 6), we obtain the RBFNs with interconnected neurons (RBFNWINs) and the RBFNs with output feedbacks (RBFNWOFs), respectively. Thus the RNNs in FIG. 4 and FIG. 6 can be viewed as a typical RBFNWIN and a typical RBFNWOF respectively.

Let us now see how the RBFNWIN depicted in FIG. 4 processes information at time t. Here we assume that the basis function is the Euclidean distance and the activation function is the Gaussian function. Denoting input i to the RBFNWIN at time t by $\beta_i^0(t)$, the activation level $\beta_i^l(t)$ of neuron i in layer l and the basis function output $\eta_i^l(t)$ in the same neuron at time t satisfy, for $l=1,2$, $$\beta_i^l(t) = a(\eta_i^l(t), w_{i0}^l) = \exp[-(\eta_i^l(t))^2/(w_{i0}^l)^2] \quad (14)$$

$$\eta_i^l(t) = \left[ \sum_{j=1}^{n_{l-1}} (\beta_j^{l-1}(t) - w_{ij}^l)^2 + \sum_{j=1}^{n_l} (\beta_j^l(t-1) - w_{ij}^{rl})^2 \right]^{\frac{1}{2}}, \quad (15)$$

where $n_l$ denotes the number of nodes in layer l, and $\beta_i^l(0)$, for $i=1,2,\ldots,n_l$ and $l=1,2$, form the initial dynamic state of the RBFNWIF. The output $\eta_1^3(t)$ of the RBFNWIN depicted in FIG. 4 is then determined by $$\eta_1^3(t) = w_{10}^3 + \sum_{j=1}^{2} w_{1j}^3 \beta_j^2(t). \quad (16)$$

Let us now see how the RBFNWOF depicted in FIG. 6 processes information at time t. Denoting input i at time t by $\beta_i^0(t)$, the activation level $\beta_i^l(t)$ of neuron i in layer l and the weighted sum $\eta_i^l(t)$ in the same neuron at time t satisfy, for $l=1,2$, $$\beta_i^l(t) = a(\eta_i^l(t), w_{i0}^l) = \exp[-(\eta_i^l(t))^2/(w_{i0}^l)^2], \quad (17)$$

$$\eta_i^l(t) = \left[ \sum_{j=1}^{n_{l-1}} (\beta_j^{l-1}(t) - w_{ij}^l)^2 \right]^{\frac{1}{2}}, \quad (18)$$

where $n_{l-1}$ denotes the number of nodes in layer $l-1$. The output $\eta_i^3(t)$ at output node i is then determined by $$\eta_i^3(t) = w_{i0}^3 + \sum_{j=1}^{3} w_{ij}^3 \beta_j^2(t). \quad (19)$$

The feedback outputs, $\eta_2^3(t)$ and $\eta_3^3(t)$, are feedback to the feedback input nodes 25 after a unit time delay. Therefore the feedback inputs, $\beta_2^0(t)$ and $\beta_3^0(t)$, are equal to $\eta_2^3(t-1)$ and $\eta_3^3(t-1)$ respectively. The activation levels, $\eta_2^3(0)$ and $\eta_3^3(0)$, of the feedback output nodes 24 at time $t=0$ form the initial dynamic state of the RBFNWOF.

Depending on the application, there can be in an RBFNWIN or an RBFNWOF any numbers of exogenous input nodes, outward output nodes, free and teacher-forced feedbacks (if appropriate), layers, and neurons in each hidden layer. It is noted that all the RBFNWINs (or respectively RBFNWOFs) with one and the same activation function for hidden neurons form one RBFNWIN (or respectively RBFNWOF) paradigm. It will be appreciated that there may be more than one type of activation function in an RBFNWIN or an RBFNWOF paradigm and an input node does not have to simply distribute an input to the first layer neurons.

4. Other recurrent neural network paradigms: Many other recurrent neural networks can be used to construct neural filters in accordance with the present invention. Since they are too numerous to describe individually in detail here, we will only briefly describe them, sometimes using the general versions of the schematic diagrams in FIG. 4 and FIG. 6 in the following. By the word "general" we mean "with arbitrary numbers of exogenous input nodes, outward output nodes, free and teacher-forced feedbacks (if appropriate), layers of neurons, and neurons in each hidden layer." In the following discussion, reference to FIG. 4 and/or FIG. 6 actually refers to their general versions.

(a). Many different neurons (or nodes) other than those used in MLPWINs, MLPWOFs and RRBFNs can be used in FIG. 4 and FIG. 6. Basically, a neuron (or node) consists of two functions, a basis function u and an activation function a, forming a function composition as depicted in FIG. 7. The basis function is usually a finite series expansion of the inputs, $I_1, I_2, \ldots, I_n$, to the neuron which is comprised of polynomial, rational, trigonometric, exponential, logarithmic, hyperbolic, transcendental, wavelet, and/or spline elements. The parameters of the basis function may or may not be the weights, $w_1, w_2, \ldots, w_n$, on the connections leading into the neuron. If not, then the connections are not assigned weights. In any case, the parameters are determined by the network training.

The activation function is simply a linear or nonlinear transformation, which is a sigmoidal, exponential, wavelet, spline, polynomial, rational, trigonometric, hyperbolic, logarithmic, (other) transcendental function and/or a combination thereof. The activation function may or may not contain parameters to be determined by the network training. For example, in the so called recurrent polynomial networks, the activation function is the identity function and the basis function is a multivariable polynomial of a fixed degree, whose coefficients are the parameters to be determined by the network training.

(b). Tapped delay lines of fixed lengths may be included for holding past neural network output feedbacks, past neuronal inputs to a neuron, and past exogenous inputs to the network. If a tapped delay line is included for a neural network output feedback, say $\alpha_3(t)$ in FIG. 6, the lagged values of the output, say $\alpha_3(t-1)$, $\alpha_3(t-2)$ and $\alpha_3(t-3)$, are available for feedback. There are then the same number of additional feedback input nodes receiving them separately. Similarly, if a tapped delay line is included for an exogenous input, say $\beta_1^0(t)$ in FIG. 4 or FIG. 6, the lagged values of the input, say $\beta_1^0(t-1)$, $\beta_1^0(t-2)$, $\beta_1^0(t-3)$, and $\beta_1^0(t-4)$, are received separately at the same number of additional exogenous input nodes.

If a tapped delay line is included for an input to a neuron, the lagged values of the input are also received by the neuron as inputs to the basis function. For instance, if each of the inputs $I_1(t), I_2(t), \ldots, I_n(t)$ to a neuron has 2 tapped delays, then the basis function u is a finite series expansion of $I_1(t), I_1(t-1), I_1(t-2), I_2(t), I_2(t-1), I_2(t-1), \ldots, I_n(t), I_n(t-1), I_n(t-2)$.

(c). The neural networks depicted in FIG. 4 and FIG. 6 are fully-connected in the sense that every node in a layer is connected to every node in its preceding layer and furthermore in FIG. 4, every neuron is also two-way interconnected to every neuron (including the former neuron itself) in the same layer. In many applications, fully-connectedness is unnecessary and some of the interconnects among neurons in the same layer are removed to shape special network topologies before network training. Some of the connections and/or interconnects may also be removed by various pruning techniques during or after network training.

(d). Three kinds of feedbacks, namely free and teacher-forced output feedbacks, neuron interconnections within a layer, and various tapped delay lines, are all used to provide neural networks with memory or dynamic states. Any one of the three kinds is sufficient to construct large classes of filters. However, judicious combinations of two or three kinds may prove beneficial in some applications.

(e). Neural filters may be made out of RNNs without neurons grouped in layers. Every exogenous input node may be connected to every neuron and every outward output node in either or both directions. Every neuron may be connected to every neuron, every exogenous input node and every outward output node in either or both directions. Every outward output node may be connected to every exogenous input node and every neuron in either or both directions.

(f). A class of feedforward neural networks with one hidden layer of neurons is defined and called $\Sigma\Pi$ networks in K. Hornik, M. Stinchcombe, and H. White, "Multilayer Feedforward Networks are Universal Approximators," *Neural Networks*, Vol. 2, pp. 359–366 (1989). These $\Sigma\Pi$ networks can be easily generalized to multilayer $\Sigma\Pi$ networks, which can be easily turned into recurrent multilayer $\Sigma\Pi$ networks by adding output feedbacks and/or interneuron interconnects within each layer.

(g). Any number of different RNNs described so far may be concatenated in series and/or in parallel to form another RNN to construct a neural filter.

(h). There may be one individual RNN with a single outward output node for each component of the output vector. These individual RNNs share only the same exogenous input nodes, but no neurons or connections. This structure is known as one-class-in-one-network structure.

(i). In most of the RNNs considered above, the outward output nodes are simply summers, which can also be viewed as neurons of the kind depicted in FIG. 5 with the activation function 21 being the identity function, i.e. $a(x)=x$. However, they may be neurons of another type or types. For instance, if the range of the target (or desired) values for an outward output node is known, the activation function a for the node should be chosen, in accordance with the teachings of the present invention, to reflect the target range so as to ease the approximation burden of the RNN as well as to produce more plausible approximates. For example, if the range of target values for an outward output node is the interval from $c_1$ to $c_2$, the sigmoid function, $a(x)=(c_2+\delta+(c_1-\delta)e^{-x})/(1+e^{-x})$, for some selected small number $\delta \geq 0$, can be used as the activation function of the outward output node. If the range of target values is the interval from $c_1$ to $\infty$ (or respectively from $-\infty$ to $c_2$), the exponential function, $a(x)=c_1-\delta+e^x$ (or respective $c_2+\delta-e^{-x}$), for some selected small number $\delta \geq 0$, can be used as the activation function.

Preparation for Synthesizing the Training Data into Filters

In accordance with the present invention, the signal and measurement data, which are generated by either computer simulation or actual experiment, are synthesized into a primary filter and, if required, an ancillary filter by training at least one recurrent neural network (RNN) described previously. These signal and measurement data are called training data. If the signal and measurement processes, denoted by x(t) and y(t), are n and m dimensional vector sequence respectively, an RNN for estimating x(t) needs to have n outward output nodes and m exogenous input nodes, which output the estimates of the signal vectors and input the measurement vectors respectively. It is appropriate to note here that after training and implementing an RNN into a primary filter, the outward output nodes of the RNN are directly connected to the output terminals 13 of the primary filter and the exogenous input nodes of the RNN are directly connected to the input terminals 11 of the primary filter, referring to FIG. 3.

After deciding what signal and measurement processes to use, three steps have to be taken before training some RNNs. In reference to FIG. 2, these steps are: selecting an RNN paradigm 6, selecting an estimation error criterion, an ancillary signal process, etc. 7 and generating training data 8, which steps can be taken in any order or in parallel. In the following, these steps will be discussed in the order of selecting an RNN paradigm 6, generating training data 8 and selecting an estimation error criterion, an ancillary signal process, etc. 7.

1. Selecting an RNN paradigm (6 in FIG. 2): An MLPWIN or MLPWOF paradigm is as good as any other, unless there is an application-related reason to indicate otherwise. In fact, two theorems, discovered and proven by the inventor, state that, if a filter is made out of either an MLPWIN with a single hidden layer of enough neurons or an MLPWOF with enough free output feedbacks and a single hidden layer of enough neurons, the filter can generate an estimate $\hat{x}(t)$ of the signal x(t), that approximates the minimum variance (or least-squares) estimate of x(t) to any degree of accuracy over an arbitrary finite time interval. Here the MLPWOF is fully-forwardly-connected as shown in FIG. 6 and MLPWIN is both fully-forwardly-connected and fully-laterally-interconnected (i.e. with neurons in each hidden layer fully interconnected) as shown in FIG. 4. These RNNs will simply be said to be fully-connected. The activation function used in the MLPWIN or MLPWOF is a bounded and nondecreasing function, which is not a constant. The foregoing approximation accuracy is measured by the mean square error, $(1/T)\Sigma_t{}^T{}_{=1} E[ \| E[x(t)|y(\tau), \tau=1, 2, \ldots, t] - \hat{x}(t) \|^2]$, where the conditional expectation $E[x(t)|y(\tau), \tau=1, 2, \ldots, t]$ of the signal x(t) given the measurements $y(\tau), \tau=1, 2, \ldots, t$ is known to be the minimum variance estimate, and $\hat{x}(t)$ is the output vector of the filter and $\| . \|$ denotes the Euclidean norm. The two theorems are proven under the assumption that the signal process x(t) has finite second moments (i.e. $E[ \| x(t) \|^2] < \infty, t=1, 2, \ldots, T$) and the range of the values of the measurement process is bounded (i.e. $\| y(t) \| < B, t=1, 2, \ldots, T$, for some finite positive number B). The assumption poses little restriction on the application of the two theorems to real world problems.

Note that an RNN is a dynamic system whose dynamic state is the activation levels of the neurons (or nodes) that are fedback to the RNN after a unit time delay. The output vector of the RNN is a function of not only the input vector and RNN weights and/or parameters but also the dynamic state. Consequently, the sequence of output vectors depends on not only the sequence of input vectors and RNN weights and/or parameters but also the initial dynamic state. The aforementioned approximation accuracy of the filter, made out of either an MLPWIN or MLPWOF, can not be achieved by setting an arbitrary initial dynamic state for the RNN. The proofs of the foregoing theorems indicate that an initial dynamic state that can be used to achieve the said approximation accuracy is all the initial activation levels of the fedback nodes being equal to a number that every component of the measurement vector y(t) for $t=1, 2, \ldots, T$ has probability zero to equal. Such an initial dynamic state will be called a canonical initial dynamic state. Once a canonical initial dynamic state is chosen, it should be used consistently in both the training of the RNN and the operation of the resulting filter.

An alternative method to determine the initial dynamic state is to optimize it together with the weights and/or parameters of an RNN in the training of the RNN, which will be elaborated on in the sequel. This method usually results in a more parsimonious RNN, namely a smaller RNN for the same approximation accuracy. It is stressed that both methods, using a canonical initial dynamic state and optimizing the initial dynamic state in training an RNN, were discovered from the insight gained from the mathematical proofs of the foregoing two theorems.

The proofs of the two theorems also indicate respectively, a proper way to increase the size of an MLPWIN and a proper way to increase the size of an MLPWOF to achieve a higher degree of approximation accuracy in the process of synthesizing training data into a neural filter. If fully-connected MLPWINs with a bounded, nondecreasing, and nonconstant activation function are the selected paradigm, one can start with training an MLPWIN with one layer of a reasonably small number of neurons and then training MLPWINs with gradually increasing numbers of neurons until the filtering performance of a MLPWIN is satisfactory or stops to improve significantly, whichever comes first. If fully-connected MLPWOFs with a bounded, nondecreasing, and nonconstant activation function are the selected paradigm, one can start with training an MLPWOF with one layer of a reasonably small number of neurons and a reasonably small number of free output feedbacks. The number of neurons and the number of free output feedbacks are then increased gradually and alternately until the filtering performance of the MLPWOF is satisfactory or stops to improve significantly, whichever comes first. Since only the number of neurons needs to be determined for an MLPWIN with a single layer of hidden neurons and both the number of neurons and the number of free output feedbacks need to be determined for an MLPWOF with a single layer of hidden neurons, the former RNN is preferred to the latter RNN for constructing a neural filter, unless there is application-related reasons to indicate otherwise.

Even when an RNN with a plurality of hidden layers is required, an MLPWIN is preferable, because a corresponding MLPWOF with the same MLP structure always has one more number to determine, that is the number of free output feedbacks.

The foregoing approximation accuracy of a fully-connected MLPWIN or MLPWOF with a bounded, nondecreasing and nonconstant activation function as a filter using an initial dynamic state prescribed above can also be achieved by many other RNNs including the MLPWINs and MLPWOFs with more than one layer of neurons, the recurrent multilayer $\Sigma\Pi$ networks, the recurrent radial basis function networks with interconnected neurons (RRBFNWINs) and those with output feedbacks (RRBFNWOFs).

Note that the minimum variance filter can be looked upon at each time t as a function that assigns the minimum variance estimate $\hat{x}(t)$ to each measurement sequence $y(\tau), \tau=1,2, \ldots, t$. If there is good reason to believe that the minimum variance filter, that we try to approximate with an RNN, is a discontinuous or nearly discontinuous function, RNNs with two or more layers of neurons are expected to need less numbers of neurons and connections (including both forward connections and lateral interconnects) than do RNNs with one layer of neurons to achieve the same filtering performance.

2. Generating training data (8 in FIG. 2): In the literature on neural networks, a typical set of training data for training a neural network consists of exemplary pairs of input and output of a function or dynamic system that the neural network is trained to approximate. The outputs in the pairs are called target outputs or desired outputs, because they are the values to be approximated by the actual neural network outputs as closely as practically possible for the given neural network architecture. RNNs that are to serve as filters are supposed to output estimates of the signal process rather than the signal process itself. Hence, if the conventional way of generating training data is followed, the output exemplars (or target outputs) to be included in the training data should be the optimal estimates with respect to an estimation error criterion. However, before a filter in accordance with the present invention is obtained, such optimal estimates are usually extremely difficult, if not impossible, to acquire even if a mathematical model for the signal and measurement processes is available (unless the mathematical model is linear-Gaussian), and are impossible to acquire if not. Recall that this difficulty actually motivated the present invention. Hence one must use some unconventional training data to achieve the approximation accuracy discussed early on, if such unconventional training data exists.

Fortunately, it was discovered and proven by this inventor that if realizations of the signal process are used as the target outputs instead of the estimates of these realizations in the training data, an RNN can be trained to approximate the optimal filter as closely as desired for the given RNN architecture. This allows us to use, as training data, realizations of the measurement process and corresponding realizations of the signal process, which can be relatively easily generated by computer simulation or actual experiment, depending on whether a faithful mathematical/statistical model is available or not. The definition of a realization of the signal process and the definition of the corresponding realization of the measurement process are given previously. To illustrate these definitions in detail, I will show how said realizations are constructed from the mathematical/statistical model, (1) and (2), in the following: First, a pseudo-random number generator is used to generate a sequence of vector values of $\xi(t)$, $t=1, 2, \ldots, T$, and a sequence of vector values of $\epsilon(t)$, $t=1, 2, \ldots, T$ in accordance with their respective probability distributions. These sequences are called realizations of the stochastic processes, $\xi(t)$ and $\epsilon(t)$, and are denoted by $\xi(t,1)$ and $\epsilon(t,1)$, $t=1, 2, \ldots, T$, respectively, where the second argument 1 denotes the first such realizations. Second, a pseudo-random number generator is used to generate a vector value of $x(1)$, in accordance with the probability distribution of $x_1$. This vector value is called a realization of $x(1)$ and is denoted by $x(1,1)$, where the second argument 1 denotes again the first such realization. Third, substituting $x(1,1)$ and $\xi(1,1)$ for $x(t)$ and $\xi(t)$ in (1) yields $x(2,1)$ and substituting $x(1,1)$ and $\epsilon(1,1)$ for $x(t)$ and $\epsilon(t)$ in (2) yields $y(1,1)$, where the second arguments in $x(1,1)$ and $y(1,1)$ both indicate the first such realizations. Continuing the substitutions in this fashion, two sequences of vector values, $x(t,1)$, $t=1, 2, \ldots, T$, are obtained, which are called the first realization of the signal process and the corresponding realization of the measurement process. Fourth, repeating the foregoing three steps, we obtain the second realizations, $x(t,2)$ and $y(t,2)$, $t=1, 2, \ldots, T$. If the first three steps above are repeated certain number of times, we obtain a set of training data, $(y(t,\omega), x(t,x))$, $t=1, 2, \ldots, T$, $\omega \in S$, where $\omega$ is called the sample index and S is a set of positive integers, 1,2, $\ldots$,#S. Here #S denotes the number of elements in S. If a mathematical/statistical model of the signal and measurement processes is unavailable, realizations of these processes are obtained by performing actual experiments with these processes and recording the consecutive values of the signal process and the corresponding consecutive values of the measurement process resulting in each experiment.

In general, a training data set is a group of finite sequences of the (measurement, signal) pairs, which are denoted by $(y(t,\omega), x(t,\omega))$, $t=1, 2, \ldots, T$, parametrized by the sample index $\omega$. The totality of $\omega$ in the training data set is denoted by S. It is assumed that the sequence have the same length and that their length is the same as the length of the time interval over which filtering is performed. These assumptions are made here to simplify our discussion and are not required in training RNNs into filters. When the measurement vectors, $y(t,\omega)$, $t=1,2, \ldots, T$, for a fixed $\omega$ are received, at the exogenous input nodes of an RNN under training, one at a time consecutively for $t=1, 2, \ldots, T$, each of the vectors, $y(t,\omega)$, is processed by the RNN and an output vector appears at its outward output nodes at each time $t=1,2,\ldots,T$. The output vector at time t is the RNN's estimate of $x(t,\omega)$ and is denoted by $\hat{x}(t,\omega,w,v)$, where w denotes the totality of all the weights and/or parameters of the RNN and v denotes its initial dynamic state at $t=0$. Including w and v as stresses that the output vector is a function of w and v as well as a function of $y(\tau,\omega)$, $\tau=1,2, \ldots, t$.

It is appropriate to note here that a training data set should be small to make the step of synthesizing training data into a filter easy, but a more important consideration is that the training data set should be sufficiently large to reflect the probability distribution of the signal and measurement processes.

3. Selecting an estimation error criterion, an ancillary signal process, etc. (7 in FIG. 2): There are many types of estimation error criterion. Each can be used to construct a type of training criterion for training an RNN into a filter. However, only three types of estimation error criterion and their corresponding training criteria will be herein stated. For each type, a set of estimation error statistics will be described and an ancillary signal process will be defined, of which the estimation provides approximate values of the estimation error statistics. In the following, it is assumed that a training data set is available, which consists of realizations, $(y(t,\omega), x(t,\omega))$, $t=1, 2, \ldots, T$, $\omega \in S$, of the measurement and signal processes, $y(t)$ and $x(t)$. This training data set will sometimes be referred to as the primary training data set to avoid confusion with another training data set to be defined.

The most commonly used estimation error criterion is undoubtedly the mean square error $E[\|\hat{x}(t)-x(t)\|^2]$, where $\hat{x}(t)$ is an estimate of a signal process $x(t)$ to be estimated, the estimate being a function of $y(1), y(2), \ldots, y(t)$. When the criterion is minimized, $\hat{x}(t)$ is called the minimum variance (or least-squares) estimate of $x(t)$. Based on this estimation error criterion, the corresponding training criterion, which incorporates the given data set and is also called the mean square error criterion, is $$Q(w,v) = \frac{1}{T(\#S)} \sum_{\omega \in S} \sum_{t=1}^{T} \|x(t,\omega) - \hat{x}(t,\omega,w,v)\|^2, \quad (20)$$

where #S is the number of elements in the sample set S, $\omega$ is the sample index, v is the initial dynamic state of the RNN under training, $x(t,\omega)$ is the target output at t, and $\hat{x}(t,\omega,w,v)$ is the output of the same RNN, whose weights and/or parameters are denoted by w. We stress that $\hat{x}(t,\omega,w,v)$ is the outward output vector at t of the RNN, which started with the initial dynamic state v at $t=0$ and has received, at its exogenous input nodes, the measurement vector sequence $y(\tau,\omega)$, $\tau=1,2,\ldots,t$, one at a time in the given order.

Assume that a signal process x(t) is to be estimated with respect to the mean square error and the conditional error covariance of the estimate given the past and current measurements, y($\tau$), $\tau$=1,2, . . . ,t, is the estimation error statistics required. Assume also that a given training data set has been synthesized into a primary filter with respect to Q(w, v), using one of the training methods to be described later on. Denoting the process that the primary filter outputs by $\hat{x}$(t), we call V(t) :=(x(t)−$\hat{x}$(t))(x(t)−$\hat{x}$(t))$^T$ an ancillary signal process (":=" denotes "is defined to be"). Hence, the required conditional error covariance of the estimate $\hat{x}$(t) is the conditional expectation E[V(t)|y(1),y(2), . . . ,y(t)] of V(t) given the past and current measurements, y(1-),y(2), . . . ,y(t). This conditional expectation is the minimum variance estimate of V(t) minimizing E[ $\|$ V(t)−$\hat{V}$(t) $\|$ $_F^2$], where $\hat{V}$(t) is an estimate of V(t) is an estimate of V(t) and $\|.\|_F$ denotes the sum of squares of all the entries of the enclosed matrix.

Figure 10:
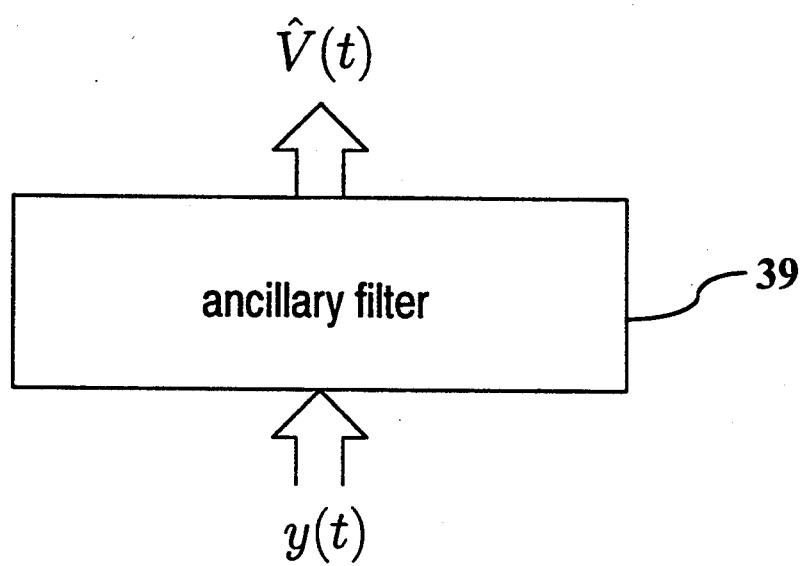
FIG. 10 is a schematic diagram of an ancillary filter.

To obtain a neural filter for estimating the ancillary signal process V(t) with respect to E[ $\|$ V(t)−$\hat{V}$(t) $\|$ $_F^2$], a corresponding training criterion is defined as $$Q_1(w,v) = \frac{1}{T(\#S)} \sum_{\omega \in S} \sum_{t=1}^{T} \| V(t,\omega) - \hat{V}(t,\omega,w,v) \|_F^2, \quad (21)$$

where $\|.\|_F^2$ denotes the sum of squares of all the entries of the enclosed matrix and $\hat{V}$(t,$\omega$,w,v) denotes the output matrix of the neural filter with weights and-/or parameters w and initial dynamic state v. This training criterion is called an ancillary training criterion. Furthermore, a training data set for synthesizing the neural filter is constructed as follows: Use the primary filter to generate $\hat{x}$(t,$\omega$), t=1, 2, . . . , T, for each measurement sequence y(t,$\omega$), t=1, 2, . . . , T in the primary training data set. Compute the corresponding realization V(t,$\omega$) :=(x(t,$\omega$)−$\hat{x}$(t,$\omega$))(x(t,$\omega$)−$\hat{x}$(t,$\omega$))$^T$, t=1, 2, . . . , T of the ancillary signal process V(t) for each $\omega \in$ S. Then the training data set consists of (y(t,$\omega$), V(t,$\omega$)), t=1, 2, . . . , T and $\omega \in$ S, where y(t,$\omega$) and V(t,$\omega$) are the input sequence and the corresponding target (or desired) output sequence respectively. This training data set is called an ancillary training data set. A neural filter resulting from synthesizing such an ancillary training data set is called an ancillary filter and must have m exogenous input nodes to receive the measurements y(t) and n$^2$ outward output nodes to send out an estimate $\hat{V}$(t) of the ancillary signal process V(t). Recall that m and n are the dimensions of y(t) and x(t) respectively. $\hat{V}$(t) is the desired estimation error statistics. A schematic diagram of this ancillary filter 39 is given in FIG. 10. It will be appreciated that we can use only part of the entries of V(t) (e.g. the diagonal entries) as the ancillary signal process.

Figure 8:
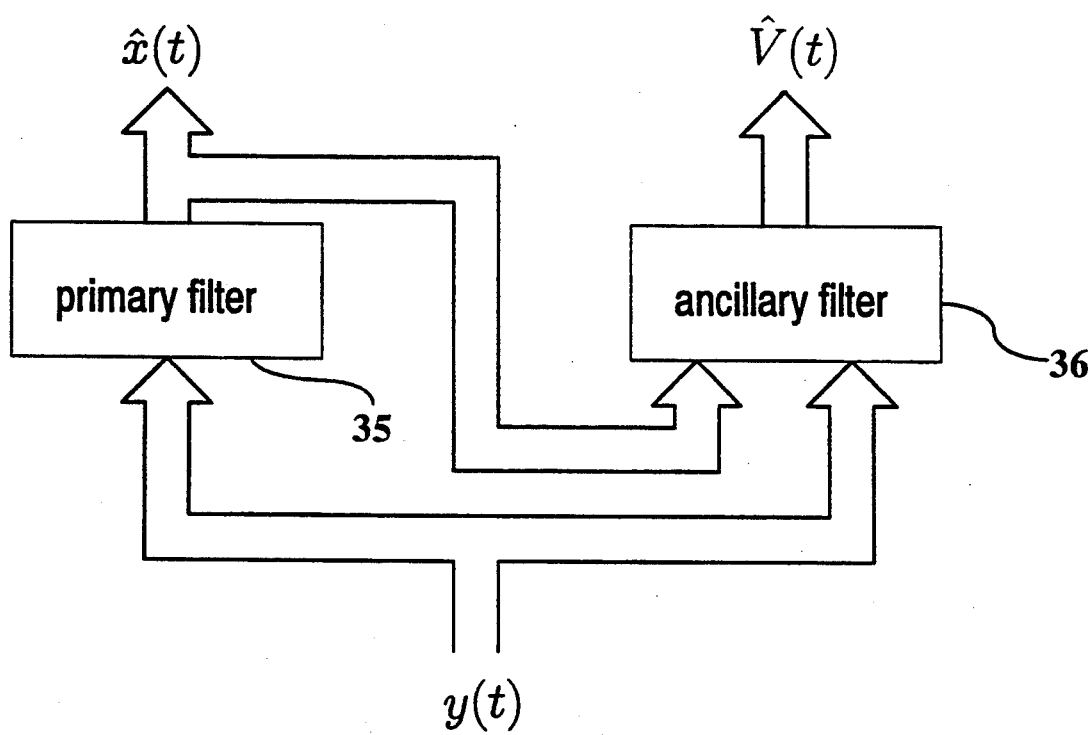
FIG. 8 shows one way that a primary filter and an ancillary filter are connected. It will be appreciated that the two filters may share the same input nodes for the measurement vector y(t).

An alternative ancillary training data set can be used. It consists of the realizations, V(t,$\omega$), t=1, 2, . . . , T, $\omega \in$ S as the target output sequences and the corresponding sequences (y(t,$\omega$), $\hat{x}$(t,$\omega$)), t=1, 2, . . . , T, $\omega \in$ S as the input sequences. If this alternative ancillary training data set is used, the ancillary filter should have m+n exogenous input nodes, where m and n are the dimensions of y(t) and $\hat{x}$(t) respectively. In operation, these trained primary 35 and ancillary 36 filters are connected as shown in FIG. 8. The output $\hat{x}$(t) of the primary filter at time t is fed into the ancillary filter at the same time without a unit time delay. The ancillary filter processes its inputs $\hat{x}$(t) and y(t) and produces $\hat{V}$(t) as the filter's output at time t.

A problem with the mean square error criterion is that the signal outliers in the training data set tend to have undesirably large impact on the training results. An alternative training criterion is based on the well known mean absolute deviation $\Sigma_{i=1}^n$E[|$\hat{x}_i$(t)−$x_i$(t)|], where $\hat{x}_i$(t) is an estimate of the ith component $x_i$(t) of a signal process x(t). The alternative training criterion, also called mean absolute deviation criterion, is written $$D(w,v) = \frac{1}{T(\#S)} \sum_{\omega \in S} \sum_{t=1}^{T} \sum_{i=1}^{n} |x_i(t,\omega) - \hat{x}_i(t,\omega,w,v)|, \quad (22)$$

where |.| denotes the absolute value and the other symbols are defined as for Q(w, v) above.

Assume that a signal process x(t) is to be estimated with respect to the mean absolute deviation criterion and the conditional mean absolute deviation of the estimate given the past and current measurements, y($\tau$), $\tau$=1,2, . . . , t, is the estimation error statistics required. Assume also that a given training data set gas been synthesized into a primary filter with respect to D(w, v), using one of the training methods to be described later on. Denoting the process that the primary filter outputs by $\hat{x}$(t), we call V(t) :=(|$x_1$(t)−$\hat{x}_1$(t)|, |$x_2$(t)−$\hat{x}_2$(t)|, . . . , |$x_n$(t)−$\hat{x}_n$(t)|) an ancillary signal process (":=" denotes "is defined to be"). The required conditional mean absolute deviation of the estimate $\hat{x}$(t) is the minimizer of E[$\Sigma_{i=1}^n$|$V_i$(t)−$\hat{V}_i$(t)|] over all the functions $\hat{V}_i$(t) of the past and current measurements, y(1), y(2), . . . , y(t). In other words, the required conditional mean absolute deviation is the optimal estimate of the ancillary signal process V(t) with respect to the estimation error criterion E[$\Sigma_{i=1}^n$|$V_i$(t)−$\hat{V}_i$(t)|].

To obtain a neural filter for estimating the ancillary signal process V(t) with respect to E[$\Sigma_{i=1}^n$|V(t)−$\hat{V}$(t)|], a corresponding training criterion is defined as $$D_1(w,v) = \frac{1}{T(\#S)} \sum_{\omega \in S} \sum_{t=1}^{T} \sum_{i=1}^{n} |\hat{V}_i(t,\omega) - V_i(t,\omega,w,v)|, \quad (23)$$

where $\hat{V}$(t,$\omega$,w,v) denotes the output vector of the neural filter with weights and/or parameters w and initial dynamic state v. This training criterion is called an ancillary training criterion. Furthermore, a training data set for synthesizing the neural filter is constructed as follows: Use the primary filter to generate $\hat{x}$(t,$\omega$), t=1,2, . . . , T, for each measurement sequence y(t,$\omega$), t=1,2, . . . , T in the primary training data set. Compute the corresponding realization V(t,$\omega$):=(|$x_1$(t,$\omega$)−$\hat{x}_1$(t,$\omega$)|, |$x_2$(t,$\omega$)−$\hat{x}_2$(t,$\omega$)|, . . . , |$x_n$(t,$\omega$)−$\hat{x}_n$(t,$\omega$)|), t=1, 2, . . . , T of the ancillary signal process V(t) for each $\omega \in$ S. Then the training data set consists of (y(t,$\omega$), V(t,$\omega$)), t=1, 2, . . . , T and $\omega \in$ S, where y(t,$\omega$) and V(t,$\omega$) are the input sequence and the corresponding target (or desired) output sequence respectively. This training data set is called an ancillary training data set. A neural filter resulting from synthesizing such an ancillary training data set is called an ancillary filter and must have m exogenous input nodes to receive the measurements y(t) and n outward output nodes to send out an estimate $\hat{V}$(t) of the ancillary signal process V(t). Recall that m and n are the dimensions of y(t) and x(t) respectively. $\hat{V}$(t) is the desired estimation error statistics. A schematic diagram of this ancillary filter 39 is given in FIG. 10. It will be appreciated that we can use only part of the entries of V(t) as the ancillary signal process.

An alternative ancillary training data set can be used. It consists of the realizations, V(t,ω), t=1, 2, . . . , T, ω ∈ S as the target output sequences and the corresponding sequences (y(t, ω), x̂(t,ω)), t=1, 2, . . . , T, ω ∈ S as the input sequences. If this alternative ancillary training data set is used, the ancillary RNN should have m+n exogenous input nodes, where m and n are the dimensions of y(t) and x̂(t) respectively. In operation, these trained primary 35 and ancillary 36 filters are connected as shown in FIG. 8. The output x̂(t) of the primary filter at time t is fed into the ancillary filter at the same time without a unit time delay. The ancillary filter processes its inputs x̂(t) and y(t) and produces V̂(t) as the filter's output at time t.

It is appropriate to note here that the two theorems stated early on and the ensuing discussion on them are valid if the mean square error and the minimum variance estimate (i.e. conditional mean) in the theorem statements and discussion are replaced by the mean absolute deviation and the minimum mean absolute deviation estimate (i.e. the conditional median) respectively. This extension of the two theorems can be proven under the assumption that the signal process x(t) has a finite $L_1$ norm (i.e. $E[\Sigma_{i=1}^n |x_i(t)|] < \infty$, t=1, 2, . . ., T) and the range of the values of the measurement process is bounded (i.e. $\Sigma_{i=1}^m |y_i(t)| < B$, t=1, 2, . . . , T, for some positive number B).

An interesting estimation error criterion that combines the mean square error and the mean absolute deviation is the mean Huber's error $\Sigma_{i=1}^n E[\rho(x_i(t) - \hat{x}_i(t))]$, where $\rho(u) = u^2$, if $|u| \leq M$ and $\rho(u) = 2M|u| - M^2$, if $|u| > M$ for the scalar variable u and some prechosen positive number M. Based on the mean Huber's error, a robust training criterion is written $$H(w,v) = \frac{1}{T(\#S)} \sum_{\omega \in S} \sum_{t=1}^{T} \sum_{i=1}^{n} E[\rho(x_i(t,\omega) - \hat{x}_i(t,\omega,w,v))], \quad (24)$$

where symbols other than ρ are defined as for Q(w, v). H(w, v) will also be called mean Huber's error criterion. The training criterion H(w, v) is twice differentiable except where $\rho = M^2$. Many of the optimization methods involving differentiation can be applied for it.

Assume that a signal process x(t) is to be estimated with respect to the mean Huber's error criterion and the conditional mean Huber's error of the estimate given the past and current measurements, y(τ), τ=1, 2, . . . , t, is the estimation error statistics required. Assume also that a given training data set has been synthesized into a primary filter with respect to H(w, v), using one of the training methods to be described later on. Denoting the process that the primary filter outputs by x̂(t), we call V(t):=(ρ(x₁(t) − x̂₁(t)), ρ(x₂(t) − x̂₂(t)), . . . , ρ(x_n(t) − x̂_n(t))) an ancillary signal process (":=" denotes "is defined to be"). The required conditional mean Huber's error of the estimate x̂(t) is the minimizer of $\Sigma_{i=1}^n E[\rho(\hat{V}_i(t))]$ over all the functions $\hat{V}_i(t)$ of the past and current measurements, y(1), y(2), . . . , y(t). In other words, the required conditional mean Huber's error is the optimal estimate of the ancillary signal process V(t) with respect to the estimation error criterion $\Sigma_{i=1}^n E[\rho(V_i(t) - \hat{V}_i(t))]$.

To obtain a neural filter for estimating the ancillary signal process V(t) with respect to $\Sigma_{i=1}^n E[\rho(V(t) - \hat{V}(t))]$, a corresponding training criterion is defined as $$H_1(w,v) = \frac{1}{T(\#S)} \sum_{\omega \in S} \sum_{t=1}^{T} \sum_{i=1}^{n} \rho(V_i(t,\omega) - \hat{V}_i(t,\omega,w,v)), \quad (25)$$

where $\hat{V}(t, \omega, w, v)$ denotes the output vector of the neural filter with weights and/or parameters w and initial dynamic state v. This training criterion is called an ancillary training criterion. Furthermore, a training data set for synthesizing the neural filter is constructed as follows: Use the primary filter to generate x̂(t, ω), t=1, 2, . . . , T, for each measurement sequence y(t, ω), t=1, 2, . . . , T in the primary training data set. Compute the corresponding realization V(t, ω):=(ρ(x₁(t, ω) − x̂₁(t, ω)), ρ(x₂(t, ω) − x̂₂(t, ω)), . . . , ρ(x_n(t, ω) − x̂_n(t, ω))), t=1, 2, . . . , T of the ancillary signal process V(t) for each ω ∈ S. Then the training data set consists of (y(t, ω), V(t, ω)), t=1, 2, . . . , T and ω ∈ S, where y(t, ω) and V(t, ω) are the input sequence and the corresponding target (or desired) output sequence respectively. This training data set is called an ancillary training data set. A neural filter resulting from synthesizing such an ancillary training data set is called an ancillary filter and must have m exogenous input nodes to receive the measurements y(t) and n outward output nodes to send out an estimate V̂(t) of the ancillary signal process V(t). Recall that m and n are the dimensions of y(t) and x(t) respectively. V̂(t) is the desired estimation error statistics. A schematic diagram of this ancillary filter 39 is given in FIG. 10. It will be appreciated that we can use only part of the entries of V(t) as the ancillary signal process.

An alternative ancillary training data set can be used. It consists of the realizations, V(t, ω), t=1, 2, . . . , T, ω ∈ S as the target output sequences and the corresponding sequences (y(t, ω), x̂(t, ω)), t=1, 2, . . . , T, ω ∈ S as the input sequences. If this alternative ancillary training data set is used, the ancillary RNN should have m+n exogenous input nodes, where m and n are the dimensions of y(t) and x̂(t) respectively. In operation, these trained primary 35 and ancillary 36 filters are connected as shown in FIG. 8. The output x(t) of the primary filter at time t is fed into the ancillary filter at the same time without a unit time delay. The ancillary filter processes its inputs x(t) and y(t) and produces V(t) as the filter's output at time t.

It is appropriate to note here that the two theorems stated early on and the ensuing discussion on them are valid if the mean square error and the minimum variance estimate in the theorem statements and discussion are replaced by the mean Huber's error and minimum mean Huber's error estimate respectively. This extension of the two theorems can be proven under the assumption that the signal process x(t) satisfies $E[\Sigma_{i=1}^n \rho(x_i(t))] < \infty$, t=1, 2, . . . , T, and the ranges of the values of the measurement process is bounded (i.e. $\Sigma_{i=1}^m \rho(y_i(t)) < B$, t=1, 2, . . . , T, for some finite number B). It will be appreciated that the primary and ancillary training criteria in one application do not have to be the same type.

There are many other types of estimation error criterion used in statistics and information theory. Each can be used to construct a type of training criterion. It will be appreciated that the primary and ancillary training criteria in one application do not have to be of the same type.

Synthesizing Training Data into a Primary and, if Required, an Ancillary Filter Synthesizing training data into a primary (or respectively an ancillary) filter consists of training and testing each of a collection of RNNs of a selected RNN paradigm until the filtering performance of an RNN with respect to the selected estimation error criterion (or respectively the selected ancillary estimation error criterion) is satisfactory or can not be significantly improved by increasing the size of the RNN, whichever comes first, and then selecting a trained RNN as the primary (or respective ancillary) filter in consideration of network size versus filtering accuracy to optimize the cost effectiveness.

Figure 11:
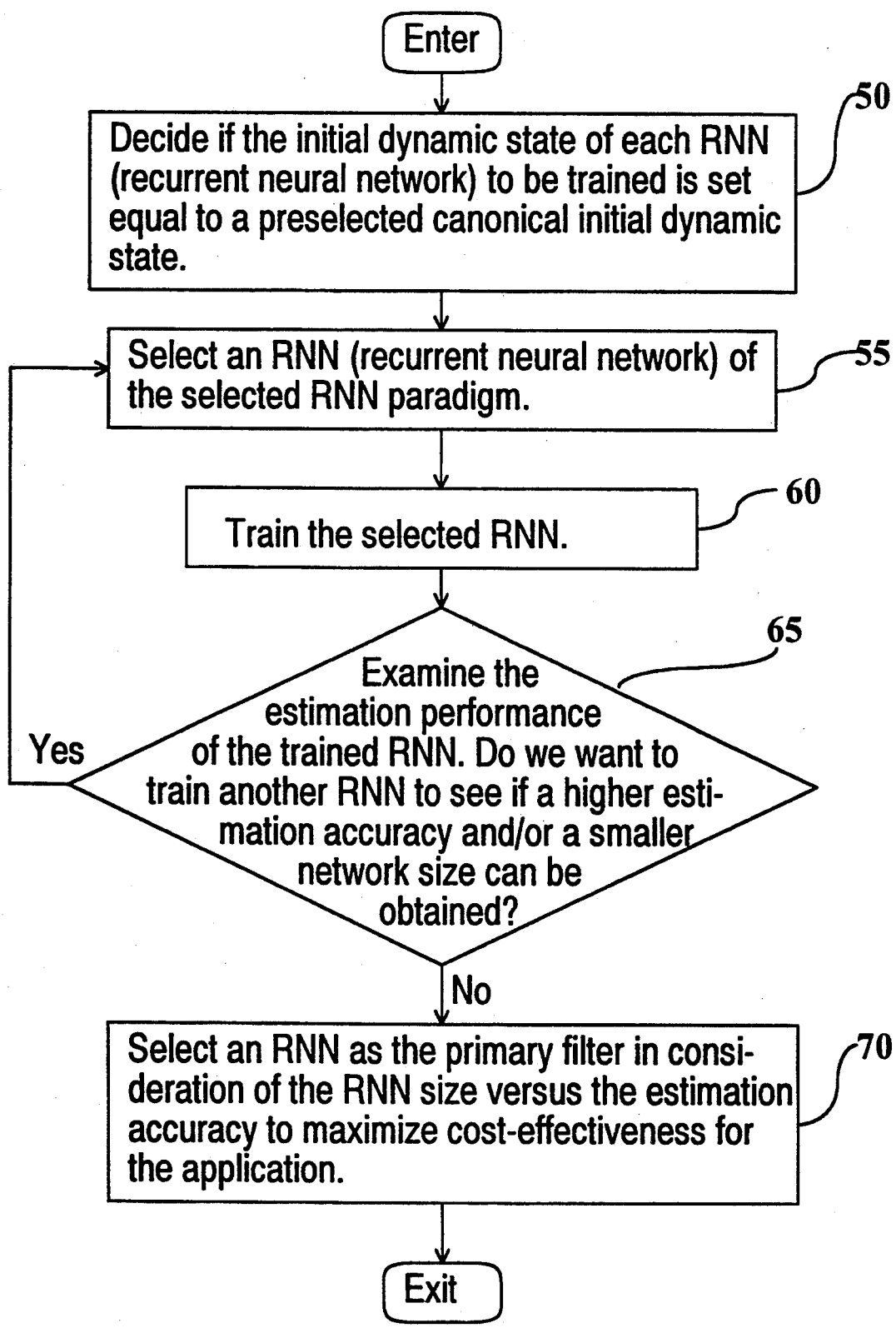
FIG. 11 is a block diagram showing the iterative procedures taken in synthesizing training data into a primary filter.

The iterative procedures taken in synthesizing training data into a primary filter are shown in FIG. 11. We first decide 50 if the initial dynamic state of each RNN to be trained is set equal to a preselected canonical initial dynamic state. We then select 55 an RNN of the selected RNN paradigm. The selected RNN is then trained 60 by one of the methods or procedures to be discussed in more detail. We then examine the estimation performance of this trained RNN and decide 65 if we want to train another RNN to see whether a higher estimation accuracy and/or a smaller network size can be obtained. If we do want to train another RNN, we repeat the procedures 55, 60 and 65. Otherwise, a trained RNN is selected 70 as the primary filter in consideration of the RNN size versus the estimation accuracy to maximize cost-effectiveness for the application at hand.

Figure 12:
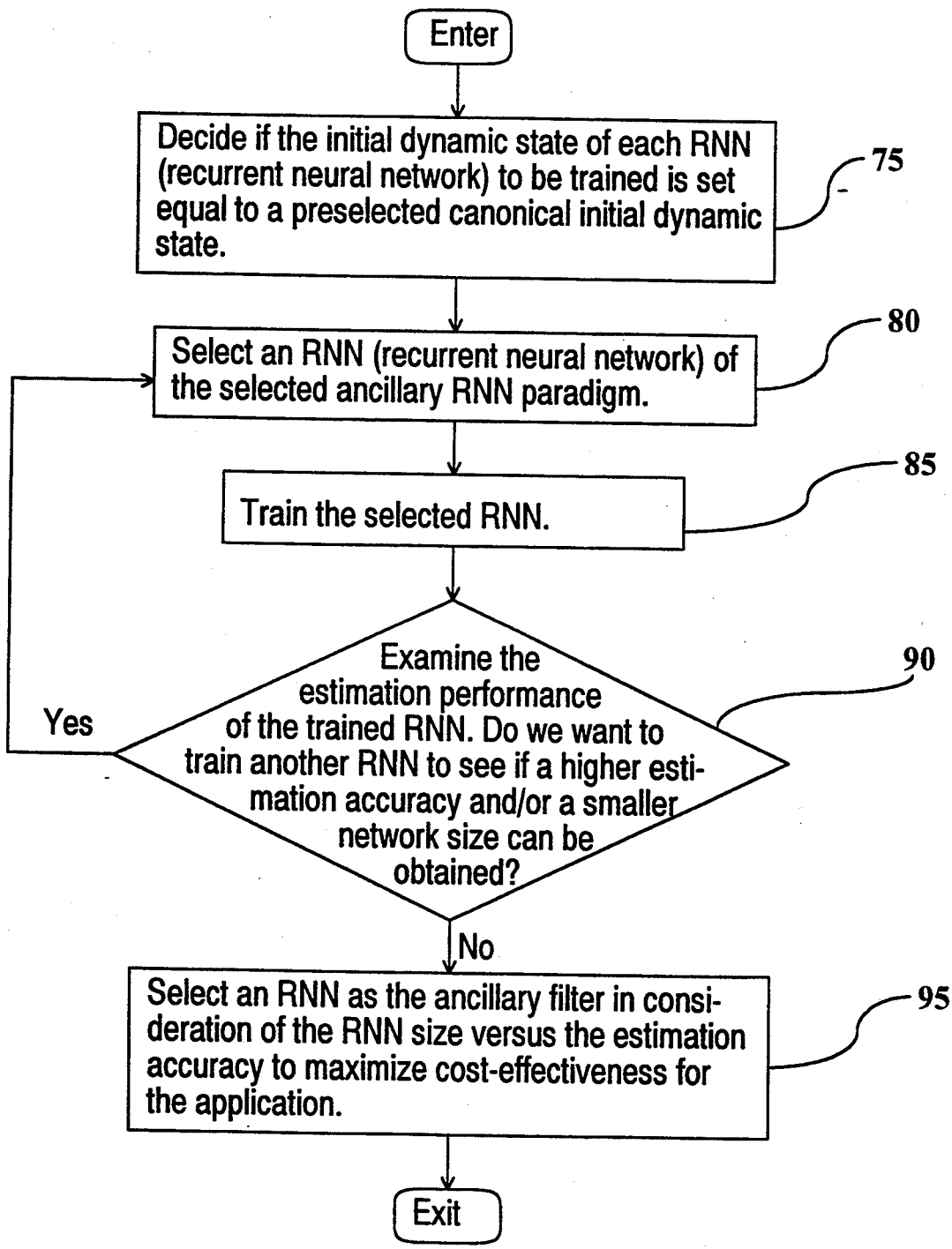
FIG. 12 is a block diagram showing the iterative procedures taken in synthesizing ancillary training data into an ancillary filter.

The iterative procedures taken in synthesizing ancillary training data into an ancillary filter are shown in FIG. 12. They are similar to those shown in FIG. 11. We first decide 75 if the initial dynamic state of each RNN to be trained is set equal to a preselected canonical initial dynamic state. We then select 80 and train 85 an RNN of the selected ancillary RNN paradigm. Examining the estimation performance of this trained RNN, we decide 90 if another RNN is to be trained to see whether a higher estimation accuracy and/or a smaller network size can be obtained. Accordingly, we either repeat procedures 80, 85 and 90, or select 95 a trained RNN as the ancillary filter in consideration of the RNN size versus the estimation accuracy to maximize cost-effectiveness for the application at hand.

Once a training criterion is selected and training data collected, the training criterion is a well defined function of the weights (i.e. weights and/or parameters) w and the initial dynamic state v of the RNN under training. The selected training criterion will now be denoted by $C(w, v)$. If v is set equal to a canonical initial dynamic state, training the RNN into a filter is a problem of minimizing $C(w, v)$ by the variation of w. If v is also to be optimized, training the RNN is a problem of minimizing $C(w, v)$ by the variation of w and v.

Either of these two training problems is simply one of the unconstrained optimization problems that are studied in a very large field of numerical and theoretical research by the name of optimization theory. There are basically two types of method for unconstrained optimization. One type, including the annealing methods and the clustering methods, needs only evaluations of the optimization criterion and the other type needs also evaluations of its derivatives. These methods of both types and their pros and cons can be found in a large number of books and articles and will not be further discussed here. It is only stressed that any optimization method can be selected to train the selected RNN for filtering in accordance with the teachings of the present invention, provided that the selected training criterion together with the RNN satisfies the required conditions for the selected optimization method.

Nevertheless, due to the enormous number of weights (and the initial dynamic state components, if they are to be optimized as well) for even a small RNN and the usually enormous amount of training data, training an RNN into a filter involves a very large amount of computation. For instance, the MLPWIN in FIG. 4 has 33 weights and 5 initial dynamic state components, and the MLPWOF in FIG. 5 has 45 weights and 2 initial dynamic state components. Notwithstanding so many variables to be optimized, these RNNs are actually much smaller than most of the RNNs required to do real-world filtering.

Generally speaking, the type of optimization method that needs evaluations of the derivatives of the training criterion $c(w, v)$ is more efficient and converges faster than other type. Due to the rich network structures of RNNs, many ideas for evaluating the derivatives of $C(w, v)$ have been proposed. Perhaps the most widely used ideas are backpropagation through time (BPTT) and real-time recurrent learning (RTRL). BPTT and RTRL each provides an effective way to differentiate the training criterion $C(w, v)$ with respect to the weights w of the RNN. The derivatives of $C(w, v)$ with respect to the initial dynamic state v can be obtained in a similar manner. The derivatives with respect to w and v can then be used in any one of the conventional optimization methods that need derivatives, such as the gradient descent methods, the conjugate gradient methods and the quasi-Newton methods. A good introduction to BPTT and RTRL ideas with adequate references can be found on pages 182–186 of J. Hertz, A. Krogh and R. G. Palmer, *Introduction to the Theory of Neural Computation*, Addison Wesley (1991).

Nevertheless, the BPTT and the RTRL formulas for computing the derivatives are not available in the literature and not easy to derive for the MLPWINs and MLPWOFs, which are the RNNs preferred by the present inventor for constructing neural filters. Therefore, these formulas will be provided in the following in the form of algorithms. First, let us establish more notations.

An MLPWIN or an MLPWOF considered here is fully-connected and has $L+1$ layers of nodes including layer 0 containing the exogenous input nodes and layer L containing the outward output nodes. The set of the numberings of the exogenous input nodes in layer 0 is denoted by I and the set of the numberings of the outward output nodes in layer L is denoted by O. For the MLPWOF, the set of the numberings of the feedback input nodes is denoted by $F_I$ and the set of the numberings of the feedback output nodes is denoted by $F_O$. It is assumed without loss of generality that $F_I = F_O$ and if a feedback input node and a feedback output node are connected for feedback, these two nodes have the same numbering in their respective layers. Hence $F_I$ and $F_O$ are denoted by F.

Each node in the MLPWIN or MLPWOF, including nodes in layer 0 and layer L, has an individual activation function. The activation function of node i in layer l is denoted by $a_i^l(\eta)$. There can be any number of different activation functions in the MLPWIN or MLPWOF, each being shared by any number of nodes. The derivative of $a_i^l(\eta)$ with respect to $\eta$ is denoted by $(a_i^l)'(\eta)$.

The target (or desired) output sequence in a training set, that is indexed by $\omega \in S$, is denoted by $\alpha(t, \omega)$, $t=1, 2, \ldots, T$. The sequence $\alpha(t, \omega)$ is equal to $x(t, \omega)$ or $V(t, \omega)$, depending on whether the network (MLPWIN or MLPWOF) is trained to be a primary filter or an ancillary filter. The components of $\alpha(t, \omega)$ are assigned the same numberings as in O so that $\alpha_i(t, \omega)$ is the target value of node i in layer L for each $i \in O$. The corresponding activation level of node i in layer L is $\beta_i^L(t, \omega)$ in consistency with the usage of the symbol $\beta_i^L(t)$. If the activation functions $a_i^L(\eta)$, $i \in O$ are the identity function $a_i^L(\eta)=\eta$, $i \in O$, the activation level $\beta_i^L(t, \omega)$ is equal to $\eta_i^L(t, \omega)$ is equal to $\eta_i^L(t, \omega)$, for each $i \in O$, as is the case in FIG. 4 and FIG. 6.

The input sequence in a training data set, that is indexed by $\omega \in S$, is denoted $\beta_i^0(t, \omega)$ in consistency with the usage of the symbol $\beta_i^0(t)$. The sequence $\beta_i^0(t, \omega)$ is equal to $y_i(t, \omega)$, for each $i \in I$, for training the network (MLPWIN or MLPWOF) as a primary filter, or as an ancillary filter if the output of the primary filter is not input to the ancillary filter. However, if the output of the primary filter is input to the ancillary filter, the components of the input sequence $(y(t, \omega), \hat{x}(t, \omega))$ in the training data set are each assigned a numbering from I and the sequence $\beta_i^0(t, \omega)$ is set equal to the component of $(y(t, \omega), \hat{x}(t, \omega))$ with the same numbering i.

Using these notations, the mean square error criterion $Q(w, v)$ is now written as $$Q(w,v) = \frac{1}{T(\#S)} \sum_{\omega \in S} \sum_{t=1}^{T} \sum_{i \in O} (\alpha_i(t,\omega) - \beta_i^L(t,\omega))^2, \quad (26)$$

where $\Sigma_{i \in O}$ denotes the summation over all i in O. Notice that $\beta_i^L(t, \omega)$ is a function of the weights and/or parameters w and the initial dynamic state v. An activation level in v is denoted by $v_i^l$, if the activation level is that of node i in layer l. In the following, the formulas for computing $dQ_\omega/dv_i^l$, $dQ_\omega/dw_{ij}^l$ and $dQ_\omega/dw_{ij}^{rl}$ are given, where $Q_\omega := (1/(T(\#S)))\Sigma_{t=1}^T \Sigma_{i \in O}(\alpha_i(t, \omega) - \beta_i^L(t, \omega))^2$. Recall that ":=" denotes "is defined to be." The desired derivatives $dQ(w, v)/dv_i^l$, $dQ(w, v)/dw_{ij}^l$ and $dQ(w, v)/dw_{ij}^{rl}$ are then obtained easily by the equations, $dQ(w, v)/dv_i^l = \Sigma_{\omega \in S} dQ_\omega/dv_i^l$, $dQ(w, v)/dw_{ij}^l = \Sigma_{\omega \in S} dQ_\omega/dw_{ij}^l$ and $dQ(w, v)/dw_{ij}^{rl} = \Sigma_{\omega \in S} dQ_\omega/dw_{ij}^{rl}$, respectively.

To simplify the summation symbols, the symbol $\Sigma_i$ (or $\Sigma_j$) denotes the summation over all the numberings of the nodes in the layer that node i (or j) appears. For instance, $\Sigma_j w_{ij}^l \beta_j^{l-1} := \Sigma_{j=0}^{n_{l-1}} w_{ij}^l \beta_j^{l-1}$ and $\Sigma_j w_{ji}^{l+1}(dQ_\omega/d\eta_j^{l+1}(t)) := \Sigma_{j=1}^{n_{l+1}} w_{ji}^{l+1}(dQ_\omega d\eta_j^{l+1}(t))$. Furthermore, $\Sigma_t := \Sigma_{t=1}^T$, and $\delta_{ij}$ is the Kronecker delta, i.e. $\delta_{ij} := 1$, if $i=j$ and $\delta_{ij} = 0$, if $i \neq j$.

a. BPTT algorithm for an MLPWIN:
begin
1. For $l = 1, 2, \ldots, L$, do
   For $i = 1, 2, \ldots, n_l$, do
   $$\frac{dQ_\omega}{d\eta_i^l(T+1)} = 0$$
   end;
end;
2. For $t = T, T-1, \ldots, 1$, do
   For $i = 1, 2, \ldots, n_L$, do
   $$\frac{dQ_\omega}{d\eta_i^L(t)} = \frac{\partial Q_\omega}{\partial \beta_i^L(t)} ((a_i^L)'(\eta_i^L(t)))$$

-continued end;
For $l = L-1, L-2, \ldots, 1$, do
   For $i = 1, 2, \ldots, n_l$, do
   $$\frac{dQ_\omega}{d\eta_i^l(t)} = \left( \sum_j w_{ji}^{l+1} \frac{dQ_\omega}{d\eta_j^{l+1}(t)} + \sum_j w_{ji}^{rl} \frac{dQ_\omega}{d\eta_j^l(t+1)} \right) ((a_i^l)'(\eta_i^l(t)))$$
   end;
end;
end;
3. For $l = 1, 2, \ldots, L$, do
   For $i = 1, 2, \ldots, n_l$, do
   For $j = 0, 1, \ldots, n_{l-1}$, do
   $$\frac{dQ_\omega}{dw_{ij}^l} = \sum_t \frac{dQ_\omega}{d\eta_i^l(t)} \beta_j^{l-1}(t);$$
   If $l \neq L$, then $\frac{dQ_\omega}{dw_{ij}^{rl}} = \sum_t \frac{dQ_\omega}{d\eta_i^l(t)} \beta_j^l(t-1)$
   end;
end;
end;
4. For $l = 1, 2, \ldots, L-1$, do
   For $i = 1, 2, \ldots, n_l$, do
   $$\frac{dQ_\omega}{dv_i^l} = \sum_j w_{ji}^{rl} \frac{dQ_\omega}{d\eta_j^l(1)}$$
   end;
end;
end.

b. BPTT algorithm for an MLPWOF:
begin
1. For $i = 1, 2, \ldots, n_L$, do
   If $i \in O$, then $\frac{dQ_\omega}{d\eta_i^L(T)} = \frac{\partial Q_\omega}{\partial \beta_i^L(T)} ((a_i^L)'(\eta_i^L(T))),$
   else $\frac{dQ_\omega}{d\eta_i^L(T)} = 0;$
end;
2. For $t = T, T-1, \ldots, 1$, do
   For $l = L-1, L-2, \ldots, 1$, do
   For $i = 1, 2, \ldots, n_l$, do
   $$\frac{dQ_\omega}{d\eta_i^l(t)} = \sum_j w_{ji}^{l+1} \frac{dQ_\omega}{d\eta_j^{l+1}(t)} ((a_i^l)'(\eta_i^l(t)))$$
   end;
end;
If $t \neq 1$, then for each $i \in F$, do
   $$\frac{dQ_\omega}{d\eta_i^L(t-1)} = \left( \sum_j w_{ji}^1 \frac{dQ_\omega}{d\eta_j^1(t)} + \frac{\partial Q_\omega}{\partial \beta_i^L(t-1)} \right) ((a_i^L)'(\eta_i^L(t-1)))$$
end;
end;
3. For $l = 1, 2, \ldots, L$, do
   For $i = 1, 2, \ldots, n_l$, do
   For $j = 0, 1, \ldots, n_{l-1}$, do
   $$\frac{dQ_\omega}{dw_{ij}^l} = \sum_t \frac{dQ_\omega}{d\eta_i^l(t)} \beta_j^{l-1}(t)$$
   end;
end;
end;
4. For each $i \in F$, do
   $$\frac{dQ_\omega}{dv_i^L} = \sum_j w_{ji}^1 \frac{dQ_\omega}{d\eta_j^1(1)}$$
end;
end.

c. RTRL algorithm for an MLPWIN:
begin

1. For $k = 1, 2, \ldots, L - 1$, do
   For $l = 1, 2, \ldots, L - 1$, do
   For $i = 1, 2, \ldots, n_l$, do
   For $p = 1, 2, \ldots, n_k$, do
   $$\frac{d\beta_i^l(0)}{dv_p^k} = \delta_{lk}\delta_{ip};$$
   For $q = 0, 1, \ldots, n_{k-1}$, do
   $$\frac{d\beta_i^l(0)}{dw_{pq}^k} = 0$$
   end;
   end;
   end;
   end;
2. For $t = 1, 2, \ldots, T$, do
   For $k = 1, 2, \ldots, L - 1$, do
   For $l = k, k + 1, \ldots, L$, do
   For $i = 1, 2, \ldots, n_l$, do
   For $p = 1, 2, \ldots, n_k$, do
   $$\frac{d\beta_i^l(t)}{dv_p^k} = \left((1 - \delta_{kl})\sum_j w_{ij}^l \frac{d\beta_j^{l-1}(t)}{dv_p^k} + (1 - \delta_{lL})\sum_j w_{ij}^{rl} \frac{d\beta_j^l(t-1)}{dv_p^k}\right)(a_i^l)'(\eta_i^l(t));$$
   For $q = 0, 1, \ldots, n_{k-1}$, do
   $$\frac{d\beta_i^l(t)}{dw_{pq}^k} = ((1 - \delta_{kl})\sum_j w_{ij}^l \frac{d\beta_j^{l-1}(t)}{dw_{pq}^k} + (1 - \delta_{lL})\sum_j w_{ij}^{rl} \frac{d\beta_j^l(t-1)}{dw_{pq}^k} + \delta_{ip}\delta_{kl}\beta_q^{l-1}(t))(a_i^l)'(\eta_i^l(t));$$
   end;
   For $q = 1, 2, \ldots, n_k$, do
   $$\frac{d\beta_i^l(t)}{dw_{pq}^{rk}} = ((1 - \delta_{kl})\sum_j w_{ij}^l \frac{d\beta_j^{l-1}(t)}{dw_{pq}^{rk}} + (1 - \delta_{lL})\sum_j w_{ij}^{rl} \frac{d\beta_j^l(t-1)}{dw_{pq}^{rk}} + \delta_{ip}\delta_{kl}\beta_q^l(t-1))(a_i^l)'(\eta_i^l(t))$$
   end;
   end;
   end;
   end;
   end;
3. for $l = 1, 2, \ldots, L - 1$, do
   For $p = 1, 2, \ldots, n_l$, do
   $$\frac{dQ_\omega}{dv_p^l} = \sum_t \sum_{i \in O} \frac{\partial Q_\omega}{\partial \beta_i^L(t)} \frac{d\beta_i^L(t)}{dv_p^l};$$
   For $q = 0, 1, \ldots, n_{l-1}$, do
   $$\frac{dQ_\omega}{dw_{pq}^l} = \sum_t \sum_{i \in O} \frac{\partial Q_\omega}{\partial \beta_i^L(t)} \frac{d\beta_i^L(t)}{dw_{pq}^l};$$
   end;
   For $q = 1, 2, \ldots, n_l$, do
   $$\frac{dQ_\omega}{dw_{pq}^{rl}} = \sum_t \sum_{i \in O} \frac{\partial Q_\omega}{\partial \beta_i^L(t)} \frac{d\beta_i^L(t)}{dw_{pq}^{rl}}$$
   end;
   end;
4. For $p = 1, 2, \ldots, n_L$, do
   For $q = 0, 1, \ldots, n_{L-1}$, do
   $$\frac{dQ_\omega}{dw_{pq}^L} = \sum_t \frac{\partial Q_\omega}{\partial \beta_p^L(t)} \beta_q^{L-1}(t)(a_p^L)'(\eta_p^L(t));$$
   end;
   end.

d. RTRL algorithm for an MLPWOF:
begin
1. For $t = 1, 2, \ldots, T$, do
   For each $i \in I$, do For each $p \in F$, do
$$\frac{d\beta_i^0(t)}{dv_p^L} = 0$$
end;
For $l = 1, 2, \ldots, L$, do
For $p = 1, 2, \ldots, n_l$, do
For $q = 0, 1, \ldots, n_{l-1}$, do
$$\frac{d\beta_i^0(t)}{dw_{pq}^l} = 0$$
end;
end;
end;
end;
2. For each $k \in F$, do
For each $p \in F$, do
$$\frac{d\beta_k^0(1)}{dv_p^L} = \delta_{kp}$$
end;
For $l = 1, 2, \ldots, L$, do
For $p = 1, 2, \ldots, n_l$, do
For $q = 0, 1, \ldots, n_{l-1}$, do
$$\frac{d\beta_k^0(1)}{dw_{pq}^l} = 0$$
end;
end;
end;
end;
3. For $t = 1, 2, \ldots T$, do
For $k = 1, 2, \ldots, L$, do
For $p = 1, 2, \ldots, n_k$, do
For $q = 0, 1, \ldots, n_{k-1}$, do
For $l = 1, 2, \ldots, L$, do
For $i = 1, 2, \ldots, n_l$, do
$$\frac{d\beta_i^l(t)}{dw_{pq}^k} = \left(\sum_j w_{ij}^l \frac{d\beta_j^{l-1}(t)}{dw_{pq}^k} + \delta_{ip}\delta_{kl}\beta_q^{k-1}(t)\right)(a_i^l)'(\eta_i^l(t))$$
end;
end;
For each $i \in F$, do
$$\frac{d\beta_i^0(t+1)}{dw_{pq}^k} = \frac{d\beta_i^L(t)}{dw_{pq}^k}$$
end;
end;
end;
end;
For each $p \in F$, do
For $l = 1, 2, \ldots, L$, do
For $i = 1, 2, \ldots, n_l$, do
$$\frac{d\beta_i^l(t)}{dv_p^L} = \sum_j w_{ij}^l \frac{d\beta_j^{l-1}(t)}{dv_p^L} (a_i^l)'(\eta_i^l(t))$$
end;
end;
For each $i \in F$, do
$$\frac{d\beta_i^0(t+1)}{dv_p^L} = \frac{d\beta_i^L(t)}{dv_p^L}$$
end;
end;
end;
4. For $l = 1, 2, \ldots, L$, do
For $p = 1, 2, \ldots, n_l$, do
For $q = 0, 1, \ldots, n_{l-1}$, do
$$\frac{dQ_\omega}{dw_{pq}^l} = \sum_t \sum_{i \in O} \frac{\partial Q_\omega}{\partial \beta_i^L(t)} \frac{d\beta_i^L(t)}{dw_{pq}^l};$$
end;
end;
end;
5. For each $p \in F$, do -continued
$$\frac{dQ_\omega}{dv_p^L} = \sum_t \sum_{i \in O} \frac{\partial Q_\omega}{\partial \beta_i^L(t)} \frac{d\beta_i^L(t)}{dv_p^L};$$
end;
end.

The derivatives $dH(w, v)/dw_{ij}^l$, $dH(w, v)/dw_{ij}^{rl}$, $dH(w, v)/dw_i^l$ of the mean Huber's error criterion $H(w, v) = (1/(T(\#S)))\Sigma_{\omega \in S}\Sigma_{t=1}^T\Sigma_{i=1}^n E[\rho(x_i(t,\omega) - \hat{x}_i(t,\omega, w, v))]$ can be computed using the foregoing formulas with $Q_\omega$ replaced by $H_\omega := (1/T(\#S)))\Sigma_{t=1}^T\Sigma_{i=1}^n E[\rho(x_i(t, \omega) - \hat{x}_i(t, \omega, w, v))]$. The derivatives of the mean square error criterion $Q_1(w, v)$ and the mean Huber's error criterion $H_1(w, v)$ for synthesizing training data into an ancillary filter can also be computed using the foregoing formulas with $Q_\omega$ replaced $Q_{1\omega} := (1/(T(\#S)))\Sigma_{t=1}^T \|V(t, \omega) - \hat{V}(t, \omega, w, v)\|_F^2$ and $H_{1\omega} := (1/(T(\#S)))\Sigma_{t=1}^T\Sigma_{i=1}^n \tau(V_i(t, \omega) - \hat{V}_i(t, \omega, w, v))$, respectively. In fact, the derivatives of any training criterion $C(w, v)$, that is expressible as $C(w, v) = \Sigma_{\omega \in S} C_\omega$, where $C_\omega$ is a function of the output vectors of the MLPWIN or MLPWOF under training and is differentiable with respect to w and v, can be computed using the foregoing formulas with $Q_\omega$ replaced by $C_\omega$.

The derivatives of $C(w, v)$ for an MLPWIN or an MLPWOF, that is not fully-connected, can be computed using the foregoing algorithms with a slight modification: If a connection or interconnect is missing in the RNN, its weight and all the derivatives with respect to the weight are set equal to zero and the steps of evaluating all these derivatives are skipped.

The derivatives $dC(w, v)/dw_{ij}^l$, $dC(w, v)/dw_{ij}^{rl}$ and $dC(w, v)/dv_i^l$ for an MLPWIN (or $dC(w, v)/dw_{ij}^l$ and $dC(w, v)/dv_i^l$ for an MLPWOF) computed in the foregoing algorithm constituted the gradient of $C(w, v)$ with respect to (w, v) for MLPWIN (or respectively MLPWOF). Given the gradient, to be denoted by $\nabla C(w, v)$, the gradient descent methods, the conjugate gradient methods and the quasi-Newton methods can be applied. There is a large variety of gradient descent methods, but a basic gradient descent method is an iterative method and improves the value of (w, v) in each iteration by $$(w,v)^{new} = (w,v)^{old} - \lambda \nabla C(w,v), \quad (27)$$

where $\lambda$ is a positive constant called the step size. The application of this basic gradient descent method to training RNNs is mentioned on pages 174 and 185 of J. Hertz, A. Krogh and R. G. Palmer, *Introduction to the Theory of Neural Computation*, Addison Wesley (1991). The conjugate gradient methods and the quasi-Newton methods are well-known methods for optimization. A good introduction to them can be found in D. G. Luenberger, *Linear and Nonlinear Programming*, second edition, Addison-Wesley (1973). Some ready to run routines that implement some powerful variants of these methods can be found in W. H. Press, S. A. Teukolsky, W. T. Vetterling and B. P. Flannery, *Numerical Recipes in C*, second edition, Cambridge University Press (1992). In the book, the routine for the conjugate gradient method is called frprmn (p.423) and the routine for the quasi-Newton method is called dfpmin (p.428). A floppy diskett containing the routines is provided in the book.

For evaluating the derivatives of $C(w, v)$, BPTT involves much less computation, but much more memory space than RTRL. For minimizing $C(w, v)$ given its derivatives, quasi-Newton and conjugate gradient methods require about the same amount of computation in each iteration, but the former converges faster than the latter. Quasi-Newton methods also need much more memory space than do conjugate gradient methods. Hence, if plenty of memory space is available in a computer, a combination of BPTT and a quasi-Newton method is preferred on the computer. However, if the memory space is limited in a computer for synthesizing given training data into a filter, a combination of RTRL and a conjugate gradient method is preferred on the computer. Different combinations are possible for different degrees of availability of the memory space in a computer.

Two somewhat different methods of training RNNs use extended Kalman filter (EKF) and are proposed in G. V. Puskorius and L. A. Feldkamp, "Recurrent Network Training with the Decoupled Extended Kalman Filter Algorithm," *Science of Artificial Neural Networks*, edited by D. W. Ruck, Proceedings SPIE 1710, pp. 461–473 (1992), and in R. J. Williams, "Training Recurrent Networks Using the Extended Kalman Filter," *Proceedings of the 1992 International Joint Conference on Neural Networks*, Baltimore, Md., pp. IV 241–246 (1992), which are incorporated herein by reference. These EKF methods also require evaluation of the derivatives of $C(w, v)$.

Most of the foregoing optimization algorithms are iterative in nature. The weights of the RNN are randomly selected at the beginning of the algorithm. If the initial dynamic state (i.e. the activation levels of the neurons and/or output nodes that are fed back to the RNN after a unit delay) is to be optimized as well, it is either randomly selected or set equal to a canonical initial dynamic state at the beginning of the optimization process. The weights and/or parameters and initial dynamic state are then adjusted iteratively until the value of the training criterion ceases to improve by more than a preset small number, say $10^{-12}$.

It is known that every one of the training criteria discussed early on contains many undesired local minima, where a local search optimization method can get trapped. Therefore, if a local search method is used, it should be applied a number of times starting at different (randonly or systematically chosen) initial values for the optimization variables (i.e. the weights and sometimes, initial dynamic state of the RNN). Alternatively, a global search method such as an annealing method or a clustering method can be used for training.

Figure 13:
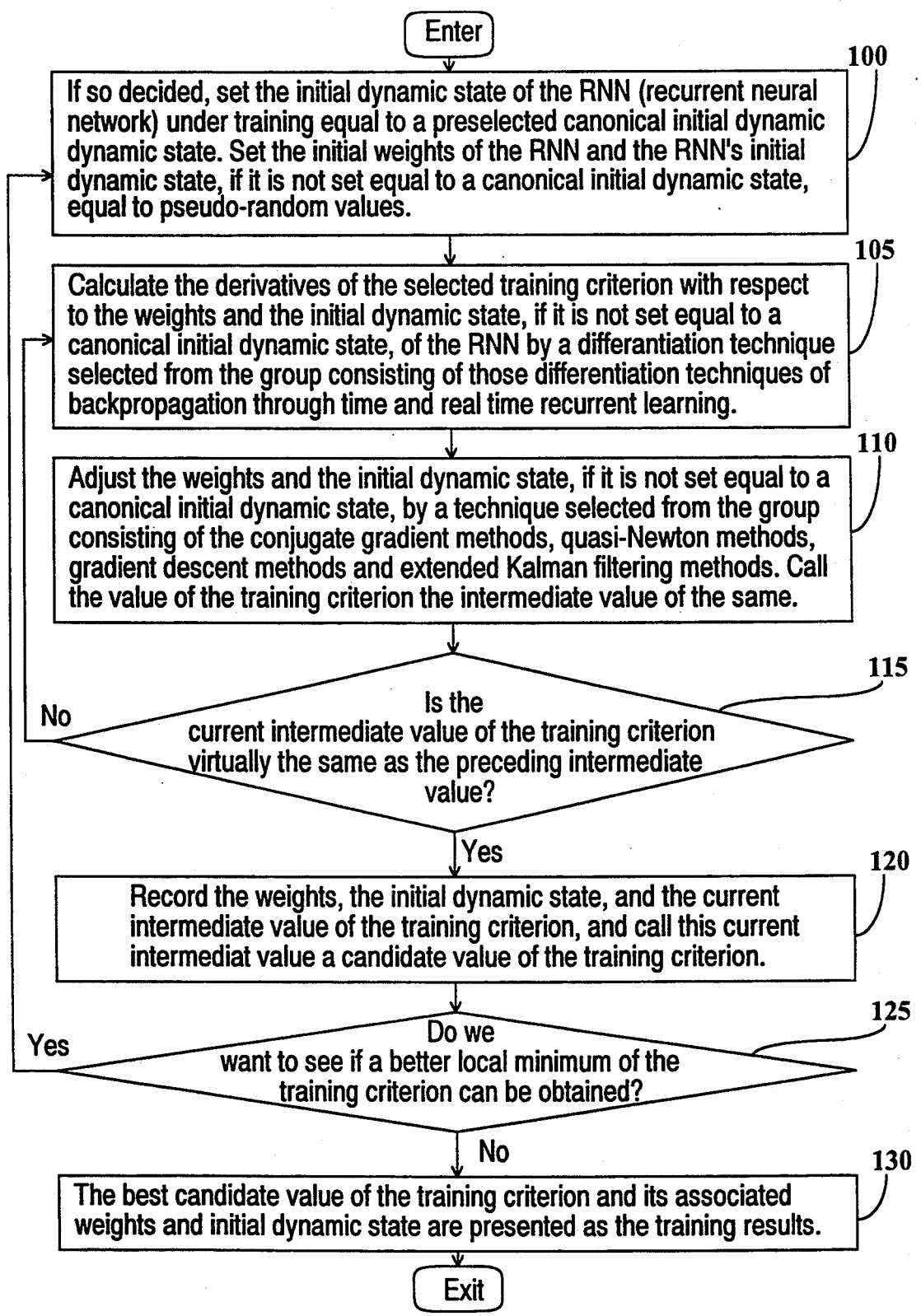
FIG. 13 is a block diagram showing the iterative procedures taken in training a recurrent neural network by a gradient descent, conjugate gradient or quasi-Newton method.
Figure 14:
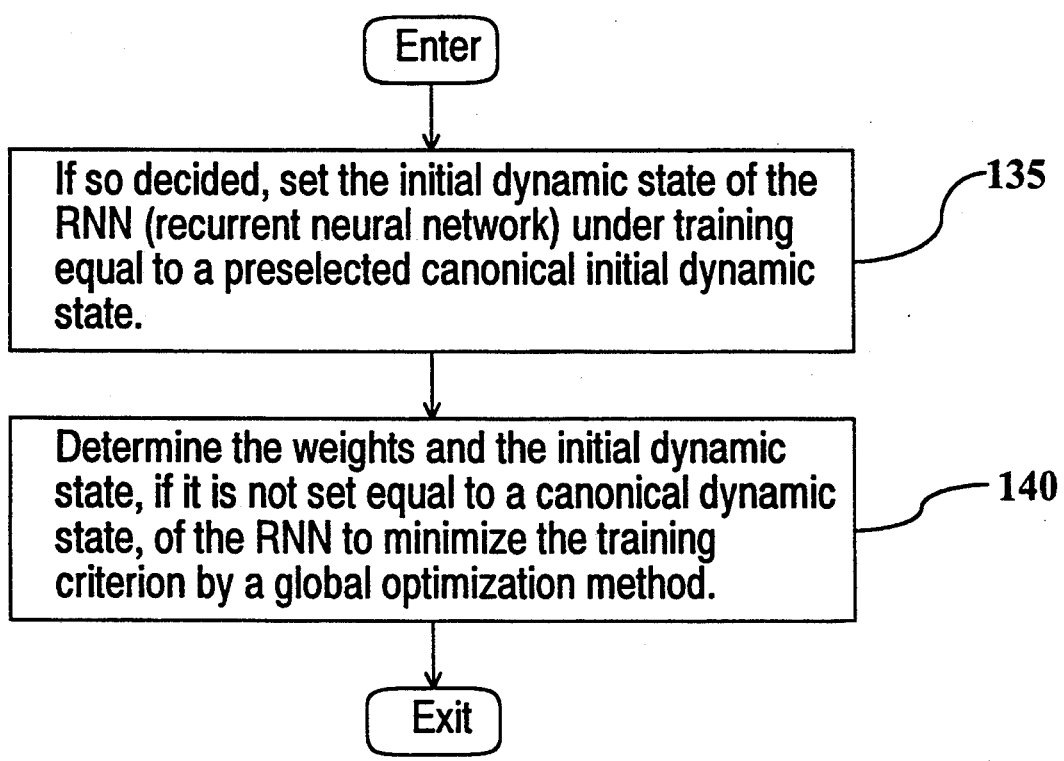
FIG. 14 is a block diagram showing the procedures taken in training a recurrent neural network by a global optimization method.

The training methods that have been discussed so far will now be summarized and illustrated by block diagrams in FIG. 13 and FIG. 14. Let us first look at FIG. 13, which is a block diagram showing the iterative procedures taken in training an RNN that uses a differentiation technique and a local search optimization technique. First, we set, in block 100, the initial dynamic state v of the RNN under training equal to a preselected canonical initial dynamic state, if the initial dynamic state v is decided to be so determined. We then in the same block 100 set the initial weights w and the initial dynamic state v, if v is not set equal to a canonical initial dynamic state, equal to pseudo-random values. We recall that the weights w include both the weights on the connections and the parameters in the neurons, if there are any such parameters, of the RNN. The derivatives $\nabla C(w, v)$ of the selected training criterion $C(w, v)$ with respect to the weights w and the initial dynamic state v, if v is not set equal to a preselected canonical initial state, are then calculated, in block 105, by a differentiation technique selected from the group consisting of BPTT and RTRL. The weights w and the initial dynamic state v, if v is not set equal to a canonical initial dynamic state, are then adjusted, in block 110, by a technique selected from the group consisting of the conjugate gradient, quasi-Newton, gradient descent and extended Kalman filtering methods. Call the resulting value of the training criterion the intermediate value of the same. If it is determined in block 115 that the current intermediate value of the training criterion is not virtually the same as the preceding intermediate value, we repeat blocks 105, 110 and 115. Otherwise, we record, in block 120, the weights, the initial dynamic state, and the current intermediate value of the training criterion, and call this current intermediate value a candidate value of the training criterion. If it is decided in block 125 that we want to see if a better local minimum of the training criterion can be obtained, we go to block 100. Otherwise, we present, in block 130, the best candidate value of the training criterion and its associated initial dynamic state, that have been obtained, as the training results.

FIG. 14 is a block diagram showing the procedures taken in training an RNN by a global optimization method such as an annealing method or a clustering method. In block 135, we set the initial dynamic state v of the RNN under training equal to a preselected canonical initial dynamic state, if it is decided that v be so set. Then we determine, in block 140, the weights w and the initial dynamic state v, if it is not set equal to a canonical initial dynamic state, of the RNN to minimize the training criterion by a global optimization method.

As indicated previously, a training data set should be sufficiently large to reflect the probability distribution of the signal and measurement processes. As such, the training data set is usually extremely large, making the minimization of the training criterion, which incorporates the training data set, extremely difficult, because the extremely large computer memory and time are required in executing an optimization algorithm on a computer. A training method, which was discovered and has been used successfully by the present inventor, is described under the assumption that both the weights (i.e. weights and/or parameters) w and the initial dynamic state v are to be determined by the optimization of C(w, v) as follows: First, the training data set is divided at random into a finite number of subsets, which are usually more or less the same size and are numbered, say i=1,..., M. Second, we form the training criterion $C_i(w, v)$ for each of these training data subsets as if it were the only training data available. Third, we select an iterative optimization algorithm. Fourth, execute the following algorithm:

(a). Select the initial value $(w^{(0)}, v^{(0)})$ of (w, v) at random, set $\tau$ equal to a selected positive integer, and set i=1;

(b). Execute $\tau$ iterations of the iterative optimization algorithm to minimize $C_{i \bmod M}(w, v)$, where i mod M is defined to be i-kM for such an integer k that $1 \leq i-kM \leq M$, record the resulting value $(w^{(i)}, v^{(i)})$ of (w, v), and set i=i+1;

(c). If the sequence $(w^{(i)}, v^{(i)})$ obtained so far has not converged satisfactorily, then go to (b). Otherwise, stop and report the result $(w, v) = (w^{(i)}, v^{(i)})$.

The sizes (or size) of the training data subsets should be selected such that the memory and speed of the computer used for training are utilized efficiently in applying the optimization algorithm to $C_{i \bmod M}(w, v)$. The positive integer $\tau$ should be selected small enough so that executing step (b) above a single time does not "wipe out" too much of the effects on the value of (w, v) by the previous executions of the same step, step (b). The selection of the sizes of the training data subsets and the selection of the positive integer $\tau$ may have to be done by trial-and-error a few times for the particular application and computer involved. Fortunately, this training method is not very sensitive to the selections.

This training method of dividing the training data into subsets and alternatively training an RNN on each of these subsets is called the divide-and-conquer training method. It will be appreciated that the divide-and-conquer training method has many possible variants. The essential idea of the method is indicated by the phrase "divide-and-conquer." Namely, if the training data set is or is expected to be too large for the computer to handle efficiently or effectively, subsets of the training data can be alternately handled to achieve the over-all goal of training. A useful variant of the method is the following: We may want to repeat the procedure consisting of collecting a subset of training data and executing a selected number of iterations of the optimization algorithm on the training criterion formed with the subset of training data. The repetitions continue until the convergence of the resulting sequence of values of (w, v) is reached. Notice here that each training data subset is collected (by simulation or experiment), used for training and discarded. If the number of iterations in applying the optimization algorithm is small enough for training and discarded. If the number of iterations in applying the optimization algorithm is small enough for each training data subset, the collection of all such training data subsets that will have been used in training up an RNN will usually be very large and reflect the probability distribution of the signal and measurement processes very sufficiently. Nevertheless, the cost of data collection is proportionally high.

As shown in FIG. 11, whatever training method is used, it is used to train a collection of RNNs of various architectures from the selected RNN paradigm, each of which having a filtering performance as close as desired to the optimal performance with respect to the selected estimation error criterion, that is achievable for its given architecture. The last step in synthesizing training data into a primary (or respectively ancillary) filter is to select a trained RNN as the primary (or respectively ancillary) filter in consideration of the network size versus the filtering accuracy to optimize the cost-effectiveness.

Training and synthesizing can be performed on a general-purpose digital computer (e.g. IBM personal computers, SUN workstations and Connection Machines), a coprocessor accelerator board (e.g. Balboa 860 of HNC, Inc., 5501 Oberlin Dr., San Diego, Calif. 92121-1718), or a programmable neurocomputer (e.g. CNAPS server of Adaptive Solutions, Inc., 1400 N. W. Compton Drive, Suite 340, Beaverton, Oreg. 97006). Upon the completion of synthesizing training data on one of these computing devices, the resulting neural filter has already been programmed into the device, thereby completing implementation of the neural filter at the same time.

Figure 15:
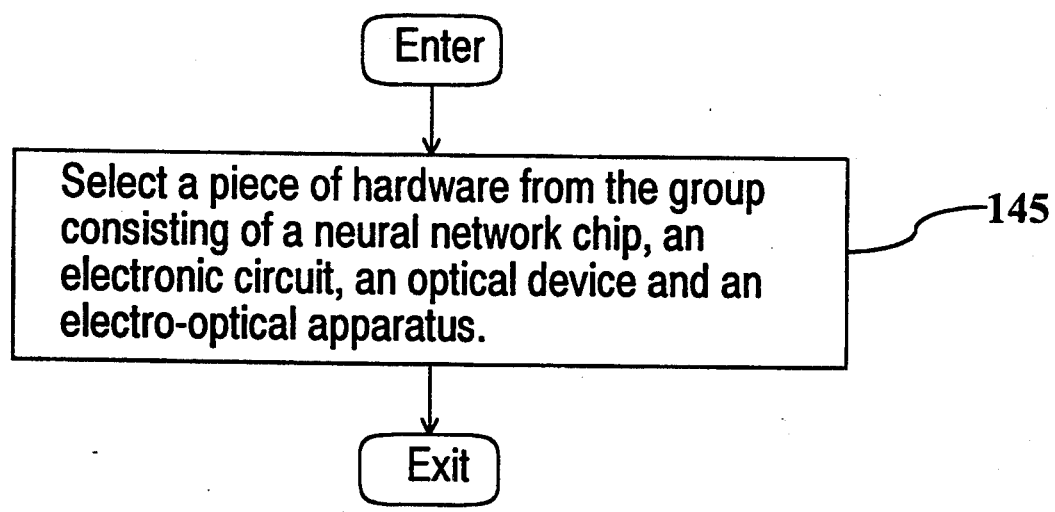
FIG. 15 is a block diagram showing the selection of a piece of hardware for synthesizing and/or implementing a primary filter.
Figure 16:
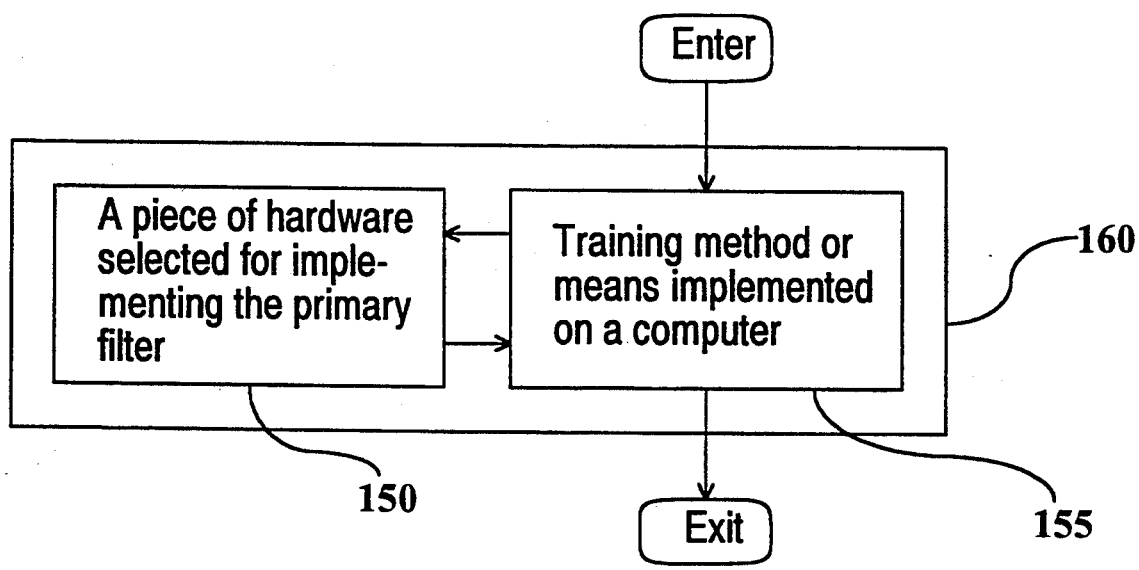
FIG. 16 is a block diagram showing the inclusion of a piece of hardware in the process of training a recurrent neural network.

If a neural filter that results from synthesizing training data is to be implemented on a piece of hardware, the piece of hardware is selected, as shown by block 145 in FIG. 15, from the group consisting of a neural network chip, electronic circuit, optical device, and electro-optical apparatus. Sometimes, it is necessary to include, as shown in FIG. 16, the piece of hardware 150 in the process 160 of training RNNs, so as to overcome the anomalies and/or imperfections of the hardware. For example, there is considerable cell-to-cell variation across the analog multiplying synapse array in Intel's 80170NX Electrically Trainable Artificial Neural Network (ETANN) chip. One of the critical elements in the successful deployment of the 80170NX chip has been the development of the proper model and training software to closely couple the non-ideal chip behavior to the training algorithm—a process termed "chip-in-the-loop" optimization (H. A. Castro, S. M. Tam and M. Holler, "Implementation and Performance of an Analog Non-Volatile Neural Network," in 80170NX *Neural Network Technology & Applications*, Publication #241359, Intel Corporation (1992)).

Figure 17:
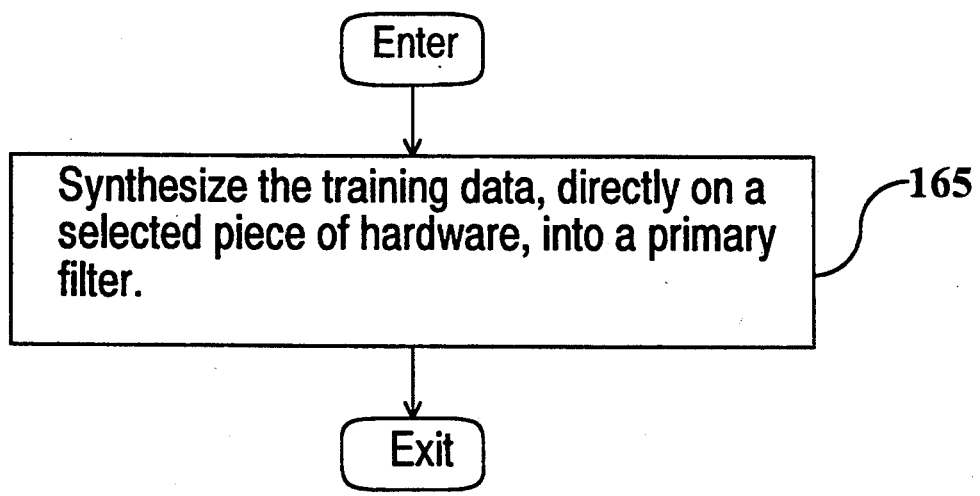
FIG. 17 is a block diagram showing the synthesis of the training data, directly on a selected piece of hardware, into a primary filter.

Training and synthesizing can also be performed directly on some general-purpose or special-purpose neural network chips, electronic circuits, optical devices, or electro-optical apparatuses, thereby completing implementation at the same time. This is shown by block 165 in FIG. 17.

Augmenting Inputs to Neural Filters for Treating Time-Variant Processes

A process as defined herein can be classified as a time-variant process or a time-invariant process. A time-invariant process is a process whose behavior or evolution given the same initial value is invariant under a shift of time. For instance, if the functions, f(x, t) and G(x, t), that appear in the model, (1), are functions of their first argument x only and do not depend on their second argument t, and if the covariance $E[\xi(t)\xi^T(t)]$ of the Gaussian noise process $\xi(t)$, in the same model is a constant matrix, then the signal process described by the model is a time-invariant signal process. In addition, if the function, h(x, t), that appears in (2) is also a function of its first argument x only and does not depend on its second argument t, and if the covariance $E[\epsilon(t)\epsilon^T(t)]$ of the Gaussian noise process $\epsilon(t)$ is a constant matrix, then the measurement process described by (2) is a time-invariant measurement process.

If both the signal and measurement processes are time-invariant, they are called time-invariant signal and measurement processes. Otherwise, they are called time-variant signal and measurement processes.

Up to this point, the time-variant signal and measurement processes and the time-invariant signal and measurement processes have been simultaneously treated with no distinction being made between them. All the statements that have been made so far are valid for both the time-variant and time-invariant cases. However, if the signal and measurement processes are time-variant, large numbers of connections and neurons are usually required of a neural filter for "memorizing" the time-variant property, especially when the length of the time interval, over which filtering is performed, is long. A modified method and apparatus will now be described that greatly reduces the numbers of connections and neurons in a neural filter for time-variant signal and measurement processes.

The idea is to input all or some of the known time-variant property as described by a vector-valued time function to the neural filter. In other words, the exogenous input nodes of a neural filter are augmented to receive a vector-valued time function, representing the time-variant property, in addition to the measurement process. Such a neural filter is called a neural filter with augmented exogenous input nodes. The following examples are given to illustrate the idea:

EXAMPLE 1

Consider the scalar signal and scalar measurement processes described by the equations, $$x(t+1)=f(t)x(t)+g(t)\xi(t), x(1)=x_1, \quad (28)$$

$$y(t)=h(t)x^3(t)+\epsilon(t), \quad (29)$$

where f(t), g(t) and h(t) are known scalar-valued functions of time; the variances of the zero-mean Gaussian noise processes, $\xi(t)$ and $\epsilon(t)$, are $E[\xi^2(t)]=q(t)$ and $E[\epsilon^2(t)]=r(t)$, which are also known functions of time; $x_1$ is a zero-mean Gaussian random variable with variance 1; and $x_1$, and $\xi(t)$ and $\epsilon(t)$ are statistically independent. The functions of time, f(t), g(t), h(t), q(t), and r(t), describe the time-variant property of the time-variant signal and measurement processes. According to the foregoing idea, the primary (neural) filter for processing y(t) to estimate x(t) should have six exogenous input nodes to receive the vector (y(t), f(t), g(t), h(t), q(t), r(t)) as its input vector at time t. If an ancillary filter is required, it should also have six exogenous input nodes to receive the same vector at time t in addition to possibly one extra exogenous input node for receiving the output x(t) from the primary filter.

EXAMPLE 2

Consider the n-dimensional signal and m-dimensional measurement processes described by the equations, $$x(t-1)=f(x(t),u(t))+G(x(t),u(t),\xi(t),x(1)=x_1 \quad (30)$$

$$y(t)=h(x(t),u(t))+\epsilon(t), \quad (31)$$

where u(t) is a p-dimensional function of time; $x_1$ is a Gaussian random vector with mean zero and covariance $E[x_1 x_1^T]=p_1$; $\xi(t)$ and $\epsilon(t)$ are respectively $n_1$-dimensional and $m_1$-dimensional Gaussian noise processes with zero means and covariance $E[\xi(t)\xi^T(t)]=Q$ and $E[\epsilon(t)\epsilon^T(t)]=R$; $x_1$, $\xi(t)$ and $\epsilon(t)$ are statistically independent; the functions f(x, u), F(x, u), and h(x, u) are known functions with such appropriate dimensions and properties that the above equations describe the signal and measurement processes faithfully. In fact, the above equations describe a rather general control system with x(t), y(t) and u(t) as the state, observation and control resectively. The control function u(t) is assumed to be a known function of time and describes the time-variant property of the above signal and measurement processes. According to the foregoing ides, the primary (neural) filter for processing y(t) to estimate x(t) should have m+p exogenous input nodes to receive y(t) and u(t) as their input vector at time t. If an ancillary filter is required, it should also have m+p exogenous input nodes to receive the same vector at time t in addition to possibly n extra exogenous input nodes for receiving the output x(t) from the primary filter.

In a case where no mathematical/statistical model of the signal and measurement processes exists, but some vector-valued function of time describing or affecting the time-variant property of the signal and measurement processes is available, the foregoing idea is still applicable and the primary filter and the ancillary filter (if required) should have extra exogenous input nodes for receiving said function of time. Recall that a scalar is herein regarded as a one-dimensional vector. Hence a scalar-valued function of time is a one-dimensional vector-valued function of time.

Figure 9:
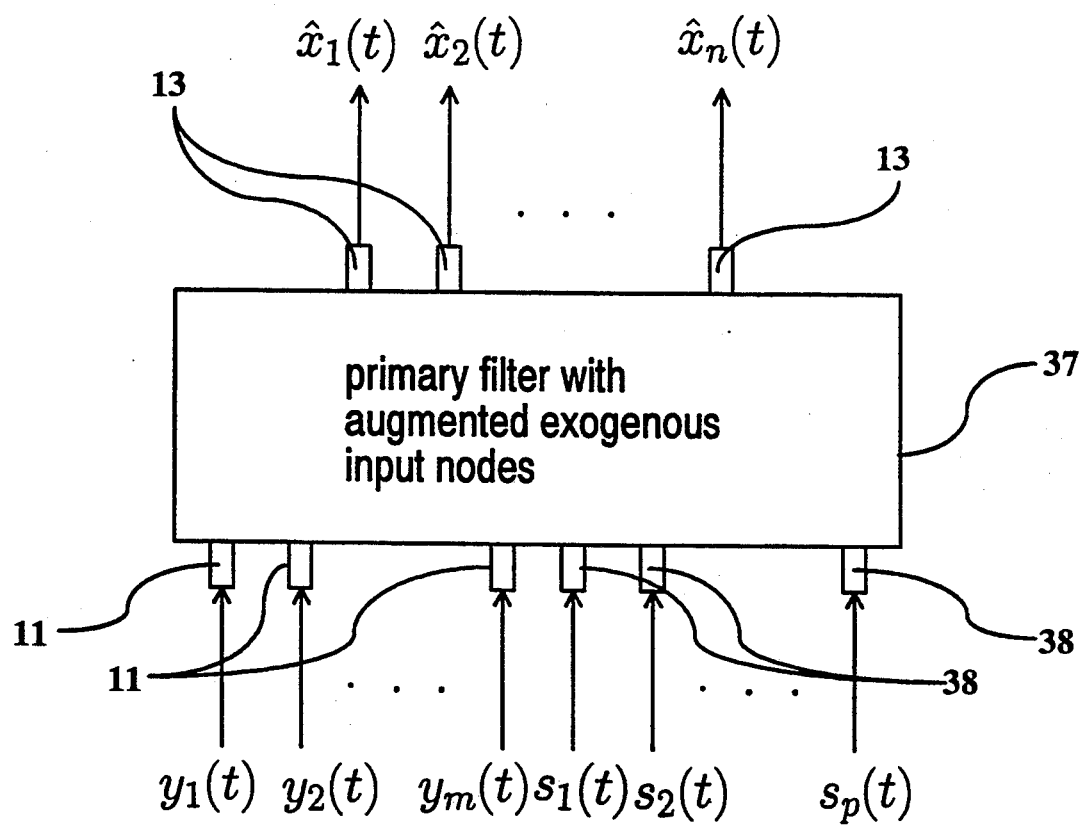
FIG. 9 shows a primary filter whose inputs have been augmented to treat time-variant processes. It receives the measurement vector y(t) and the time function s(t) at the input terminals of the filter and sends out the estimate $\hat{x}(t)$ of the signal vector x(t) at time t.

Whether there is a mathematical/statistical model of the signal and measurement processes, a primary filter 37 after implementation in accordance with the foregoing idea for treating time-variant signal and measurement processes, as depicted in FIG. 9, has m input terminals 11 for receiving the measurement vector $y(t) = (y_1(t), y_2(t), \ldots, y_m(t))$ and p input terminals 38 for receiving p components of the time function $s(t) = (s_1(t), s_2(t), \ldots, s_p(t))$, that describes partly or fully the time-variant property of the signal and measurement processes. An ancillary filter after implementation in accordance with the foregoing idea for treating time-variant signal and measurement processes has the same number of input terminals as does the primary filter for receiving $y(t)$ and $s(t)$. However, if there is a need for the ancillary filter to receive $x(t)$ as inputs, the ancillary filter should have $n+m+p$ input terminals altogether for receiving $x(t)$, $y(t)$ and $s(t)$ as its inputs at time t. While the output terminals 13 of the primary filter send out the estimate $x(t)$ of the signal $x(t)$, the output terminals of the ancillary filter send out the estimate $V(t)$ of the ancillary signal $V(t)$. Such a primary filter and an ancillary filter are called a primary filter with augmented exogenous input nodes and an ancillary filter with augmented exogenous input nodes respectively.

A training data set for such a primary filter is a group of finite sequences, $((y(t, \omega), s(t)), x(t, \omega))$, $t=1, 2, \ldots, T, \omega \in S$, where $(y(t, \omega), s(t))$ are used as inputs and $x(t, \omega)$ are used as the corresponding target outputs in training RNNs into such a primary filter. In generating a sequence $\omega$ in the training data set, $x(t, \omega)$ are generated for the same corresponding time function $s(t)$, that actually describes the time-variant property at the same time.

Suppose that there are different time functions $s(t)$ describing different time-variant properties of the signal and measurement processes in different filtering environments. All such time functions or a subset thereof that is sufficiently representative of their relative frequency (or probability) distribution should be included in the training data set. Such included time functions are called exemplary time functions. In case there is only one time function included in the training data set, the time function will also be called an exemplary time function. Whether there is one or many exemplary time functions, the totality of all of them will be called the set of exemplary functions. For each time function $s(t)$ included, a sufficient number of sequences of $x(t, \omega)$ and $y(t, \omega)$ should be generated and included jointly as $((y(t, \omega), s(t)), x(t, \omega))$, $t=1, 2, \ldots, T, \omega \in S$ in the training data set. It will be much more convenient to write such a training data set as $((y(t, \omega), s(t, \omega)), x(t, \omega))$, $t=1, 2, \ldots, T, \omega \in S$, where $s(t, \omega)$ denotes the function of time describing the time-variant property of the signal and measurement processes at the time the realizations $x(t, \omega)$ and $y(t, \omega)$ take place and are recorded. Such a training data set is called an augmented training data set.

Treating the process, $(y(t), s(t))$, $t=1, 2, \ldots, T$, and its realizations, $(y(t, \omega), s(t, \omega))$, $t=1, 2, \ldots, T$, and $\omega \in S$ as if they were the measurement process and its realizations, an augmented training data set is synthesized into a primary filter with augmented exogenous input nodes in exactly the same way as described previously for synthesizing a training data set into a primary filter. Similarly, treating the process, $(y(t), s(t))$, $t=1, 2, \ldots, T$, and its realizations, $(y(t, \omega), s(t, \omega))$, $t=1, 2, \ldots, T$ and $\omega \in S$, as if they were the measurement process and its realizations, an augmented ancillary training data set can be generated and synthesized into an ancillary filter with augmented exogenous input nodes in exactly the same way as described previously for generating an ancillary training data set and synthesize it into an ancillary filter. FIG. 18 is a table 170 showing the replacements of terminologies required to convert the block diagram in FIG. 2 and FIGS. 11-17 into corresponding block diagrams for a primary filter with augmented exogenous input nodes or an ancillary filter with augmented exogenous input nodes.

Implementation of Neural Filters

A primary filter, ancillary filter, primary filter with augmented exogenous input nodes, or ancillary filter with augmented exogenous input nodes, that results from synthesizing a recurrent neural network, is called a neural filter. It is specified by its paradigm, architecture, weights and/or parameters, and initial dynamic state.

Figure 19:
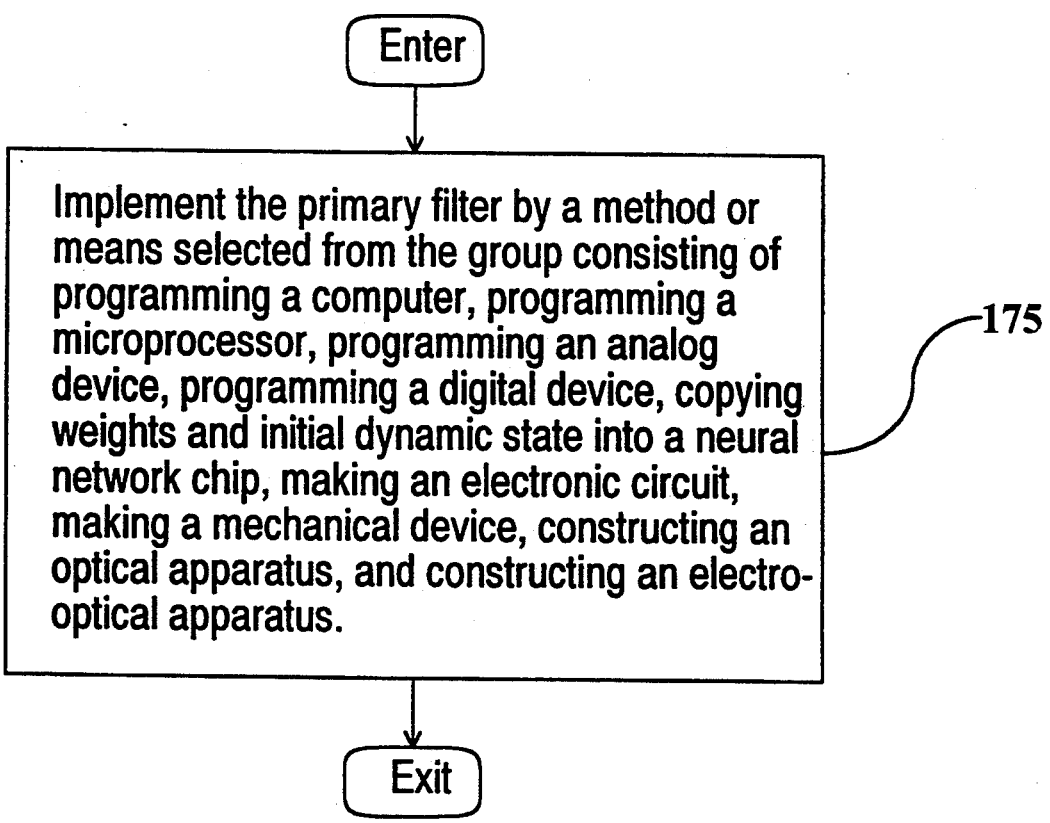
FIG. 19 is a block diagram showing the implementation of a primary filter by a method or a procedure selected from the group consisting of programming a computer, programming a microprocessor, programming an analog device, programming a digital device, copying weights and initial dynamic state into a neural network chip, making an electronic circuit, making a mechanical device, constructing an optical device, and constructing an electro-optical apparatus.

A neural filter can be implemented by programming a digital computer or an analog or digital device to simulate the neural filter's performance of processing information. However, implementing a neural filter on a general-purpose or special-purpose neural network chip or into an general-purpose or special-purpose optical-/electro-optical apparatus can achieve much faster processing speed. FIG. 19 is a block diagram showing the implementation of a primary filter by a method or a procedure selected from the group consisting of programming a computer, programming a microprocessor, programming an analog device, programming a digital device, copying weights and initial dynamic state into a neural network chip, making an electronic circuit, making a mechanical device, constructing an optical device, and constructing an electro-optical apparatus.

A very large number of articles have been published on hardware implementation of neural networks in recent years. A collection of some important ones is included in E. Sanchez-Sinencio and C. Lau, editors, *Artificial Neural Networks*, IEEE Press (1992). A good brief introduction can be found in J. M. Zurada, *Introduction to Artificial Neural Networks*, West Publishing Company (1992) and R. Hecht-Nielsen, *Neurocomputing*, Addison-Wesley (1990). In the following, we will briefly describe, as an example, a commercially available neural network chip, which can be used to implement a neural filter. It will be appreciated that other neural network chips can be used as well, as long as they support implementation of a recurrent neural network.

The 80170NX Electrically Trainable Analog Neural Network (ETANN) chip is one of the first successfully deployed artificial neural network implementations, employing analog non-volatile floating gate technology. The use of floating gates allows a very compact synapse design and permits integration of chips into a neural network of sufficiently large size for a large variety of real-world applications. Being a completely analog and parallel design, the 80170NX ETANN chip is a very fast, non-volatile and high density neural network processor, capable of achieving in excess of 1.3 billion connections (or multiply-accumulate operations) per second. By interconnecting eight chips, the integration can achieve more than 10.4 billion connections per second.

The core of the 80170NX ETANN chip is a four quadrant, non-volatile, analog multiplying synapse array. It employs a modified Gilbert multiplier cell and operates over a very large dynamic range. The hardware imperfections can be overcome by a process termed "chip-in-the-loop" optimization. The chip is fabricated with CHMOS III EEPROM technology, which supports non-volatile weight storage and electrical reprogrammability.

The 80170NX ETANN chip has 64 neurons (or processing elements), which independently compute inner products (or weighted sums) of an input vector and weight vectors stored in one or both of two 64×54 weight matrices. The computation takes 3 microseconds per layer, generating scalars which are passed through sigmoid activation functions.

Third-party simulation software is available for simulating the performance of entire 80170NX applications using PC/AT equipment. Simulation software can be used not only to verify that an application will run successfully but also to generate training files. The Intel Neural Network Training System (iNNTS), provided by Intel, Inc., uses these training files to download synaptic weights to the 80170NX chip. Furthermore, the iNNTS comes with a complete set of system software modules that can be used to control all aspects of the 80170NX, to perform chip-in-the-loop optimization, and to interface other software. For multi-chip application, Intel offers the ETANN multi-chip board (EMB) that interfaces with iNNTS.

Detailed information about the 80170NX ETANN chip can be obtained from its manufacturer, Intel Corporation, 2250 Mission College Boulevard, Mail Stop SC9-40, Santa Clara, Calif. 95052-8125.

CONCLUSION, RAMIFICATION, AND SCOPE OF INVENTION

Given an n-dimensional vector-valued signal process and an m-dimensional vector-valued measurement process, a neural filter, called a primary filter, is provided, in accordance with the teachings of the present invention, that approximates the optimal filter in performance with respect to a selected estimation error criterion to any desired degree of accuracy over a finite time period. If some estimation error statistics is required, another neural filter, called an ancillary filter, is provided that yields approximates of the estimation error statistics also to any desired degree of accuracy over the same finite time period. If the signal and measurement processes are time-variant, including a vector-valued function of time, that describes the time-variant property, as part of an augmented measurement process and augmenting the exogenous input nodes of a neural filter can greatly reduce the size of the neural filter to achieve the same degree of approximation accuracy.

In addition to the embodiments described hereinabove, those skilled in the art will recognize that other embodiments are possible within the teachings of the present invention. Accordingly, the scope of the present invention should be limited only by the appended claims and their appropriately construed legal equivalents, rather than by the examples given.

What is claimed is:

1. A method for processing an m-dimensional vector-valued measurement process to estimate an n-dimensional vector-valued signal process, said method comprising the steps of:
    (1) selecting a recurrent neural network paradigm;
    (2) selecting an estimation error criterion;
    (3) generating training data comprising realizations of said signal process and corresponding realizations of said measurement process;
    (4) constructing a training criterion;
    (5) synthesizing said training data into a primary filter, which is a recurrent neural network of said recurrent neural network paradigm;
    (6) implementing said primary filter, specified by said recurrent neural network's architecture, weights and initial dynamic state; and
    (7) receiving one measurement vector of said measurement process at a time at at least one input terminal of the implementation of said primary filter and producing an estimate of one signal vector of said signal process at a time at at least one output terminal of the implementation of said primary filter.

2. The method of claim 1 wherein said step of selecting a recurrent neural network paradigm and said step of selecting an estimation error criterion are accomplished such that a candidate primary filter of said recurrent neural network paradigm exists that approximates an optimal filter in performance with respect to said estimation error criterion to any predetermined level of accuracy.

3. The method of claim 2 wherein said step of selecting a recurrent neural network paradigm is accomplished by selecting said recurrent neural network paradigm from the group consisting of multilayer perceptrons with interconnected neurons and multilayer perceptrons with output feedbacks, in each of which the activation function is a bounded, nondecreasing and nonconstant function, and wherein said step of selecting an estimation error criterion is accomplished by selecting said estimation error criterion from the group consisting of the mean square error, the mean absolute deviation, and the mean Huber's error.

4. The method of claim 1 wherein said step of selecting a recurrent neural network paradigm is accomplished by selecting from the group consisting of multilayer perceptrons with only free output feedbacks.

5. The method of claim 1 wherein said step of selecting a recurrent neural network paradigm is accomplished by selecting said recurrent neural network paradigm such that the activation function of each outward output node in said recurrent neural network reflects the range of said outward output node's target values.

6. The method of claim 1 wherein said step of synthesizing said training data is accomplished through minimizing said training criterion by the variation of the weights and initial dynamic state of each of a collection of recurrent neural networks of said recurrent neural network paradigm, of different sizes, in comparison of size versus accuracy to optimize cost-effectiveness.

7. The method of claim 1 wherein said step of synthesizing said training data is accomplished through setting the initial dynamic state equal to a canonical initial dynamic state and minimizing said training criterion by the variation of the weights of each of a collection of recurrent neural networks of said recurrent neural network paradigm, of different sizes, in comparison of size versus accuracy to optimize cost-effectiveness.

8. The method of claim 1 wherein said step of synthesizing said training data is accomplished through a minimization algorithm, in which the derivatives of said training criterion are calculated by a differentiation technique selected from the group consisting of those differentiation techniques of backpropagation through time and real time recurrent learning, and in which adjustment of the weights and the initial dynamic state, if said initial dynamic state is not set equal to a canonical initial dynamic state, of each of a collection of recurrent neural networks is performed iteratively by a technique selected from the group consisting of the conjugate gradient methods, the quasi-Newton methods, and the gradient descent methods.

9. The method of claim 1 wherein said step of synthesizing said training data is accomplished through applying the extended Kalman filtering in an iterative manner to estimate the weights and the initial dynamic state, if said initial dynamic state is not set equal to a canonical initial dynamic state, of each of a collection of recurrent neural networks of said recurrent neural network paradigm, of different sizes, in comparison of size versus accuracy to optimize cost-effectiveness.

10. The method of claim 1 wherein said step of synthesizing said training data is through using a global optimization method selected from the group consisting of annealing methods and clustering methods.

11. The method of claim 1 wherein said step of implementing said primary filter is accomplished by a method selected from the group consisting of programming a computer, programming a microprocessor, programming an analog device, programming a digital device, copying the weights and initial dynamic state into a neural network chip, downloading the weights and initial dynamic state into a neural network chip, making an electronic circuit, making a mechanical device, constructing an optical apparatus, and constructing an electro-optical apparatus.

12. The method of claim 1 wherein said step of synthesizing said training data is performed directly on a piece of hardware selected from the group consisting of a neural network chip, an electronic circuit, an optical device, and an electro-optical apparatus, thereby completing said step of implementing said primary filter at the same time.

13. The method of claim 1 wherein said step of implementing said primary filter is accomplished by implementing said primary filter on a piece of hardware selected from the group consisting of a neural network chip, an electronic circuit, an optical device, and an electro-optical apparatus, and wherein said step of synthesizing said training data into a primary filter is accomplished through including said piece of hardware in the process of training each of a collection of recurrent neural networks of said recurrent neural network paradigm so as to overcome the anomalies and imperfections of said piece of hardware.

14. A method for evaluating a q-dimensional vector-valued estimation error statistic process, that is required for a primary filter for processing an m-dimensional vector-valued measurement process to estimate an n-dimensional vector-valued signal process, said method comprising the steps of:

(1) selecting an ancillary signal process on the basis of said estimation error statistic process;

(2) selecting an ancillary estimation error criterion on the basis of said estimation error statistic process and said ancillary signal process;

(3) selecting an ancillary recurrent neural network paradigm;

(4) generating realizations of said measurement process and corresponding realizations of said ancillary signal process;

(5) constructing an ancillary training criterion;

(6) synthesizing said realizations of said ancillary signal process and corresponding said realizations of said measurement process into an ancillary filter, which is an ancillary recurrent neural network of said ancillary recurrent neural network paradigm;

(7) implementing said ancillary filter, specified by said ancillary recurrent neural network's architecture, weights and initial dynamic state; and (8) receiving one measurement vector of said measurement process at a time at at least one input terminal of the implementation of said ancillary filter and producing an estimate of one ancillary signal vector of said ancillary signal process at a time at at least one output terminal of said implementation of said ancillary filter.

15. A method for evaluating a q-dimensional vector-valued estimation error statistic process, that is required for a primary filter for processing an m-dimensional vector-valued measurement process to estimate an n-dimensional vector-valued signal process, said method comprising the steps of:

(1) selecting an ancillary signal process on the basis of said estimation error statistic process;

(2) selecting an ancillary estimation error criterion on the basis of said estimation error statistic process and said ancillary signal process;

(3) selecting an ancillary recurrent neural network paradigm;

(4) generating realizations of said measurement process, corresponding realizations of said primary filter's output process and corresponding realizations of said ancillary signal process;

(5) constructing an ancillary training criterion;

(6) synthesizing said realizations of said primary filter's output process, corresponding said realizations of said ancillary signal process and corresponding said realizations of said measurement process into an ancillary filter, which is an ancillary recurrent neural network of said ancillary recurrent neural network paradigm;

(7) implementing said ancillary filter, specified by said ancillary recurrent neural network's architecture, weights and initial dynamic state; and (8) receiving one measurement vector of said measurement process and one output vector of said primary filter at a time at at least one input terminal of the implementation of said ancillary filter and producing an estimate of one ancillary signal vector of said ancillary signal process at a time at at least one output terminal of said implementation of said ancillary filter.

16. A method for processing an m-dimensional vector-valued measurement process to estimate an n-dimensional vector-valued signal process, which signal and measurement processes are time-variant with said signal and measurement processes' time-variant property described by a p-dimensional vector-valued time function, said method comprising the steps of:

(1) selecting a recurrent neural network paradigm;

(2) selecting an estimation error criterion;

(3) generating augmented training data comprising a set of exemplary time functions, corresponding realizations of said signal process and corresponding realizations of said measurement process;

(4) constructing a training criterion;

(5) synthesizing said augmented training data into a primary filter with augmented exogenous input nodes, which is a recurrent neural network of said recurrent neural network paradigm;

(6) implementing said primary filter with augmented exogenous input nodes, specified by said recurrent neural network's architecture, weights and initial dynamic state; and (7) receiving one measurement vector of said measurement process and one vector of said p-dimensional vector-valued time function at a time at at least one input terminal of the implementation of said primary filter with augmented exogenous input nodes, and producing an estimate of one signal vector of said signal process at a time at at least one output terminal of the implementation of said primary filter with augmented exogenous input nodes.

17. The method of claim 16 wherein said step of selecting a recurrent neural network paradigm and said step of selecting an estimation error criterion are accomplished such that a candidate primary filter with augmented exogenous input nodes of said recurrent neural network paradigm exists that approximates an optimal filter in performance with respect to said estimation error criterion to any predetermined level of accuracy.

18. The method of 17 wherein said step of selecting a recurrent neural network paradigm is accomplished by selecting said recurrent neural network paradigm from the group consisting of multilayer perceptrons with interconnected neurons and multilayer perceptrons with output feedbacks, in each of which the activation function is a bounded, nondecreasing and nonconstant function, and wherein said step of selecting an estimation error criterion is accomplished by selecting said estimation error criterion from the group consisting of the mean square error, the mean absolute deviation, and the mean Huber's error.

19. The method of claim 16 wherein said step of selecting a recurrent neural network paradigm is accomplished by selecting from the group consisting of multilayer perceptrons with only free output feedbacks.

20. The method of claim 16 wherein said step of selecting said recurrent neural network paradigm is accomplished by selecting said recurrent neural network paradigm in which the activation function of each outward output node reflects the range of said outward output node's target values.

21. The method of claim 16 wherein said step of synthesizing said augmented training data is accomplished through minimizing said training criterion by the variation of the weights and initial dynamic state of each of a collection of recurrent neural networks of said recurrent neural network paradigm, of different sizes, in comparison of size versus accuracy to optimize cost-effectiveness.

22. The method of claim 16 wherein said step of synthesizing said augmented training data is accomplished through setting the initial dynamic state equal to a canonical initial dynamic state and minimizing said training criterion by the variation of the weights of each of a collection of recurrent neural networks of said recurrent neural network paradigm, of different sizes, in comparison of size versus accuracy to optimize cost-effectiveness.

23. The method of claim 16 wherein said step of synthesizing said augmented training data is accomplished through a minimization algorithm, in which the derivatives of said training criterion are calculated by a differentiation technique selected from the group consisting of those differentiation techniques of backpropagation through time and real time recurrent learning, and in which adjustment of the weights and the initial dynamic state, if said initial dynamic state is not set equal to a canonical initial dynamic state, of each of a collection of recurrent neural networks is performed iteratively by a technique selected from the group consisting of the conjugate gradient methods, the quasi-Newton methods, and the gradient descent methods.

24. The method of claim 16 wherein said step of synthesizing said augmented training data is accomplished through applying extended Kalman filtering in an iterative manner to estimate the weights and the initial dynamic state, if said initial dynamic state is not set equal to a canonical initial dynamic state, of each of a collection of recurrent neural networks of said recurrent neural network paradigm, of different sizes, in comparison of size versus accuracy to optimize cost-effectiveness.

25. The method of claim 16 wherein said step of synthesizing said augmented training data is through using a global optimization method selected from the group consisting of annealing methods and clustering methods.

26. The method of claim 16 wherein said step of implementing said primary filter with augmented exogenous input nodes is accomplished by a method selected from the group consisting of programming a computer, programming a microprocessor, programming an analog device, programming a digital device, copying the weights and initial dynamic state into a neural network chip, downloading the weights and initial dynamic state into a neural network chip, making an electronic circuit, making a mechanical device, constructing an optical apparatus, and constructing an electro-optical apparatus.

27. The method of claim 16 where in said step of synthesizing said augmented training data is performed directly on a piece of hardware selected from the group consisting of a neural network chip, an electronic circuit, an optical device, and an electro-optical apparatus, thereby completing said step of implementing said primary filter with augmented exogenous input nodes at the same time.

28. The method of claim 16 wherein said step of implementing said primary filter with augmented exogenous input nodes is accomplished by implementing said primary filter with augmented exogenous input nodes on a piece of hardware selected from the group consisting of a neural network chip, an electronic circuit, an optical device, and an electro-optical apparatus, and wherein said step of synthesizing said augmented training data into a primary filter with augmented exogenous input nodes is accomplished through including said piece of hardware in the process of training each of a collection of recurrent neural networks of said recurrent neural network paradigm so as to overcome the anomalies and imperfections of said piece of hardware.

29. A method for evaluating a q-dimensional vector-value estimation error statistic process, that is required for a primary filter with augmented exogenous input nodes for processing an m-dimensional vector-valued measurement process to estimate an n-dimensional vector-valued signal process, which signal and measurement processes are time-variant with said signal and measurement processes' time-variant property described by a p-dimensional vector-valued time function, said method comprising the steps of:
(1) selecting an ancillary signal process on the basis of said estimation error statistic process;
(2) selecting an ancillary estimation error criterion on the basis of said estimation error statistic process and said ancillary signal process;
(3) selecting an ancillary recurrent neural network paradigm;
(4) generating augmented ancillary training data comprising a set of exemplary time functions, corresponding realizations of said measurement process and corresponding realizations of said ancillary signal process;
(5) constructing an ancillary training criterion;
(6) synthesizing said augmented ancillary training data into an ancillary filter with augmented exogenous input nodes, which is an ancillary recurrent neural network of said ancillary recurrent neural network paradigm;
(7) implementing said ancillary filter with augmented exogenous input nodes, specified by said ancillary recurrent neural network's architecture, weights and initial dynamic state; and
(8) receiving one measurement vector of said measurement process and one vector of said p-dimensional vector-valued time function at a time at least one input terminal of the implementation of said ancillary filter with augmented exogenous input nodes and producing an estimate of one signal vector of said ancillary signal process at a time at least one output terminal of said implementation of said ancillary filter with augmented exogenous input nodes.

30. A method for evaluating a q-dimensional vector-valued estimation error statistic process, that is required for a primary filter with augmented exogenous input nodes for processing an m-dimensional vector-valued measurement process to estimate an n-dimensional vector-valued signal process, which signal and measurement processes are time-variant with said signal and measurement processes' time-variant property described by a p-dimensional vector-valued time function, said method comprising the steps of:
(1) selecting an ancillary signal process on the basis of said estimation error statistic process;
(2) selecting an ancillary estimation error criterion on the basis of said estimation error statistic process and said ancillary signal process;
(3) selecting an ancillary recurrent neural network paradigm;
(4) generating augmented ancillary training data comprising a set of exemplary time functions, corresponding realizations of said measurement process, corresponding realizations of the output process of said primary filter with augmented exogenous input nodes, and corresponding realizations of said ancillary signal process;
(5) constructing an ancillary training criterion;
(6) synthesizing said augmented ancillary training data into an ancillary filter with augmented exogenous input nodes, which is an ancillary recurrent neural network of said ancillary recurrent neural network paradigm;
(7) implementing said ancillary filter with augmented exogenous input nodes, specified by said ancillary recurrent neural network's architecture, weights and initial dynamic state; and
(8) receiving one vector of said p-dimensional vector-valued time function, one measurement vector of said measurement process and one output vector of said primary filter at a time at least one input terminal of the implementation of said ancillary filter with augmented exogenous input nodes and producing an estimate of one signal vector of said ancillary signal process at a time at least one output terminal of said implementation of said ancillary filter with augmented exogenous input nodes.

31. A primary filter for processing an m-dimensional vector-valued measurement process to estimate an n-dimensional vector-valued signal process with respect to a selected estimation error criterion, said primary filter being an implementation of a recurrent neural network of a selected recurrent neural network paradigm, and said primary filter comprising
(1) a plurality of neurons, each neuron being means for receiving said neuron's input values, processing said input values and producing an output value, that is called the activation level of said neuron;
(2) a plurality of connections, each connection being means for multiplying a first neuron's activation level by said connection's weight and sending the resulting multiple to a second neuron as one of said second neuron's input values;
(3) a plurality of feedback connections, each feedback connection being means for holding a third neuron's activation level for one unit of time, multiplying said third neuron's activation level by said feedback connection's weight, and sending the resulting multiple to a fourth neuron as one of said fourth neuron's input values;
(4) at least one input terminal, being means for inputing one measurement vector of said m-dimensional vector-valued measurement process at a time, said at least one input terminal being connected to at least one exogenous input node included in said plurality of neurons; and
(5) at least one output terminal, being means for outputing an estimate of one signal vector of said n-dimensional vector-valued signal process at a time, said at least one output terminal being connected to at least one outward output node included in said plurality of neurons.

32. The primary filter of claim 31 wherein said recurrent neural network's architecture, weights and initial dynamic state are determined by synthesizing, with respect to a training criterion constructed on the basis of said estimation error criterion, training data, comprising realizations of said signal process and corresponding realizations of said measurement process, into said recurrent neural network.

33. The primary filter of claim 32 wherein said recurrent neural network paradigm is such that a candidate recurrent neural network of said recurrent neural network paradigm exists that approximates an optimal filter in performance with respect to said estimation error criterion to any predetermined level of accuracy.

34. The primary filter of claim 33 wherein said recurrent neural network paradigm is selected from the group consisting of multilayer perceptrons with interconnected neurons and multilayer perceptrons with output feedbacks, in each of which the activation function is a bounded, nondecreasing and nonconstant function, and wherein said estimation error criterion is selected from the group consisting of the means square error, the mean absolute deviation, and the mean Huber's error.

35. The primary filter of claim 32 wherein said recurrent neural network paradigm is selected from the group consisting of multilayer perceptrons with free output feedbacks.

36. The primary filter of claim 32 wherein the activation function of each outward output node in said recurrent neural network reflects the range of said outward output node's target values.

37. The primary filter of claim 32 wherein said training data is synthesized through minimizing said training criterion by the variation of the weights and initial dynamic state of each of a collection of recurrent neural networks of said recurrent neural network paradigm, of different sizes, in comparison of size versus accuracy to optimize cost-effectiveness.

38. The primary filter of claim 32 wherein said training data is synthesized through setting the initial dynamic state equal to a canonical initial dynamic state and minimizing said training criterion by the variation of the weights of each of a collection of recurrent neural networks of said recurrent neural network paradigm, of different sizes, in comparison of size versus accuracy to optimize cost-effectiveness.

39. The primary filter of claim 32 wherein said training data is synthesized through using a minimization algorithm, in which the derivatives of said training criterion are calculated by a differentiation technique selected from the group consisting of those differentiation techniques of backpropagation through time and real time recurrent learning, and in which adjustment of the weights and the initial dynamic state, if said initial dynamic state is not set equal to a canonical initial dynamic state, of each of a collection of recurrent neural networks is performed iteratively by a technique selected from the group consisting of the conjugate gradient methods, the quasi-Newton methods, and the gradient descent methods.

40. The primary filter of claim 32 wherein said training data is synthesized through applying extended Kalman filtering in an iterative manner to estimate said weights and the initial dynamic state, if said initial dynamic state is not set equal to a canonical initial dynamic state, of each of a collection of recurrent neural networks of said recurrent neural network paradigm, of different sizes, in comparison of size versus accuracy to optimize cost-effectiveness.

41. The primary filter of claim 32 wherein said training data is synthesized through using a global optimization method selected from the group consisting of annealing methods and clustering methods.

42. The primary filter of claim 32 wherein said primary filter is implemented by a procedure selected from the group consisting of programming a computer, programming a microprocessor, programming an analog device, programming a digital device, copying weights and initial dynamic state in a neural network chip, making an electronic circuit, making a mechanical device, constructing an optical apparatus, and constructing an electro-optical apparatus.

43. The primary filter of claim 32 wherein said training data is synthesized directly on a piece of hardware selected from the group consisting of a neural network chip, an electronic circuit, an optical device and an electro-optical apparatus.

44. The primary filter of claim 32 wherein said primary filter is an implementation on a piece of hardware selected from the group consisting of a neural network chip, an electronic circuit, an optical device, and an electro-optical apparatus, and wherein said training data is synthesized through including said piece of hardware in the process of training each of a collection of recurrent neural networks of said recurrent neural network paradigm so as to overcome the anomalies and imperfections of said piece of hardware.

45. An ancillary filter for evaluating a q-dimensional vector-valued estimation error statistic process, that is required for a primary filter for processing an m-dimensional vector-valued measurement process to estimate an n-dimensional vector-valued signal process, said ancillary filter being an implementation of an ancillary recurrent neural network of a selected ancillary recurrent neural network paradigm, and said ancillary filter comprising (1) a plurality of neurons, each neuron being means for receiving said neuron's input values, processing said input values and producing an output value, that is called the activation level of said neuron;

(2) a plurality of connections, each connection being means for multiplying a first neuron's activation level by said connection's weight and sending the resulting multiple to a second neuron as one of said second neuron's input values;

(3) a plurality of feedback connections, each feedback connection being means for holding a third neuron's activation level for one unit of time, multiplying said third neuron's activation level by said feedback connection's weight, and sending the resulting multiple to a fourth neuron as one of said fourth neuron's input values;

(4) at least one input terminal, being means for inputing one measurement vector of said m-dimensional vector-valued measurement process at a time, said at least one input terminal being connected to at least one exogenous input node included in said plurality of neurons; and (5) at least one output terminal, being means for outputing one estimation error statistic vector of said q-dimensional vector-valued estimation error statistic process at a time, said at least one output terminal being connected to at least one outward output node included in said plurality of neurons.

46. The ancillary filter of claim 45 wherein said ancillary recurrent neural network's architecture, weights and initial dynamic state are determined by synthesizing realizations of an ancillary signal process, selected on the basis of said estimation error statistic process, and corresponding realizations of said measurement process into said ancillary recurrent neural network.

47. An ancillary filter for evaluating a q-dimensional vector-valued estimation error statistic process, that is required for a primary filter for processing an m-dimensional vector-valued measurement process to estimate an n-dimensional vector-valued signal process, said ancillary filter being an implementation of an ancillary recurrent neural network of a selected ancillary recurrent neural network paradigm, and said ancillary filter comprising (1) a plurality of neurons, each neuron being means for receiving said neuron's input values, processing said input values and producing an output value, that is called the activation level of said neuron;

(2) a plurality of connections, each connection being means for multiplying a first neuron's activation level by said connection's weight and sending the resulting multiple to a second neuron as one of said second neuron's input values;

(3) a plurality of feedback connections, each feedback connection being means for holding a third neuron's activation level for one unit of time, multiplying said third neuron's activation level by said feedback connection's weight, and sending the resulting multiple to a fourth neuron as one of said fourth neuron's input values;

(4) at least one input terminal, being means for inputing one measurement vector of said m-dimensional vector-valued measurement process and one output vector of said primary filter at a time, said at least one input terminal being connected to at least one exogenous input node included in said plurality of neurons; and (5) at least one output terminal, being means for outputing one estimation error statistic vector of said q-dimensional vector-valued estimation error statistic process at a time, said at least one output terminal being connected to at least one outward output node included in said plurality of neurons.

48. The ancillary filter of claim 47 wherein said ancillary recurrent neural network's architecture, weights and initial dynamic state are determined by synthesizing realizations of an ancillary signal process, selected on the basis of said estimation error statistic process, corresponding realizations of said primary filter's output process, and corresponding realizations of said measurement process into said ancillary recurrent neural network.

49. A primary filter with augmented exogenous input nodes for processing an m-dimensional vector-valued measurement process to estimate an n-dimensional vector-valued signal process with respect to a selected estimation error criterion, which signal and measurement processes are time-variant with said signal and measurement processes' time-variant property described by a p-dimensional vector-valued time function, said primary filter with augmented exogenous input nodes being an implementation of a recurrent neural network paradigm, and said primary filter with augmented exogenous input nodes comprising (1) a plurality of neurons, each neuron being means for receiving said neuron's input values, processing said input values and producing an output value, that is called the activation level of said neuron;

(2) a plurality of connections, each connection being means for multiplying a first neuron's activation level by said connection's weight and sending the resulting multiple to a second neuron as one of said second neuron's input values;

(3) a plurality of feedback connections, each feedback connection being means for holding a third neuron's activation level for one unit of time, multiplying said third neuron's activation level by said feedback connection's weight, and sending the resulting multiple to a fourth neuron as one of said fourth neuron's input values;

(4) at least one input terminal, being means for inputing one measurement vector of said m-dimensional vector-valued measurement process and one vector of said p-dimensional vector-valued time function at a time, said at least one input terminal being connected to at least one exogenous input node included in said plurality of neurons; and (5) at least one output terminal, being means for outputing an estimate of one signal vector of said n-dimensional vector-valued signal process at a time, said at least one output terminal being connected to at least one outward output node included in said plurality of neurons.

50. The primary filter with augmented exogenous input nodes of claim 49 wherein said recurrent neural network's architecture, weights and initial dynamic state are determined by synthesizing, with respect to a training criterion constructed on the basis of said estimation error criterion, augmented training data, comprising a set of exemplary time functions, and realizations of said signal process and realizations of said measurement process, that correspond to each said exemplary time function, into said recurrent neural network.

51. The primary filter with augmented exogenous input nodes of claim 50 wherein said recurrent neural network paradigm is such that a candidate primary filter with augmented exogenous input nodes of said recurrent neural network paradigm exists that approximates an optimal filter in performance with respect to said estimation error criterion to any predetermined level of accuracy.

52. The primary filter with augmented exogenous input nodes of claim 51 wherein said recurrent neural network paradigm is selected from the group consisting of multilayer perceptrons with interconnected neurons and multilayer perceptrons with output feedbacks, in each of which the activation function is a bounded, nondecreasing and nonconstant function, and wherein said estimation error criterion is selected from the group consisting of the mean square error, the mean absolute deviation, and the mean Huber's error.

53. The primary filter with augmented exogenous input nodes of claim 50 wherein said recurrent neural network paradigm is selected from the group consisting of multilayer perceptrons with free output feedbacks.

54. The primary filter with augmented exogenous input nodes of claim 50 wherein the activation function of each outward output node in said recurrent neural network reflects the range of said outward output node's target values.

55. The primary filter with augmented exogenous input nodes of claim 50 wherein said means for synthesizing said augmented training data is through minimizing said training criterion by the variation of the weights and initial dynamic state of each of a collection of recurrent neural networks of said recurrent neural network paradigm, of different sizes, in comparison of size versus accuracy to optimize cost-effectiveness.

56. The primary filter with augmented exogenous input nodes of claim 50 wherein said augmented training data is synthesized through setting the initial dynamic state equal to a canonical initial dynamic state and minimizing said training criterion by the variation of the weights of each of a collection of recurrent neural networks of said recurrent neural network paradigm, of different sizes, in comparison of size versus accuracy to optimize cost-effectiveness.

57. The primary filter with augmented exogenous input nodes of claim 50 wherein said augmented training data is synthesized through using a minimization algorithm, in which the derivatives of said training criterion are calculated by a differentiation technique selected from the group consisting of those differentiation techniques of backpropagation through time and real time recurrent learning, and in which adjustment of the weights and the initial dynamic state, if said initial dynamic state is not set equal to a canonical initial dynamic state, of each of a collection of recurrent neural networks is performed iteratively by a technique selected from the group consisting of the conjugate gradient methods, the quasi-Newton methods, and the gradient descent methods.

58. The primary filter with augmented exogenous input nodes of claim 50 wherein said augmented training data is synthesized through applying extended Kalman filtering in an iterative manner to estimate said weights and the initial dynamic state, if said initial dynamic state is not set equal to a canonical initial dynamic state, of each of a collection of recurrent neural networks of said recurrent neural network paradigm, of different sizes, in comparison of size versus accuracy to optimize cost-effectiveness.

59. The primary filter with augmented exogenous input nodes of claim 50 wherein said augmented training data is synthesized through using a global optimization method selected from the group consisting of annealing methods and clustering methods.

60. The primary filter with augmented exogenous input nodes of claim 50 wherein said primary filter with augmented exogenous input nodes is implemented by a procedure selected from the group consisting of programming a computer, programming a microprocessor, programming an analog device, programming a digital device, copying weights and initial dynamic state into a neural network chip, making an electronic circuit, making a mechanical device, constructing an optical apparatus, and constructing an electro-optical apparatus.

61. The primary filter with augmented exogenous input nodes of claim 50 wherein said training data is synthesized directly on a piece of hardware selected from the group consisting of a neural network chip, an electronic circuit, an optical device and electro-optical apparatus.

62. The primary filter with augmented exogenous input nodes of claim 50 wherein said primary filter with augmented exogenous input nodes is an implementation on a piece of hardware selected from the group consisting of a neural network chip, an electronic circuit, an optical device, and an electro-optical apparatus, and wherein said training data is synthesized through including said piece of hardware in the process of training each of a collection of recurrent neural networks of said recurrent neural network paradigm so as to overcome the anomalies and imperfections of said piece of hardware.

63. An ancillary filter with augmented exogenous input nodes for evaluating a q-dimensional vector-valued estimation error statistic process, that is required for a primary filter with augmented exogenous input nodes for processing an m-dimensional vector-valued measurement process to estimate an n-dimensional vector-valued signal process, which signal and measurement processes are time-variant with said signal and measurement processes' time-variant property described by a p-dimensional vector-valued time function, said ancillary filter with augmented exogenous input nodes being an implementation of an ancillary recurrent neural network of a selected ancillary recurrent neural network paradigm, and said ancillary filter with augmented exogenous input nodes comprising (1) a plurality of neurons, each neuron being means for receiving said neuron's input values, processing said input values and producing an output value, that is called the activation level of said neuron;

(2) a plurality of connections, each connection being means for multiplying a first neuron's activation level by said connection's weight and sending the resulting multiple to a second neuron as one of said second neuron's input values;

(3) a plurality of feedback connections, each feedback connection being means for holding a third neuron's activation level for one unit of time, multiplying said third neuron's activation level by said feedback connection's weight, and sending the resulting multiple to a fourth neuron as one of said fourth neuron's input values;

(4) at least one input terminal, being means for inputting one measurement vector of said m-dimensional vector-valued measurement process and one vector of said p-dimensional vector-valued time function at a time, said at least one input terminal being connected to at least one exogenous input node included in said plurality of neurons; and (5) at least one output terminal, being means for outputting one estimation error statistic vector of said q-dimensional vector-valued estimation error statistic process at a time, said at least one output terminal being connected to at least one outward output node included in said plurality of neurons.

64. The ancillary filter with augmented exogenous input nodes of claim 63 wherein said ancillary recurrent neural network's architecture, weights and initial dynamic state are determined by synthesizing a set of exemplary time functions, corresponding realizations of an ancillary signal process, selected on the basis of said estimation error statistic process, and corresponding realizations of said measurement process into said ancillary recurrent neural network.

65. An ancillary filter with augmented exogenous input nodes for evaluating a q-dimensional vector-valued estimation error statistic process, that is required for a primary filter with augmented exogenous input nodes for processing an m-dimensional vector-valued measurement process to estimate an n-dimensional vector-valued signal process, which signal and measurement processes are time-variant with said signal and measurement processes' time-variant property described by a p-dimensional vector-valued time function, said ancillary filter with augmented exogenous input nodes being an implementation of an ancillary recurrent neural network of a selected ancillary recurrent neural network paradigm, and said ancillary filter with augmented exogenous input nodes comprising (1) a plurality of neurons, each neuron being means for receiving said neuron's input values, processing said input values and producing an output value, that is called the activation level of said neuron;

(2) a plurality of connections, each connection being means for multiplying a first neuron's activation level by said connection's weight and sending the resulting multiple to a second neuron as one of said second neuron's input values;

(3) a plurality of feedback connections, each feedback connection being means for holding a third neuron's activation level for one unit of time, multiplying said third neuron's activation level by said feedback connection's weight, and sending the resulting multiple to a fourth neuron as one of said fourth neuron's input values;

(4) at least one input terminal, being means for inputing one measurement vector of said m-dimensional vector-valued measurement process, one output vector of said primary filter and one vector of said p-dimensional vector-valued time function at a time, said at least one input terminal being connected to at least one exogenous input node included in said plurality of neurons; and (5) at least one output terminal, being means for outputing one estimation error statistic vector of said q-dimensional vector-valued estimation error statistic process at a time, said at least one output terminal being connected to at least one outward output node included in said plurality of neurons.

66. The ancillary filter with augmented exogenous input nodes of claim 65 wherein said ancillary recurrent neural network's architecture, weights and initial dynamic state are determined by synthesizing a set of exemplary time functions, corresponding realizations of an ancillary signal process, selected on the basis of said estimation error statistic process, corresponding realizations of the output process of said primary filter with augmented exogenous input nodes, and corresponding realizations of said measurement process into said ancillary recurrent neural network.

* * * * *